US012203994B2

(12) United States Patent
Roumi et al.

(10) Patent No.: US 12,203,994 B2
(45) Date of Patent: *Jan. 21, 2025

(54) SYSTEMS AND METHODS FOR MONITORING CHARACTERISTICS OF ENERGY UNITS

(71) Applicant: California Institute of Technology, Pasadena, CA (US)

(72) Inventors: Farshid Roumi, Pasadena, CA (US); Mahshid Roumi, Pasadena, CA (US)

(73) Assignee: California Institute of Technology, Pasadena, CA (US)

( * ) Notice: Subject to any disclaimer, the term of this patent is extended or adjusted under 35 U.S.C. 154(b) by 150 days.

This patent is subject to a terminal disclaimer.

(21) Appl. No.: 18/080,189

(22) Filed: Dec. 13, 2022

(65) Prior Publication Data

US 2023/0324461 A1    Oct. 12, 2023

Related U.S. Application Data

(63) Continuation of application No. 17/343,068, filed on Jun. 9, 2021, now Pat. No. 11,567,134, which is a (Continued)

(51) Int. Cl.
*G01R 31/389* (2019.01)
*G01R 31/367* (2019.01)
(Continued)

(52) U.S. Cl.
CPC ......... *G01R 31/367* (2019.01); *G01R 31/386* (2019.01); *G01R 31/389* (2019.01);
(Continued)

(58) Field of Classification Search
USPC ........................................ 324/426, 430–435
See application file for complete search history.

(56) References Cited

U.S. PATENT DOCUMENTS

| 5,146,170 A | 9/1992 | Ishikawa et al. |
| 5,298,346 A | 3/1994 | Gyenes |

(Continued)

FOREIGN PATENT DOCUMENTS

| CN | 101040182 A | 9/2007 |
| CN | 102346217 A | 2/2012 |

(Continued)

OTHER PUBLICATIONS

Dong et al. (2011) "Dynamic Modeling of Li-Ion Batteries Using an Equivalent Electrical Circuit," J. Electrochem. Soc. 158(3):A326-A336.

(Continued)

*Primary Examiner* — Vincent Q Nguyen
(74) *Attorney, Agent, or Firm* — Leydig, Voit & Mayer, Ltd.

(57) ABSTRACT

A system and method for monitoring characteristics of an electric energy device includes generating an external short from the electric energy device. The external short occurs at a known distance from a sensor and has at least one known external resistance. The received signal representing change in electromagnetic field due to the applied external short may be analyzed to determine a signal parameter that is then analyzed in comparison to a lookup table, based on the known conditions including distance, temperature and the external resistance. The output of this analyses in comparison with expected values may be utilized to identify a characteristic of the energy device.

22 Claims, 27 Drawing Sheets

Related U.S. Application Data continuation of application No. 16/379,026, filed on Apr. 9, 2019, now Pat. No. 11,073,564, which is a continuation of application No. 15/282,982, filed on Sep. 30, 2016, now Pat. No. 10,330,732.

(60) Provisional application No. 62/242,416, filed on Oct. 16, 2015, provisional application No. 62/235,681, filed on Oct. 1, 2015.

(51) Int. Cl.
    *G01R 31/385*     (2019.01)
    *G01R 31/392*     (2019.01)
    *G01R 31/396*     (2019.01)
    *G01R 31/52*     (2020.01)

(52) U.S. Cl.
    CPC ......... *G01R 31/392* (2019.01); *G01R 31/396* (2019.01); *G01R 31/52* (2020.01)

(56) References Cited

U.S. PATENT DOCUMENTS

| | | | |
|---|---|---|---|
| 5,504,415 | A | 4/1996 | Podrazhansky et al. |
| 5,821,759 | A | 10/1998 | Scaman et al. |
| 6,078,165 | A | 6/2000 | Ashtiani et al. |
| 6,118,248 | A | 9/2000 | Gartstein et al. |
| 6,160,382 | A | 12/2000 | Yoon et al. |
| 6,229,305 | B1 | 5/2001 | Logue |
| 6,258,185 | B1 | 7/2001 | Branagan et al. |
| 6,268,713 | B1 | 7/2001 | Thandiwe |
| 6,285,185 | B1 | 9/2001 | Asjes |
| 6,462,551 | B1 | 10/2002 | Coates et al. |
| 6,526,361 | B1 | 2/2003 | Jones et al. |
| 6,841,291 | B2 | 1/2005 | Minamiura |
| 7,088,075 | B2 | 8/2006 | Baba et al. |
| 7,471,066 | B2 | 12/2008 | Ambrosio et al. |
| 7,619,417 | B2 | 11/2009 | Klang |
| 7,834,620 | B2 | 11/2010 | Kejik et al. |
| 8,058,876 | B2 | 11/2011 | Cernasov et al. |
| 8,173,284 | B2 | 5/2012 | Wu et al. |
| 8,179,139 | B2 | 5/2012 | Kawasumi et al. |
| 8,268,465 | B2 | 9/2012 | Nollet |
| 8,334,699 | B2 | 12/2012 | Asakura et al. |
| 8,618,775 | B2 | 12/2013 | Hermann et al. |
| 8,723,482 | B2 | 5/2014 | Dao et al. |
| 8,901,888 | B1 | 12/2014 | Beckman |
| 9,379,368 | B2 | 6/2016 | Roumi |
| 9,759,775 | B2 | 9/2017 | Alkemade et al. |
| 10,330,732 | B2 | 6/2019 | Roumi et al. |
| 10,340,528 | B2 | 7/2019 | Roumi et al. |
| 10,353,012 | B2 | 7/2019 | Roumi et al. |
| 10,693,117 | B2 | 6/2020 | Roumi |
| 11,549,993 | B2 | 1/2023 | Roumi et al. |
| 11,567,134 | B2 | 1/2023 | Roumi et al. |
| 2001/0035756 | A1 | 11/2001 | Kozlowski |
| 2003/0016048 | A1 | 1/2003 | Dongowski et al. |
| 2004/0004464 | A1 | 1/2004 | Tsukamoto et al. |
| 2006/0061365 | A1 | 3/2006 | Lee |
| 2008/0042654 | A1 | 2/2008 | Kato |
| 2008/0129287 | A1 | 6/2008 | Matsumura |
| 2008/0272742 | A1 | 11/2008 | Hart et al. |
| 2009/0015203 | A1 | 1/2009 | Oakes |
| 2009/0039833 | A1 | 2/2009 | Kitagawa |
| 2009/0096424 | A1 | 4/2009 | Ambrosio et al. |
| 2009/0140742 | A1 | 6/2009 | Koch et al. |
| 2009/0184686 | A1 | 7/2009 | Owens, Jr. et al. |
| 2010/0036285 | A1 | 2/2010 | Govari et al. |
| 2010/0194398 | A1 | 8/2010 | Kawasumi et al. |
| 2010/0201320 | A1 | 8/2010 | Coe et al. |
| 2010/0253373 | A1 | 10/2010 | Kawashima |
| 2010/0324746 | A1 | 12/2010 | Jeong |
| 2011/0059337 | A1 | 3/2011 | Yoshida |
| 2011/0060538 | A1 | 3/2011 | Fahimi et al. |
| 2011/0074432 | A1 | 3/2011 | Tinnemeyer |
| 2011/0125336 | A1 | 5/2011 | Groves et al. |
| 2011/0156641 | A1 | 6/2011 | Kishiyama et al. |
| 2011/0187329 | A1 | 8/2011 | Majima et al. |
| 2011/0187377 | A1 | 8/2011 | Boysen et al. |
| 2011/0316553 | A1 | 12/2011 | Taguchi et al. |
| 2012/0019238 | A1 | 1/2012 | Eichardt et al. |
| 2012/0077095 | A1 | 3/2012 | Roumi et al. |
| 2012/0107680 | A1 | 5/2012 | Amiruddin et al. |
| 2012/0116699 | A1 | 5/2012 | Haag et al. |
| 2012/0148880 | A1 | 6/2012 | Schaefer et al. |
| 2012/0180126 | A1 | 7/2012 | Liu et al. |
| 2012/0316814 | A1 | 12/2012 | Rahaman et al. |
| 2013/0017432 | A1 | 1/2013 | Roumi |
| 2013/0057288 | A1 | 3/2013 | Ogata et al. |
| 2013/0069661 | A1 | 3/2013 | Rich et al. |
| 2013/0162258 | A1 | 6/2013 | Patin et al. |
| 2013/0189592 | A1 | 7/2013 | Roumi et al. |
| 2013/0229156 | A1 | 9/2013 | Brandon et al. |
| 2013/0253715 | A1 | 9/2013 | Cho et al. |
| 2013/0285616 | A1 | 10/2013 | Washiro |
| 2013/0295439 | A1 | 11/2013 | Masarapu et al. |
| 2013/0316641 | A1 | 11/2013 | Aaron |
| 2014/0002027 | A1 | 1/2014 | Guan |
| 2014/0009296 | A1 | 1/2014 | Li et al. |
| 2014/0272500 | A1 | 9/2014 | Roumi et al. |
| 2014/0350716 | A1 | 11/2014 | Fly et al. |
| 2015/0015268 | A1 | 1/2015 | Yeh |
| 2015/0048785 | A1 | 2/2015 | Roohparvar et al. |
| 2015/0072181 | A1 | 3/2015 | Roohparvar |
| 2015/0162872 | A1 | 6/2015 | Nakanishi et al. |
| 2015/0171398 | A1 | 6/2015 | Roumi |
| 2015/0180000 | A1 | 6/2015 | Roumi |
| 2016/0013463 | A1 | 1/2016 | Roumi et al. |
| 2016/0084911 | A1 | 3/2016 | Mensah-Brown |
| 2016/0190833 | A1 | 6/2016 | Roumi et al. |
| 2016/0254514 | A1 | 9/2016 | Roumi |
| 2018/0137991 | A1 | 5/2018 | Roumi et al. |
| 2018/0261818 | A1 | 9/2018 | Roumi |
| 2019/0229343 | A1 | 7/2019 | Roumi et al. |
| 2020/0006962 | A1 | 1/2020 | Roumi et al. |
| 2020/0088802 | A1 | 3/2020 | Roumi et al. |

FOREIGN PATENT DOCUMENTS

| | | |
|---|---|---|
| EP | 1293377 | 3/2003 |
| EP | 2175515 | 4/2010 |
| JP | S60139280 U | 9/1985 |
| JP | H02-297077 A | 12/1990 |
| JP | H08-250158 | 9/1996 |
| JP | 2002-008631 A | 1/2002 |
| JP | 2002-354841 A | 12/2002 |
| JP | 2003-317810 A | 11/2003 |
| JP | 2005-176551 | 6/2005 |
| JP | 2009-117110 A | 5/2009 |
| JP | 2009-133676 | 6/2009 |
| JP | 2009-244088 A | 10/2009 |
| JP | 2010-277979 A | 12/2010 |
| JP | 2019-132849 A | 8/2019 |
| KR | 10-2008-0095342 | 10/2008 |
| KR | 10-2011-0021970 | 3/2011 |
| WO | WO 2008/156734 A1 | 12/2008 |
| WO | WO 2010/082502 | 7/2010 |
| WO | WO 2014/152650 A1 | 9/2014 |
| WO | WO 2015/139927 | 9/2015 |

OTHER PUBLICATIONS

European Search Report dated Sep. 30, 2022, corresponding to European Patent Application No. 22174557.3.
Examination Report dated Nov. 22, 2021 in European Patent Application No. 14768974.9.
Extended European Search Report corresponding to European Patent Application No. 16852777.8, issued Apr. 2, 2019.
Extended European Search Report dated Oct. 12, 2016, corresponding to European Patent Application No. 14768974.9.
First Office Action dated Dec. 25, 2017, for Chinese Patent Application No. 201480027009X, including English summary.

(56) References Cited

OTHER PUBLICATIONS

Gomez et al. (2011) "Equivalent circuit model parameters of a high-power Li-ion battery: Thermal and state of charge effects," Journal of Power Sources. 196(10):4826-4831.
International Preliminary Report on Patentability corresponding to International Patent Application No. PCT/US2014/027577, issued Sep. 15, 2015.
International Search Report and Written Opinion, dated Jul. 18, 2014, corresponding to International Application No. PCT/US2014/027577 (filed Mar. 14, 2014), 29 pp.
International Search Report with Written Opinion corresponding to International Patent Application No. PCT/US2015/066876, mailed Apr. 21, 2016.
International Search Report with Written Opinion corresponding to International Patent Application No. PCT/US2016/054984, mailed Jan. 10, 2017.
Japanese Office Action, dated Dec. 6, 2022, corresponding to Japanese Patent Application No. 2021-037546, 10 pp.
Japanese Office Action, dated Jun. 2, 2020, corresponding to Japanese Patent Application No. 2019-044903, 8 pp.
Japanese Office Action, dated May 20, 2022, corresponding to Japanese Patent Application No. 2021-037546, 8 pp.
Keyser et al. (Jan.-Sep. 2010) "Numerical and Experimental Investigation of Internal Short Circuits in a Li-Ion Cell," In; 2011 DOE Hydrogen and Fuel Cells Program, and Vehicle Technologies Program Annual Merit Review and Peer Evaluation.
Kim et al. (Jun. 9-10, 2009) "Lithium-Ion Battery Safety Study Using Multi-Physics Internal Short-Circuit Model," National Renewable Energy Laboratory. In; The 5th Intl. Symposium on Large Lithium-Ion Battery Technology and Applications in Conjunction with ABBC09. Long Beach, California.
Korean Notice of Allowance, dated Aug. 22, 2022, corresponding to Korean Patent Application No. 10-2020-7023955, 4 pp.
Korean Office Action, dated Apr. 21, 2020, corresponding to Korean Patent Application No. 10-2015-7026423, 14 pp.
Korean Office Action, dated Oct. 26, 2021, corresponding to Korean Patent Application No. 10-2020-7023955, 14 pp.
lygte-info.dk (Snapshot from Jan. 21, 2013) "The Anatomy of a Protected LiIon Battery," Archived Webpage in the Wayback Machine Internet Archive. Accessible on the Internet at URL: http://web.archive.org/web/20130121150403/http://www.lygte-info.dk/info/battery%20protection%20UK.html. [Last Accessed Jun. 15, 2017].
Maryanka (2000) "Wiring Reduction by Battery Powerline Communication," In; Passenger Car Electrical Architecture (Ref. No. 2000/088) IEE Seminar, 3 pgs.
Nagasubramanian (2000) "Two- and three-electrode impedance studies on 18650 Li-ion cells," Journal of Power Sources. 87:226-229.
Nouvel (2011) et al. "Experiments of In-Vehicle Power Line Communications," Ch. 14 In; Advances in Vehicular Networking Technologies. pp. 255-278.
Office Action Corresponding to Chinese Application No. 201480027009.X, dated Mar. 15, 2019.
Office Action Corresponding to Chinese Application No. 201480027009.X, dated Oct. 14, 2019.
Office Action Corresponding to Chinese Application No. 201480027009.X, mailed Sep. 26, 2018.
Office Action corresponding to Japanese Patent Application No. 2019-044903, "Decision of Dismissal of Amendment" and "Official Decision of Refusal," dated Nov. 10, 2020, 9 pages.
Office Action corresponding to Korean Patent Application No. 10-2015-7026423, dated Dec. 18, 2020, 29 pages.
Office Action corresponding to Korean Patent Application No. 10-2020-7023955, dated Dec. 15, 2020, 45 pages.
Office Action corresponding to U.S. Appl. No. 14/211,381, mailed Mar. 10, 2016.
Office Action corresponding to U.S. Appl. No. 14/211,381, mailed May 19, 2016.
Office Action corresponding to U.S. Appl. No. 14/975,336, mailed Mar. 12, 2018.
Office Action issued by the Japanese Patent Office for corresponding Japanese Patent Application No. 2016-502483, dispatched Feb. 6, 2018.
Office Action issued by the Japanese Patent Office for corresponding Japanese Patent Application No. 2016-502483, dispatched Nov. 13, 2018.
Office Action, "Notice of Allowance," corresponding to U.S. Appl. No. 14/211,381, mailed Mar. 13, 2017.
Office Action, "Notice of Allowance," corresponding to U.S. Appl. No. 14/211,381, mailed Nov. 22, 2016.
Office Action, "Notice of Allowance," corresponding to U.S. Appl. No. 15/484,403, mailed Feb. 25, 2019.
Office Action, "Notice of Allowance," corresponding to U.S. Appl. No. 16/420,675, mailed Aug. 24, 2020.
Office Action, "Notice of Allowance," corresponding to U.S. Appl. No. 16/420,675, mailed Jan. 19, 2021.
Office Action, "Notice of Allowance," corresponding to U.S. Appl. No. 16/420,675, mailed Oct. 21, 2020.
Office Action, corresponding to U.S. Appl. No. 15/484,403, mailed Aug. 10, 2018.
Office Action, corresponding to U.S. Appl. No. 15/484,403, mailed Dec. 14, 2017.
Office Action, corresponding to U.S. Appl. No. 16/420,675, mailed Apr. 1, 2020.
Ouannes et al. (May 2014) "Cell-wise monitoring of Lithium-ion batteries for automotive traction applications by using power line communication," In; The 18th IEEE International Symposium on Power Line Communications and its Applications (ISPLC), 2014. Mar. 30-Apr. 2, 2014. pp. 24-29.
Roumi (2010) "Shape Changing Transformations : Interactions with Plasticity and Electrochemistry Processes," Ph.D. Thesis. California Technical Institute. pp. 1-136.
Scherer (Mar. 31, 2013) "A Smart Battery Management System for Electric Vehicles using Powerline Communication," Master's Thesis. Insitute for Data Processing. Technische Universitat Munchen. pp. 1-135.
Smith et al. (2006) "Power and thermal characterization of a lithium-ion battery pack for hybrid-electric vehicles," Journal of Power Sources. 160:662-673.
U.S. Appl. No. 13/229,479, filed Sep. 9, 2011.
U.S. Appl. No. 13/724,479, filed Dec. 21, 2012.
U.S. Appl. No. 13/738,835, filed Jan. 10, 2013.
U.S. Appl. No. 14/211,381, filed Mar. 14, 2014.
U.S. Appl. No. 14/546,472, filed Nov. 18, 2014.
U.S. Appl. No. 14/546,953, filed Nov. 18, 2014.
U.S. Appl. No. 14/680,997, filed Apr. 7, 2015.
U.S. Appl. No. 14/975,336, filed Dec. 18, 2015.
U.S. Appl. No. 15/148,278, filed May 6, 2016.
U.S. Appl. No. 15/282,982, filed Sep. 30, 2016.
U.S. Appl. No. 15/368,406, filed Dec. 2, 2016.
U.S. Appl. No. 15/484,403, filed Apr. 11, 2017.
U.S. Appl. No. 15/783,768, filed Oct. 13, 2017.
U.S. Appl. No. 15/911,020, filed Mar. 2, 2018.
U.S. Appl. No. 15/973,391, filed May 7, 2018.
U.S. Appl. No. 16/373,308, filed Apr. 2, 2019.
U.S. Appl. No. 16/379,026, filed Apr. 9, 2019.
U.S. Appl. No. 16/420,675, filed May 23, 2019.
U.S. Appl. No. 16/505,424, filed Jul. 8, 2019.
U.S. Appl. No. 16/872,036, filed May 11, 2020.
U.S. Appl. No. 16/890,326, filed Jun. 2, 2020.
U.S. Appl. No. 17/103,722, filed Nov. 24, 2020.
U.S. Appl. No. 17/122,390, filed Dec. 15, 2020.
U.S. Appl. No. 17/343,068, filed Jun. 9, 2021.
U.S. Appl. No. 17/583,679, filed Jan. 25, 2022.
U.S. Appl. No. 17/976,626, filed Oct. 28, 2022.
U.S. Appl. No. 18/079,205, filed Dec. 12, 2022.

900

| Max peak-to-peak Voltage (V) | | | | | |
|---|---|---|---|---|---|
| Distance (cm) | Short Resistance | | | | |
| | 0.1 Ω | 0.35 Ω | 0.45 Ω | 1 Ω | 1.6 Ω |
| 3 | 1.524 | 1.4245 | 1.213 | 1.06975 | 0.78525 |
| 4 | 0.86 | 0.78175 | 0.7215 | 0.6415 | 0.4475 |
| 5 | 0.60225 | 0.53575 | 0.4495 | 0.3905 | 0.28275 |
| 6 | 0.351 | 0.353 | 0.273 | 0.28425 | 0.1885 |
| 7 | 0.261 | 0.234 | 0.22325 | 0.1775 | - |

904 902

1000

| | Max Peak-to-Peak Voltage (V) | | | | |
|---|---|---|---|---|---|
| | 3 cm | 4 cm | 5 cm | 6 cm | 7 cm |
| Trial 1 max | 1.43 | 0.729 | 0.54 | 0.48 | 0.217 |
| Trial 2 max | 1.257 | 0.894 | 0.537 | 0.352 | 0.241 |
| Trial 3 max | 1.536 | 0.734 | 0.546 | 0.247 | 0.234 |
| Trial 4 max | 1.475 | 0.77 | 0.52 | 0.333 | 0.244 |
| Average Max | 1.4245 | 0.78175 | 0.53575 | 0.353 | 0.234 |

SYSTEMS AND METHODS FOR MONITORING CHARACTERISTICS OF ENERGY UNITS

CROSS REFERENCE TO RELATED APPLICATIONS

The present application is a continuation of U.S. application Ser. No. 17/343,068, filed Jun. 9, 2021, which is a continuation of U.S. application Ser. No. 16/379,026, filed Apr. 9, 2019 (now U.S. Pat. No. 11,073,564, issued Jul. 27, 2021), which is a continuation of U.S. application Ser. No. 15/282,982, filed Sep. 30, 2016 (now U.S. Pat. No. 10,330,732, issued Jun. 25, 2019), which claims the benefit of priority from U.S. Provisional Application No. 62/235,681, filed Oct. 1, 2015, and U.S. Provisional Application No. 62/242,416, filed Oct. 16, 2015, all of which are incorporated herein by reference in their entireties.

BACKGROUND

This invention is in the field of electrical and electrochemical devices for storing or harnessing energy. This invention relates generally to management of such devices to reduce the severity of consequences of abnormalities occurring or existing in the devices. Batteries are a prominent example of a type device to which this invention relates.

As energy device technology development has progressed, the use of batteries, particularly rechargeable batteries, as a power source has increased substantially. Batteries are used as power sources for a wide array of devices including relatively low-power devices, such as consumer electronics devices, and higher-power devices, such as electric cars. Lithium ion energy device are the most widely used form of rechargeable battery. An Achilles heel of lithium ion energy devices is the risk of an electrical short developing inside a lithium ion energy device cell and the consequences associated therewith. An electrical short may cause rapid heating of the energy device cell. In the matter of seconds, the local temperature at the location of the short may rise to temperatures sufficient to set the energy device on fire. This is particularly worrisome in the case of high-capacity lithium ion energy device systems, such as those used in electric cars.

Current energy device management techniques for detecting state of health and state of charge of the energy device include the EIS method, OCV delay method, and entropy and enthalpy methods.

EIS method measures the resistance of a cell or an electrode, which is a function of the electrode materials chemistry, size of particles and geometry. Knowing the resistance of the cell or electrode helps with characterization of the cell or electrode material, such as its kinetics, which can be used to estimate the performance, as well as state parameters of the electrode or the cell, including the state of charge and state of health of batteries. This method requires generating AC signals with a wide range of frequencies, typically from 100 kHz to 100 mHz.

Open Circuit Voltage (OCV) may be measured easily at rest, however measuring OCV during usage of the energy device (cycling) is not a simple operation. Part of the difficulty is due to the kinetics of the reactions that result in delays of the reading voltage getting stabilized. Another difficulty in estimating the internal parameters of the energy device via OCV is that the relationship between OCV and the energy device internal parameters such as state of charge and state of health may not be easy to use, especially in Li-ion cells with LiFePO4 cathode the voltage variations due to state of charge changes are not significant and thus estimating state of charge based on voltage values is not practical. In the OCV delay method, the speed at which the OCV value stabilizes may be used to estimate the internal states of the energy device such as state of charge and state of health. This method, however, requires precise measurement of the voltage of the energy device and thus requires costly hardware for achieving such measurements.

Entropy and enthalpy measurement methods to estimate the state of charge and state of health of the energy device also detriment from requirement of costly hardware to precisely measure the energy device temperature and OCV.

The above discussed measurement methods therefore disadvantageously require costly hardware and further require cycling of the energy device. Therefore, measurement time is increased. These methods typically require precise and complex instruments and can only be applied to single cells, which limit them to research applications. Sensors, such as thermal and stress-strain sensors, are used in critical applications, such as for vehicle and aerospace applications, however these sensors only detect the secondary outcome of battery problems and only after the damage has progressed extensively. Thus, these sensors may be useful only to detect a catastrophic failure.

SUMMARY

The present invention provides methods and systems for monitoring characteristics of energy devices, such as electrochemical cells, capacitors, solar panels, and arrays, units and systems comprising such energy devices, to ensure the energy devices possess an adequate state of charge, safety or state of health such that continued operation of the energy devices does not result in the development of a dangerous, hazardous or otherwise unsafe condition and results in efficient operation of the device. If such an abnormality characteristic is detected, safety measures, such as bypassing or disconnecting the damaged energy device, can be undertaken to take the energy device exhibiting the abnormality offline or otherwise place the energy device in a safe or inert condition. Methods and systems of the invention optionally employ a technique where a signal, such as an electric, magnetic or electromagnetic signal, is generated by the energy device upon development of an abnormality, such as an electrical short circuit or sudden release of current, and the signal is detected by a sensor, such as an electromagnetic coil.

In embodiments, a system for monitoring characteristics of an energy device, may include a short generator coupled with the energy device adapted to generate an external short at a known resistance, a sensor in communication with the short generator for sensing change in an electromagnetic field generated from the external short, and, a characteristic monitor adapted to analyze the change in electromagnetic field to determine a characteristic of the energy device.

In embodiments, the characteristic may be state of charge of the energy device. In embodiments, the characteristic may be state of health of the energy device. In embodiments, the characteristic may be a short of the energy device. In embodiments, the short may be a soft or hard short. In embodiments, the characteristic may be an abnormality of the energy device. In embodiments, the characteristic may be a signal strength, impedance, or internal resistance of the energy device.

In embodiments, the short generator may include a switch for activating the external short between a positive and negative terminal of the energy device. In embodiments, the short generator may further include a controller for activating the switch. The controller may include a communications interface for receiving a short generation signal from the characteristic monitor, and for generating a switch control signal in response to the short generation signal. in embodiments, the communications interface may be based on a wireless communications protocol. In embodiments, the communications interface may be based on a wired communications protocol.

In embodiments, the sensor includes an electromagnetic coil. The electromagnetic coil may a shape selected from the group of shapes including: coil, spiral, helix and planar. In embodiments, the electromagnetic coil includes at least two coils having a planar shape and positioned at an angle to each other.

In embodiments, the sensor transmits the sensed change in electromagnetic field as a received signal directly to the characteristic monitor. The controller may transmit the sensed change in electromagnetic field as a received signal to the characteristic monitor.

In embodiments, the sensor may be located in the short generator internal to the energy device. In embodiments, the sensor may be located external to the short generator either internal or external to the energy device. In embodiments, the sensor may be at a predetermined distance from the external short and/or the energy device. The characteristic monitor may determine the characteristic based at least on the predetermined distance.

In embodiments, the energy device includes a plurality of energy devices forming an energy unit.

In embodiments, the sensor may include a plurality of sensors. Each of the plurality of sensors may be associated with one of the plurality of energy devices.

In embodiments, the characteristic monitor may be internal to the energy unit and external to the plurality of energy devices of the energy unit. In embodiments, the characteristic monitor may be external to the energy unit.

In embodiments, the plurality of sensors may be located external to the energy devices but internal to the energy unit.

In embodiments, the characteristic monitor may include a plurality of characteristic monitors each associated with one of the plurality of energy devices.

In embodiments, the sensor may be a plurality of sensors, each of the plurality of sensors being located within one of the plurality of characteristic monitors.

In embodiments having a plurality of sensors, each of the plurality of sensors may be associated with a single characteristic monitor adapted to monitor a plurality of energy devices.

In embodiments, the sensor may be located with the characteristic monitor external the energy unit.

In embodiments, the energy unit may include a housing having a mounting portion for mounting the sensor thereto. The mounting portion may be adapted to mount the sensor internal to the energy unit. The mounting portion may be adapted to mount the sensor external to the energy unit. The mounting portion may be adapted to mount the characterization monitor, having the sensor therein, external to the energy unit.

In embodiments, the characteristic monitor may include a processor in communication with memory storing computer readable instructions that, when executed by the processor, operate to determine the characteristic. In embodiments, the processor may a sampling speed in the range of 0.01-100 Million Samples Per Second (MSPS). In embodiments, the sampling speed may be characterized in that there are at least 2 samples per peak of a received signal representing the change in electromagnetic field. In embodiments, the processor may be in communication with a communication interface for communicating with one or both of the short generator and the short detector. The communication interface may be based on a wired communications protocol. The communication interface may be based on a wireless communications protocol. In embodiments, the communication interface may be adapted to modulate a DC voltage line coupled to the energy devices with a data signal including a configuration output based on the characteristic.

In embodiments, the memory may store a signal parameter of a received signal representing the change in electromagnetic field.

In embodiments, the memory may store a signal analyzer comprising computer readable instructions that, when executed by the processor, operate to analyze the received signal to generate the signal parameter based on system configuration information. In embodiments, the system configuration information may include one or more of information regarding the sensor, the known resistance, and a distance of the sensor to the external short.

In embodiments, the signal parameter may include an instantaneous parameter. The instantaneous parameter may be a parameter chosen from the group of parameters including: maximum power, maximum voltage square, maximum voltage, maximum change in voltage, maximum current, maximum current square, maximum change in current, full-width voltage at half maximum and current at half maximum. The instantaneous parameter may be based on a given time between 1 nanosecond and 10 microseconds of generation of the electrical short. The instantaneous parameter may be based on a given time between 10 nanoseconds and 1 microseconds of generation of the electrical short.

In embodiments, the signal parameter may include an integrated parameter. The integrated parameter may be a parameter chosen from the group of parameters including: total absolute energy and total absolute coulomb measured accumulatively over a period of time.

In embodiments, the signal parameter may be based on:

$$S = f\left(Q, V, \frac{1}{r}, \frac{1}{R}, \frac{1}{D} \cdot T\right)$$

where S is the Strength of the received signal, D is a distance between the battery or the nearest point of the external short and the sensor, R is a known external resistance selected based on the application and battery that can be in series or parallel to the battery and may vary, r is internal resistance of the energy device to the generated short, Q is a stored coulomb in the energy device, and V is a voltage of the energy device. T is temperature.

In embodiments, the memory may store a state of charge analyzer comprising computer readable instructions that, when executed by the processor, analyze the signal parameter to determine a state of charge of the energy device.

In embodiments, the state of charge analyzer may determine the state of charge of the energy device based upon the signal parameter compared to a lookup table stored within the memory. The lookup table may include any one or more expected device parameters chosen from the group of expected device parameters including: device brand, device manufacture, device model, device voltage, device C-rate, device material composition, expected device internal resistance, and device installation information. The expected device parameters may be configured for a plurality of distances between an external short and the sensor, and a plurality of known resistances of the external short.

In embodiments, the state of charge analyzer may compare a signal parameter to an expected device parameter value for the known resistance.

In embodiments, the state of charge analyzer may determine the state of charge of the energy device based upon the signal parameter compared to an energy device profile generated based on a previous received signal.

In embodiments, the memory may store a state of health analyzer comprising computer readable instructions that, when executed by the processor, analyze the signal parameter to determine a state of health of the energy device. The state of health analyzer may determine the state of health of the energy device based upon the signal parameter compared to a lookup table stored within the memory. The lookup table may include any one or more expected device parameters chosen from the group of expected device parameters including: device brand, device manufacture, device model, device voltage, device C-rate, device material composition, expected device internal resistance, and device installation information. The expected device parameters may be configured for a plurality of distances between an external short and the sensor, and a plurality of known resistances of the external short.

In embodiments, the state of health analyzer may determine the state of health of the energy device based on comparing the signal parameter to the lookup table to determine if an internal resistance of the energy device is optimal.

In embodiments, the state of health analyzer may determine the state of health of the energy device as an internal short when the signal parameter has a higher value than an expected device parameter within the lookup table.

In embodiments, the state of health analyzer may determine the state of health of the energy device as a degraded life-span when the signal parameter has a lower value than an expected device parameter within the lookup table.

In embodiments, the state of charge analyzer may determine the state of charge of the energy device based upon the signal parameter compared to an energy device profile generated based on a previous received signal.

In embodiments, the state of health analyzer may determine the state of health of the energy device by characterizing a short internal to the energy device.

In embodiments, the short internal the energy device may be characterized as a soft short when a total resistance value, including the internal resistance of the energy device and the known resistance, is above a hard-type threshold but below a soft-type threshold.

In embodiments, the short internal the energy device may be characterized as a hard short when a total resistance value, including the internal resistance of the energy device and the known resistance, is below a hard-type threshold.

In embodiments, the memory may store a device configuration manager comprising computer readable instructions that, when executed by the processor, generate a configuration output for configuring the energy device. The configuration output may indicate a cycling rate for charging the energy device. The configuration output may indicate to bypass the energy device. The configuration output may indicate to disconnect the energy device. The configuration output may indicate a replacement date for the energy device.

In embodiments, one or more of the short generator, sensor, and characteristic monitor comprising analog circuitry. In embodiments, the sensor or characteristic monitor may include analog circuitry forming a signal processing circuitry, for processing a received signal representing the change in electromagnetic field, including one or more op-amp, comparator, and associated circuitry including one or more or resistors, capacitors, inductors, and voltage clamp diodes. The analog circuitry may include a potentiometer for setting threshold values within the analog circuitry. The potentiometer may be capable of setting the threshold values at half of an input voltage of the analog circuitry. In embodiments, the analog circuitry may include logic circuitry for analyzing a signal from the sensor to identify a configuration output. In embodiments, the logic circuitry may include one or more of flip-flop logic circuitry, comparators, and associated circuitry such as resistors, capacitors, and/or inductors.

In embodiments, the analog circuitry may include an indicator for indicating the configuration output. The configuration output may be a fully charged, partially charged, or low charged output correlating to a charge of the energy device. The configuration output may be a fast charge speed, slow charge speed, or normal charge speed output correlating to an appropriate speed for charging the energy device.

In embodiments, traces within the analog circuitry being isolated from the sensor.

In embodiments, one or more of the short generator, sensor, and characteristic monitor may comprise digital circuitry. The digital circuitry may include signal processing circuitry for analyzing a received signal from the sensor. The signal processing circuitry may include an Analog-to-Digital Converter (ADC) capable of sampling speeds in the range of 0.01-100 MSPS. The ADC may have a sampling speed selected such that 2 samples per peak of the received signal are generated.

In embodiments, the digital circuitry may include logic circuitry for analyzing a received signal from the sensor to identify a characterization of the energy device. The logic circuitry may include a state of charge analyzer. The state of charge analyzer may determine the state of charge of the energy device based upon a signal parameter compared to a lookup table or energy device profile stored within the logic circuitry. The lookup table may include any one or more expected device parameters chosen from the group of expected device parameters including: device brand, device manufacture, device model, device voltage, device C-rate, device material composition, expected device internal resistance, and device installation information. The expected device parameters may be configured for a plurality of distances between an prior external short and the sensor, and a plurality of known resistances of the prior external short. In embodiments, the state of charge analyzer may compare signal parameter as compared to an expected device parameter value for the known resistance.

In embodiments, the logic circuitry may include a state of health analyzer. The state of health analyzer may determine the state of health of the energy device based upon a signal parameter compared to a lookup table or an energy device profile stored within the logic circuitry. The lookup table may include any one or more expected device parameters chosen from the group of expected device parameters including: device brand, device manufacture, device model, device voltage, device C-rate, device material composition, expected device internal resistance, and device installation information. The expected device parameters may be configured for a plurality of distances between a prior external short and the sensor, and a plurality of known resistances of the prior external short.

In embodiments, the state of health analyzer may determine the state of health of the energy device based on comparing the signal parameter to the lookup table to determine if an internal resistance of the energy device is optimal.

In embodiments, the state of health analyzer may determine the state of health of the energy device as an internal short when the signal parameter has a higher value than an expected device parameter within the lookup table.

In embodiments, the state of health analyzer may determine the state of health of the energy device as a degraded life-span when the signal parameter has a lower value than an expected device parameter within the lookup table.

In embodiments, the state of health analyzer may determine the state of health of the energy device by characterizing a short internal to the energy device.

In embodiments, the short internal the energy device may be characterized as a soft short when a total resistance value, including the internal resistance of the energy device and the known resistance, is below a soft-type threshold but above a hard-type threshold.

In embodiments, the short internal the energy device may be characterized as a hard short when a total resistance value, including the internal resistance of the energy device and the known resistance, is at or below a hard-type threshold.

In embodiments, the logic circuitry may include a device operation manager. The device configuration manager may be configured to generate a configuration output for configuring the energy device.

In embodiments, configuration output may indicate a cycling rate for charging the energy device.

In embodiments, the configuration output may indicate to bypass the energy device. In embodiments, the configuration output may indicate to disconnect the energy device. In embodiments, the configuration output may indicate a replacement date for the energy device.

In embodiments, traces within the digital circuitry may be isolated from the sensor.

In embodiments, an energy unit includes: a plurality of energy devices coupled together between a positive voltage line and a negative voltage line; a short generator coupled to at least one of the energy devices; and, a switch coupled to each of the energy devices, the switch activated to alter the configuration of the plurality of energy devices in response to a determination based on an external short generated by the short generator.

In embodiments, the plurality of energy devices may be coupled together in parallel. The switch may be capable of altering the configuration by disconnecting the energy devices.

In embodiments, the plurality of energy devices may be coupled together in series. The switch may be capable of altering the configuration by bypassing the energy device.

In embodiments, the switch may be activated in response to a data signal transmitted on the positive and negative voltage lines.

In embodiments, the short generator may be sized and shaped to match a surface of the plurality of energy devices.

In embodiments, a first short detector of a first of the energy devices may be adapted to communicate with another short detector of another of the energy devices neighboring the first energy device; the switch activated when a state of charge between the first and another of the energy devices differs above a predetermined threshold.

In embodiments, a method for monitoring characteristics of an energy device, includes: generating an external short at the energy device at a known resistance; sensing change in electromagnetic field emitted by the external short; determining a signal parameter based on the change in electromagnetic field; and, determining a characteristic of the energy device based on the signal parameter.

In embodiments, the method may further comprise, generating a short generation output at a characteristic monitor in communication with a short generator; the generating an external short occurring in response to the short generation output.

In embodiments, the step of sensing change in electromagnetic field may comprise sensing the change in electromagnetic field with an electromagnetic coil. The electromagnetic coil may have a shape selected from the group of shapes including: coil, spiral, helix, and planar. The electromagnetic coil may include at least two coils having a planar shape and positioned at an angle to each other.

In embodiments, the method may further comprise analyzing, at a characteristic monitor, a received signal based on the change in electromagnetic field to identify the signal parameter. In embodiments, the signal parameter may include an instantaneous parameter. The instantaneous parameter may be a parameter chosen from the group of parameters including: maximum power, maximum voltage square, maximum voltage, maximum change in voltage, maximum current, maximum current square, maximum change in current, full-width voltage at half maximum and current at half maximum. The instantaneous parameter may be based on a given time between 1 nanosecond and 10 microseconds of generation of the electrical short. The instantaneous parameter may be based on a given time between 10 nanoseconds and 1 microseconds of generation of the electrical short. In embodiments, the signal parameter may include an integrated parameter. The integrated parameter being a parameter chosen from the group of parameters including: total absolute energy and total absolute coulomb measured accumulatively over a period of time. The signal parameter may be based on:

$$S = f\left(Q, V, \frac{1}{r}, \frac{1}{R}, \frac{1}{D}, T\right)$$

where S is the Strength of the received signal, D is a distance between the battery or the nearest point of the external short and the sensor, R is a known external resistance selected based on the application and battery that can be in series or parallel to the battery and may vary, r is internal resistance of the energy device to the generated short, Q is a stored coulomb in the energy device, and V is a voltage of the energy device. T is temperature.

In embodiments, the step of determining a characteristic of the energy device may include determining a state of charge of the energy device.

In embodiments, the state of charge may be determined based upon the signal parameter compared to a lookup table or an energy device profile including known information about the energy device. In embodiments, the lookup table may include any one or more expected device parameters chosen from the group of expected device parameters including: device brand, device manufacture, device model, device voltage, device C-rate, device material composition, expected device internal resistance, and device installation information. The expected device parameters may be configured for a plurality of distances between an prior external short and the sensor, and a plurality of known resistances of the prior external short.

In embodiments, the state of charge may be determined by comparing the signal parameter to an expected device parameter value for the known resistance.

In embodiments, the determining a characteristic of the energy device may include determining a state of health of the energy device. The state of health may be determined based upon the signal parameter compared to a lookup table or an energy device profile. The lookup table may include any one or more expected device parameters chosen from the group of expected device parameters including: device brand, device manufacture, device model, device voltage, device C-rate, device material composition, expected device internal resistance, and device installation information. The expected device parameters being configured for a plurality of distances between an external short and the sensor, and a plurality of known resistances of the external short.

In embodiments, the state of health may be determined based on comparing the signal parameter to the lookup table or an energy device profile to determine if an internal resistance of the energy device is optimal.

In embodiments, the state of health may be determined as an internal short when the signal parameter has a higher value than an expected device parameter within a lookup table or an energy device profile.

In embodiments, the state of health may be determined as a degraded life-span when the signal parameter has a lower value than an expected device parameter within a lookup table or an energy device profile.

In embodiments, the state of health may be determined by characterizing a short internal to the energy device. The short internal to the energy device may be characterized as a soft short when a total resistance value, including the internal resistance of the energy device and the known resistance, is below than a soft-type threshold but is above a hard-type threshold. The short internal the energy device may be characterized as a hard short when a total resistance value, including the internal resistance of the energy device and the known resistance, at or below a hard-type threshold.

In embodiments, the method may comprise generating a configuration output for altering the configuration of the energy device. The configuration output may bypass the energy device. The configuration output may disconnect the energy device. The configuration output may indicate to replace the energy device. The configuration output may indicate a cycling rate of the energy device. The configuration output may indicate a cycling rate of the energy device.

In embodiments the method may further comprise calibrating a characteristic monitor to the energy system being monitored. The step of calibrating may comprise storing system configuration information. The configuration information may include one or more of: the temperature, a distance of a sensor from the battery or nearest part of the external short, the known external resistance. The step of calibrating may comprise setting characteristic monitor thresholds. Setting characteristic monitor thresholds may include manipulating a potentiometer at a characteristic monitor housing such that the thresholds are symmetric distances from the half value of the input voltage. The step of calibrating may comprise storing expected energy device parameters as a lookup table or an energy device profile. Storing expected energy device parameters as a lookup table may include capturing signal parameters of a fully charged energy device. Storing expected energy device parameters as a lookup table further may include averaging the captured signal parameters to generate the lookup table.

In embodiments, the electric energy device may be an electrochemical energy storage device. In embodiments, the electric energy device may be being an electrical energy storage device.

In embodiments, the electrical energy storage device may be a battery with at least one cell. The battery may be a rechargeable battery. The battery may be a primary battery. The battery may be a a li-ion battery. The battery may be an alkaline battery. The battery may be a lead-acid battery.

In embodiments, the determining a characteristic of the electric energy device may include estimating at least one internal resistance of the electric energy device.

In embodiments, the determining a characteristic of the electric energy device may include determining an internal temperature of the electric energy device.

In embodiments, the short internal to the electric energy device may be characterized as a soft short when an estimated internal resistance of the energy device is below than a soft-type threshold, but above a hard-type threshold.

In embodiments, the short internal to the energy device may be characterized as a hard short when an estimated internal resistance of the energy device is at or below a hard-type threshold.

In embodiments, the electrical system may be a capacitor.

In embodiments, the electrochemical system may be a supercapacitor or ultracapacitor.

In embodiments, the signal parameter may be the mean value of more than one received signal. In embodiments, the more than one received signal may be consecutive received signals. The consecutive received signals may be taken with less than one minute open circuit wait time between the consecutive received signals.

In embodiments, the signal parameter may be the standard deviation value of more than one received signal. The more than one received signal may be consecutive received signals. The consecutive received signals may be taken with less than one minute open circuit wait time between the consecutive received signals.

In embodiments, there may be a combination of series and parallel connections of cells in the battery, energy device, energy system, or energy unit.

Without wishing to be bound by any particular theory, there can be discussion herein of beliefs or understandings of underlying principles relating to the invention. It is recognized that regardless of the ultimate correctness of any mechanistic explanation or hypothesis, an embodiment of the invention can nonetheless be operative and useful.

DETAILED DESCRIPTION

Figure 1:
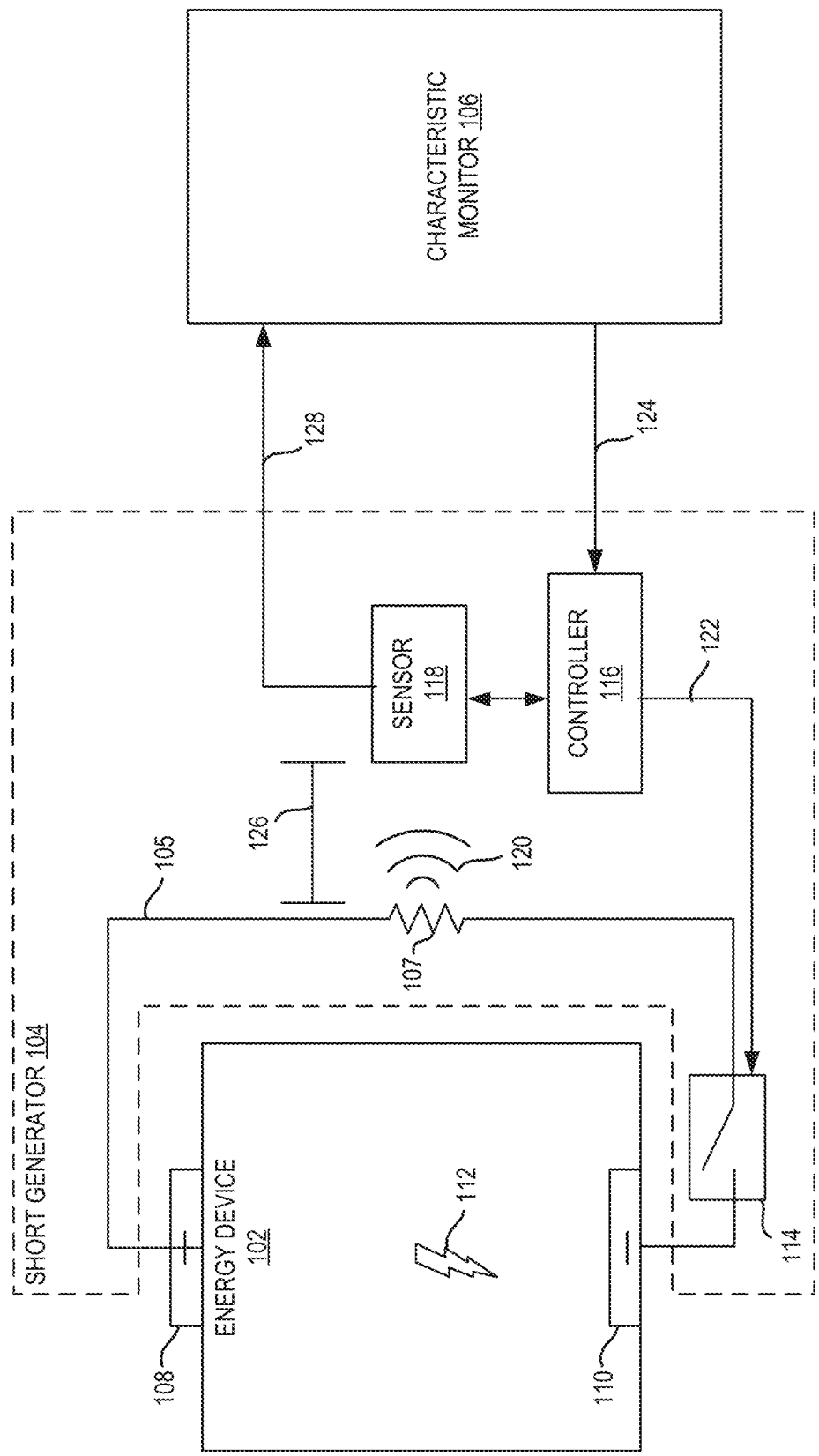
FIG. 1 depicts a system for monitoring characteristics of an energy device, in embodiments.

In general the terms and phrases used herein have their art-recognized meaning, which can be found by reference to standard texts, journal references and contexts known to those skilled in the art. The following definitions are provided to clarify their specific use in the context of the invention.

The terms "electrochemical energy device", "electrochemical energy unit", and "electrochemical energy systems" refer to a device, unit, or system, respectively, capable of converting chemical energy into electrical energy, or electrical energy into chemical energy. Electrochemical energy devices include, but are not limited to, primary batteries, secondary batteries, electrolysis systems, fuels cells, electrochemical capacitors, ultracapacitors, flow batteries, part solid part fluid electrochemical cells, metal-air batteries such as lithium air batteries and zinc-air batteries, and metal-aqueous batteries such as lithium-water batteries and semi-solid batteries. An electrochemical unit or system is a unit or system that includes at least one electrochemical device, and may include a plurality of electrochemical devices, optionally connected in series, parallel, or a combination thereof. Electrochemical devices, units, and systems may be electrochemical devices, units, and systems for providing electrical energy to a vehicle.

The terms "electrical energy device", "electrical energy unit", and "electrical energy systems" refer to a device, unit, or system, respectively, capable of harnessing energy by converting it to electrical energy, and/or storing electrical energy. Electrical energy devices include, but are not limited to, capacitors and photovoltaic devices. An electrical unit or system is a unit or system that includes at least one electrical device, and may include a plurality of electrical devices, optionally connected in series, parallel, or a combination thereof. Electrical devices, units, and systems may be electrical devices, units, and systems for providing electrical energy to a vehicle.

The terms "electrical/electrochemical energy device", "electrical/electrochemical energy unit", and "electrical/electrochemical energy systems" refer to a device, unit, or system, respectively, which includes an electrical energy device and/or an electrochemical energy device.

The terms "energy device", "energy unit", and "energy system" refers to an electrical/electrochemical energy device, an electrical/electrochemical energy unit, and an electrical/electrochemical energy system, respectively.

The term "change in electromagnetic field" refers to a change in a form of radiant energy that propagates through space via electromagnetic waves and/or photons.

The term "magnetically sensitive" refers to being sensitive to magnetic fields or changes, as a function of time, of magnetic fields. Examples of magnetically sensitive devices include, but are not limited to, an electromagnetic coil, a electromagnetic coil including a ferrite core, a copper coil, a closed loop antenna, a magnetic induction device, a toriodal inductor, a magnetometer, a Hall-effect probe, a solenoid, and a high electrical-conductivity spiral.

The term "electromagnetic coil" refers to a two-terminal electrical component capable of producing an electric current when subjected to a magnetic field which changes as a function of time. Electromagnetic coil may include at least one electrical conductor such as a wire in the shape of a coil, a planar coil, spiral or helix, Electromagnetic coil include an electrically conductive wire shaped to form a loop or a portion of a loop between the two terminals, and an electrically conductive wire shaped to form multiple loops between the two terminals.

The term "signal" refers to a quantity that conveys information about the behavior or attributes of a phenomenon. "Signal" includes a quantity that may provide information about the status of a physical system or convey a message between observers.

The term "system response" refers to the response of system to an applied signal, where the signal may be, for example, electrical, magnetic, or electromagnetic. The term "system response measurement" refers to applying the signal that induces the signal response, and measuring the system response.

The terms "passive detection" and "passively detecting" refer to the performance of measurements that are not system response measurements.

The term "state of health" refers to a figure of merit of the condition of an electrical/electrochemical device or a group of electrical/electrochemical devices for storing energy, compared to its ideal condition. State of health may be determined based on parameter including, but not limited to, resistance, impedance, conductance, capacity, voltage, self-discharge, ability to accept a charge, number of charge-discharge cycles, or a combination thereof.

The term "state of charge" refers to the amount of energy, which may be converted into electrical energy, held by an electrical/electrochemical device or a group of electrical/electrochemical devices for storing energy, compared to its maximum value.

The term "electrical short" refers to a value of electrical resistance that is below a threshold value.

The term "energy device characteristic" refers to a condition associated in an energy device, unit, or system that is indicative of a performance thereof. In an embodiment, the characteristic refers to the state of health of the energy device, unit, or system. In embodiment, the characteristic refers to the state of charge of the energy device, unit, or system. In embodiment, the characteristic refers to an abnormality of the energy device, unit, or system. In embodiment, the characteristic refers to a hard short associated with the energy device, unit, or system, such as between an anode current collector and a cathode current collector, or between an anode active material and a cathode active material, or between an anode current collector and a cathode active material or between an anode active material and a cathode current collector. In embodiment, the characteristic refers to a soft short associated with the energy device, unit, or system, such as between an anode current collector and a cathode current collector, or between an anode active material and a cathode active material, or between an anode current collector and a cathode active material or between an anode active material and a cathode current collector.

The term "abnormality" refers to a condition that develops in an energy device, unit, or system, that is indicative of non-routine, non-optimal, dangerous or otherwise unexpected or unwanted behavior in the energy device, unit, or system. In an embodiment, an abnormality refers to an electrical cutoff in an energy device, unit or system. In an embodiment, an abnormality refers to an electrical short in an energy device, unit or system. In an embodiment, a short circuit can develop between various components of an electrochemical energy device, such as between an anode current collector and a cathode current collector, or between an anode active material and a cathode active material, or between an anode current collector and a cathode active material or between an anode active material and a cathode current collector. In an embodiment, an abnormality refers to a state of health or change in state of health of an energy device, unit, or system indicative a decrease in operational performance, such as an increase in internal resistance, a capacity loss or an inability to undergo charge cycling.

The term "hard short" refers to a short, either external to the energy device, unit, or system, that has a resistance at, or substantially equal to, zero ohms, or otherwise below a predetermined threshold. For example, a hard short may include a solid connection between electrodes within the energy device that causes extremely high current flow and complete discharge resulting in permanent damage to the energy device.

The term "soft short" refers to a short, either external to the energy device, unit, or system that has a resistance non-equal to zero ohms, or otherwise above a predetermined hard-type threshold but below a soft-type threshold (because if above the soft-type threshold, the internal resistance may be substantially the same as the optimal internal resistance). For example, a soft short may include a small localized contact between electrodes within the energy device. Soft shorts may be self-correcting due to melting of the small regions in contact caused by the high current flow which in turn interrupts the current path as in a fuse. The existence of a soft short could possibly be indicated by an increase in the self-discharge of the energy device cell or by a cell with a higher self-discharge than the rest of the population. Soft shorts may be defined by a signal received that is below than a soft short threshold, but above than a hard short threshold.

Estimating internal parameters of an energy device may provide significant information about the state of charge and state of health of the measured battery. This information may then be used to adjust the cycling rate of the energy device, including enabling fast charging of the energy device and setting of voltage limit to avoid overcharge or over-discharge of the energy device, which not only damage the life of the energy device but also can cause serious safety problems.

Internal resistance of an energy device is an important internal parameter that directly affects the performance of the energy device. Further, state of health (and to some extent state of charge) of an energy device depends on the internal resistance of the energy device.

Estimating state of charge and state of health provides many benefits including faster charging and longer battery life. Conventional coulomb counting and OCV methods are very time consuming and very limited. Electrochemcial Impedance Spectroscopy (EIS) measurement, OCV delay over time, and entropy methods are some of the advanced methods to accurately estimate state of charge and state of health. However, these methods require costly hardware and may be difficult to implement in practice.

Embodiments of the systems and methods discussed herein may enable estimation of the internal resistance of the cell overcoming the disadvantages of other state of health and/or state of charge measurement systems. The methods and systems utilize hardware, exterior to the energy device, system, or unit, to measure a receive signal representing change in electromagnetic field produced by the energy device, either passively or actively, and analyze such signal as a function of the internal resistance, standard deviation, mean, variance or other statistical measure of the received signal. As an example, a higher than normal internal resistance reduces the received signal strength and/or its duration. Thus the suggested embodiments herein may be used to estimate the internal resistance of an energy device and thus can be used to estimate the state of health and/or state of charge of the energy device. An example is that an energy device with a potential soft short may show abnormally higher signal strength, due to lower internal resistance, even locally. On the other hand, an aged energy device may show abnormally lower signal strength, due to higher impedance of the energy device.

In addition to the large changes of internal resistance based on the state of health, the internal resistance also changes, although at a smaller scale, with state of charge of the energy device. Thus it is possible to not even estimate state of health based on large changes of internal resistance understood by large deviations from expected received signal, but also based on smaller changes in internal resistance understood by smaller deviations from expected value of received signal.

The "multi-scale" nature of dependence of internal resistance on state of health and state of charge and the relationship between the resistance of the energy device and the received signal analyzed in the systems and methods herein enables estimation of state of health and/or state of charge of the battery.

In addition to the internal resistance, the received signal may also depend directly on the amount of energy in the energy device, which is directly proportional to the state of charge of the energy device. Thus a stronger received signal of a specific energy device may demonstrate higher state of charge of the energy device.

In embodiments, the systems and methods herein may analyze a received signal based on the received signal's instantaneous quantity or parameter, such as maximum power, maximum voltage square, maximum voltage, maximum change in voltage, maximum current, maximum current square, maximum change in current, full-width voltage at half maximum and current at half maximum, or other instantaneous quantity or parameter at a given time. Furthermore, in embodiments, the systems and methods herein may analyze a received signal based on the received signal's integrated quantity or parameter over a period of time, such as "total absolute energy" or "total absolute coulomb" measured accumulatively over a period of time.

Embodiments of the systems and methods discussed herein may estimate the state of charge and state of health of the energy device very rapidly without the need to cycle the battery, thereby overcoming a significant disadvantage of other measurement methods. The systems and methods herein may create at least one arbitrary controlled short external to the energy device cell with a determined resistance, and then measuring the electromagnetic response by a detector, such as an arbitrary coil, measured at least at one known distance. The strength of the induced current in the coil may be a function of the state of charge and state of health of the energy device, in addition to its chemistry and format. The higher the state of charge or state of the health the stronger the measured signal. Thus it is possible, using embodiments of the systems and methods discussed herein, to distinguish between energy devices with different state of charge and state of health for any given energy device chemistry, size and format. The strength of the said induced current in the coil may also be a function of the created short resistance and the distance between the sensor and the energy device. The higher the resistance or further the distance the weaker the measured signal.

In at least one embodiment of an application of the estimation of state of charge and stated of health of energy device, discussed in association with at least some embodiments of the systems and methods discussed herein, fast charging of energy devices is implemented. When recharging a healthy energy device, a stronger received signal may indicate that the energy device can be charged faster than the time that the received signal is weaker. In certain embodiments, this may be due to the dependence of the received signal to the total resistance of the short, which not only includes the known outside resistance between the two poles of the energy device, but also the internal resistance of the energy device. Further, it is known that for some time, typically minutes, after the stop of the charge or discharge of the energy device there are still electrochemical reactions in the energy device and thus it takes time for the voltage to reach the actual the open circuit voltage. Thus, the embodiments discussed herein may measure the received signal at different time periods after the charge or discharge is stopped identifying different received signal values, which can be an indication of the state of health or state of charge of the energy device.

Embodiments of the systems and methods discussed herein provide significant advantages over other energy device management methods, including that, for a group of energy devices, the received signal is mostly governed by the weakest energy device, which is in accordance with the performance of the group, as a group of energy devices is mostly governed by the weakest energy device cell. In a series connection the weakest energy device cell has the highest impedance so the total impedance of the group goes up and thus the received signal gets weak. In a parallel connection the increase in the impedance due to the weak energy device cell is less significant than in the series connection, However, in this case the voltage drop of the weak energy cell due to the resistance of the weak energy cell and also the internal current between the cells is due to tendency of the parallel connection to keep the voltage of all cells the same during the designed external short results in the signal being weaker than normal, again indicating the presence of a cell with not optimal state of health.

Embodiments of the systems and methods herein provide another measurement, namely a change in electromagnetic field caused by the energy device, system, or unit, than a voltage, current, or temperature measurement based energy device management unit. For example, those energy device management units that are thermal based are disadvantaged because they often lack ability to detect internal temperature of the energy device without expensive equipment. Therefore, surface temperature of the energy device may register at 25 degrees Celsius, whereas it is possible that the internal temperature at an internal short is upwards of 800 degrees Celsius. The inability to accurately measure temperature within the energy device may not allow enough time to predict failure long before self-heating begins, or at least for the failing energy device to be physically or electronically removed from use in order to prevent the thermal runaway or its propagation to neighboring energy devices.

Voltage monitoring systems, such as those used in the 787 airplane, which was subject to a failed energy device that caught on fire, cannot monitor potential failures with the speed that embodiments of the present systems and methods are able to. Systems that monitor voltage over a period of time to determine failing energy devices may lack ability to identify a failing energy device in an instance. For example, in the 2013 fire on a 787 Airplane, data collected by the flight data recorder indicated that a potential failure possibly may have been detected almost 10 minutes prior to the start of a thermal runway that led to the failure. However, the voltage monitor was unable to detect the failure signals.

Again, the present systems and methods provide significant advantages because they not only estimates characteristics including, but not limited to, state of charge and state of health, but may also detect any short, small or large, as soon as it happens. Early detection of small shorts is of particular importance especially for a group of batteries, as the voltage drop, resistance drop, temperature rise or current leak may be too small for conventional battery monitoring methods to detect. The present systems and methods detects even these shorts, sometimes called soft shorts, in advance of their development into larger, less resistance shorts. This gives the device management unit the opportunity to predict a large short in advance and prevent thermal runaways. Further, small shorts put additional loads on connected energy devices that can significantly shorten the life of the energy devices. As an example, the said soft shorts can be due to small dendrites reaching the cathode from the anode side.

FIG. 1 depicts a system 100 for monitoring characteristics of an energy device 102, in embodiments. System 100 may include a short generator 104 and a characteristic monitor 106.

Energy device 102 may include a positive terminal 108 and a negative terminal 110, and may have an energy device characteristic 112 associated therewith. Energy device 102 may represent an energy device, energy unit, energy system, electrical/electrochemical energy device, electrical energy device, electrical energy unit, electrical energy system, electrochemical energy device, electrochemical energy unit, electrochemical energy system or any other system, device, or unit capable of producing and/or storing energy. Energy device characteristic 112 may represent state of health, state of charge, a short, a soft short, a hard short, abnormality, or any other characteristic associated with energy device 102.

Short generator 104 may generate an external short 105 between positive terminal 108 and negative terminal 110 across a known resistance 107. Known resistance 107 may be a fixed resistance, or may be a variable resistance without departing from the scope hereof. Short generator 104 may include a switch 114 for activating the external short 105. In embodiments, switch 114 may be controlled via a controller 116. Short generator 104 may further include a sensor 118 for sensing change in electromagnetic field 120 generated by external short 105.

Controller 116 may include a processor and memory storing transitory and/or non-transitory computer readable instructions (such as software, hardware, firmware, or a combination thereof) that when executed by the processor of controller 116 implement the following functionality. Controller 116 may generate a switch control signal 122 for controlling operation of switch 114 to cause an instantaneous short within short 105. In embodiments, controller 116 may include a communications interface for receiving a short generation signal 124, in which controller 116 generates switch control signal 122 in response to receipt of short generation signal 124. The communications interface may be based on a wired or wireless communication protocol including Ethernet, lightning cable, coaxial cable, hardwired cable, WiFi, USART, RFID, Bluetooth, Bluetooth Low Energy (BLE), Cellular, 2G, 3G, 4G, 5G, infrared, or any other communication protocol.

Sensor 118 may include an electromagnetic coil, such as an electrical conductor such as a wire in the shape of a coil, spiral or helix, for sensing change in electromagnetic field 120. It should be noted that in sensors 118 that are planar coils it is important to mention that the strength of the received signal depends on the orientation between the change of the field and the coil, and more than one planar coil may be utilized, for example with coils being at an angle, such as perpendicular to each other. Sensor 118 may be any of the sensors as discussed in U.S. patent application Ser. No. 14/211,381, entitled "Systems and Methods for Detecting Abnormalities in Electrical and Electrochemical Energy Units," and which is incorporated herein in its entirety. It should be appreciated that, although sensor 118 is illustrated as wireless, it may be a wired sensor for sensing electrical short information as opposed to change in electromagnetic field 120 without departing from the scope hereof. Sensor 118 may be at a known, predetermined distance 126 from electrical short 105. Although one sensor 118 is illustrated, it should be appreciated that any number of sensors could be utilized without departing from the scope hereof.

Characteristic monitor 106 may be in communication with sensor 118 for receiving a received signal 128 representing the change in electromagnetic field 120. It should be appreciated that the received signal 128 may be stored within controller 116 prior to transmission, from either sensor 118 or controller 116, to characteristic monitor 106 as received signal 128. Additional details of characteristic monitor 106 are discussed in further detail below.

FIGS. 2-7 depict additional embodiments of systems for monitoring characteristics of an energy device. Specific instances of an item may be referred to by use of a numeral in parentheses (e.g., energy device 102(1)) while numerals without parentheses refer to any such item (e.g., energy device 102).

Figure 2:
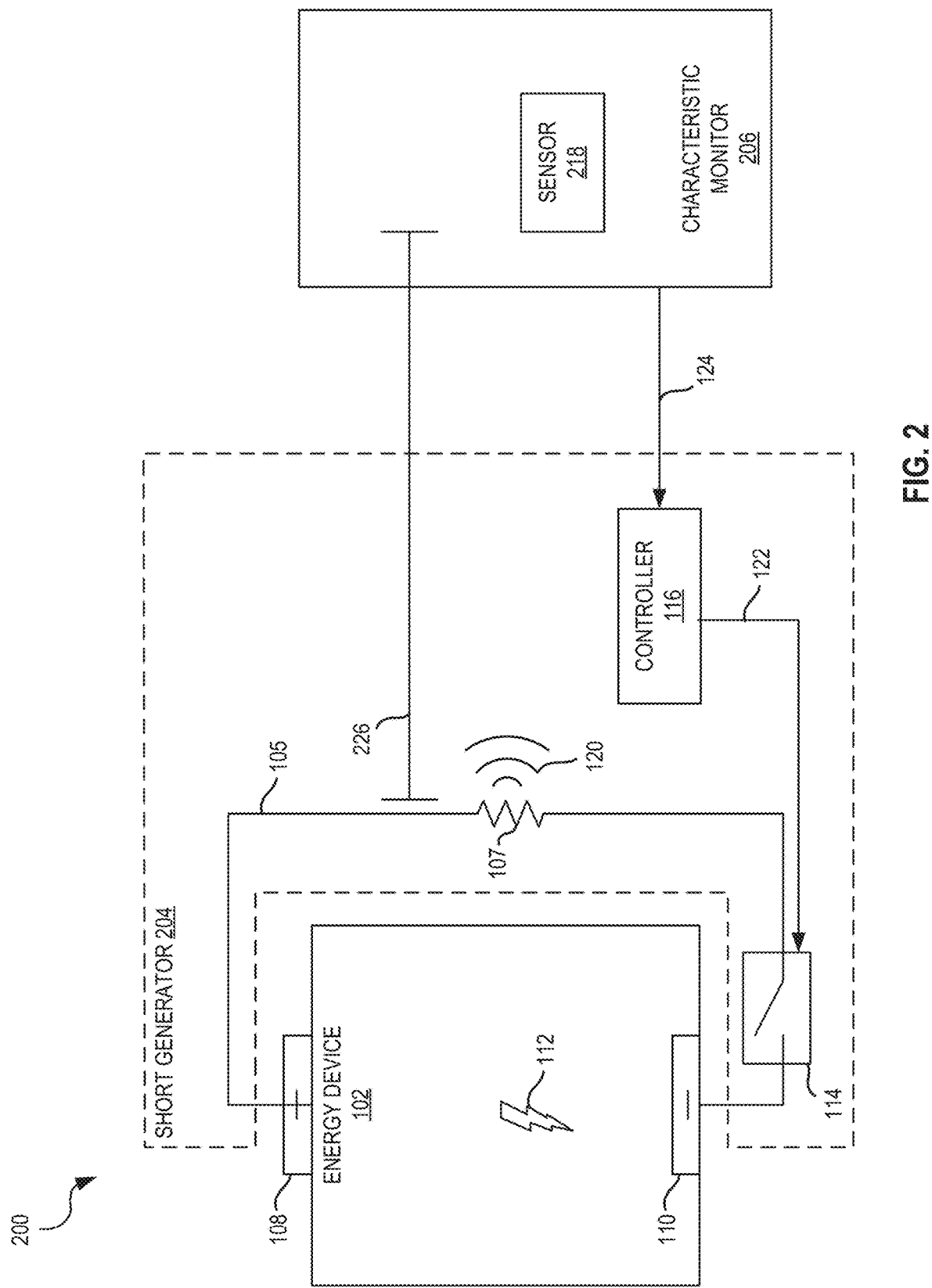
FIG. 2 depicts a system for monitoring characteristics of an energy device, in embodiments.

FIG. 2 depicts a system 200 for monitoring characteristics of an energy device 102, in embodiments. System 200 is similar to system 100 except that sensor 218 is located external of the short generator 204, for example, within characteristic monitor 206; whereas sensor 118 is located within short generator 104.

Energy device 102 shown in system 200 is the same as energy device 102 shown in system 100, discussed above.

Short generator 204 is similar to short generator 104 and thus may generate an external short 105 between positive terminal 108 and negative terminal 110 across a known resistance 107. Short generator 204 may include switch 114 for activating the external short 105, as discussed above. In embodiments, switch 114 may be controlled via a controller 116 as discussed above.

Sensor 218 may include any of the above discussed features of sensor 118. Sensor 218 may be at a known, predetermined distance 226 from electrical short 105. Although one sensor 218 is illustrated, it should be appreciated that any number of sensors could be utilized without departing from the scope hereof.

Characteristic monitor 206 may be in communication with sensor 218 for receiving a received signal 228 representing the change in electromagnetic field 120. Additional details of characteristic monitor 206 are discussed in further detail below.

Figure 3:
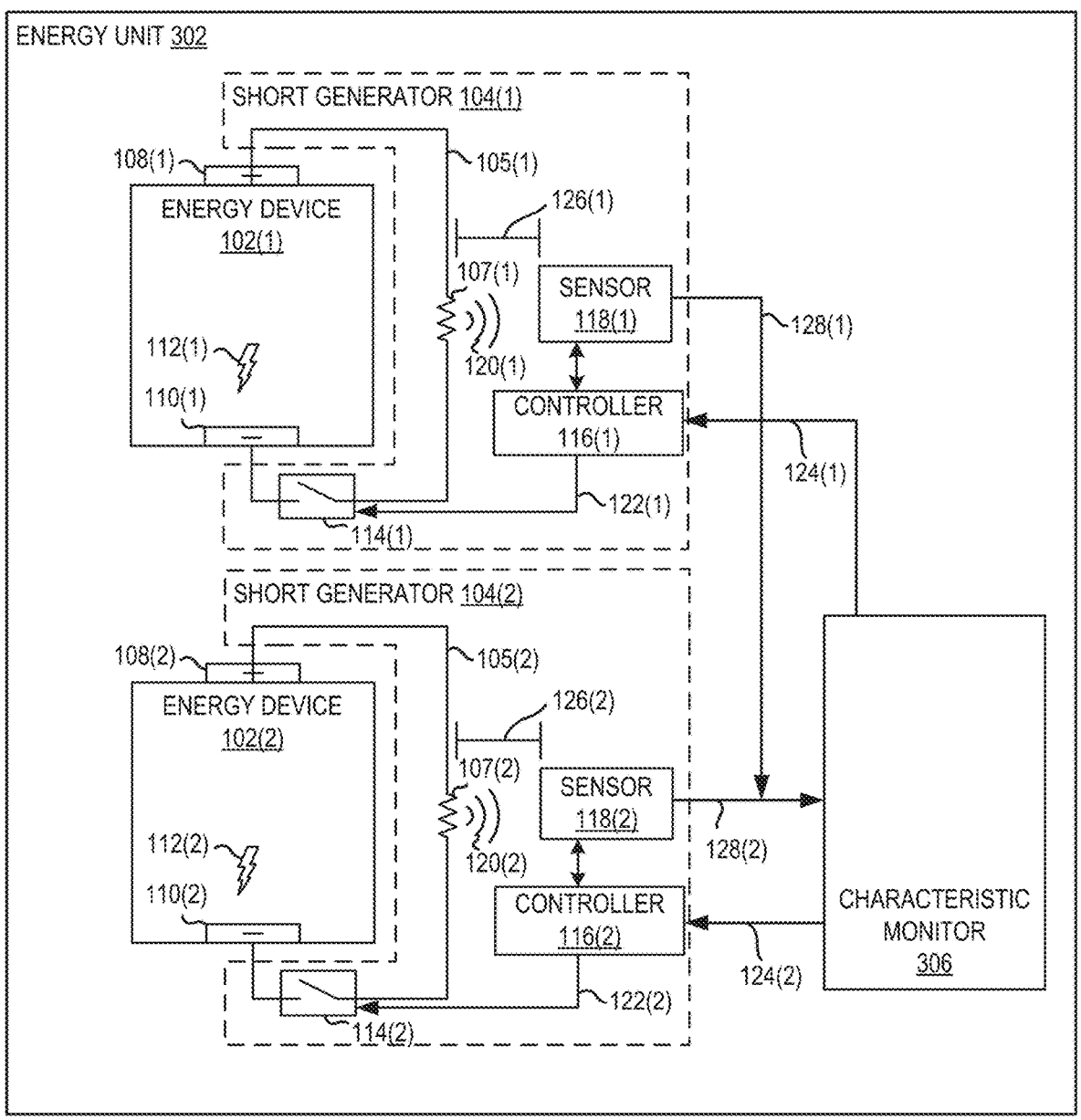
FIG. 3 depicts a system for monitoring characteristics of an energy unit having a plurality of energy devices, in embodiments.

FIG. 3 depicts a system 300 for monitoring characteristics of an energy unit 302 having a plurality of energy devices 102(1), 102(2), in embodiments. System 300 is similar to system 100 except that characteristic monitor 306, which is similar to characteristic monitor 106, receives signals from a plurality of sensors 118 associated with each of the plurality of energy devices 102(1), 102(2) within energy unit 302. It should be appreciated that, although shown within energy unit 302, characteristic monitor 306 may be located external to energy unit 302. System 300 provides the advantage that a single characteristic monitor 306 may monitor a plurality of sensors 118 associated with each energy device 102 to provide individual monitoring of each energy device 102 within an energy unit 302.

Figure 4:
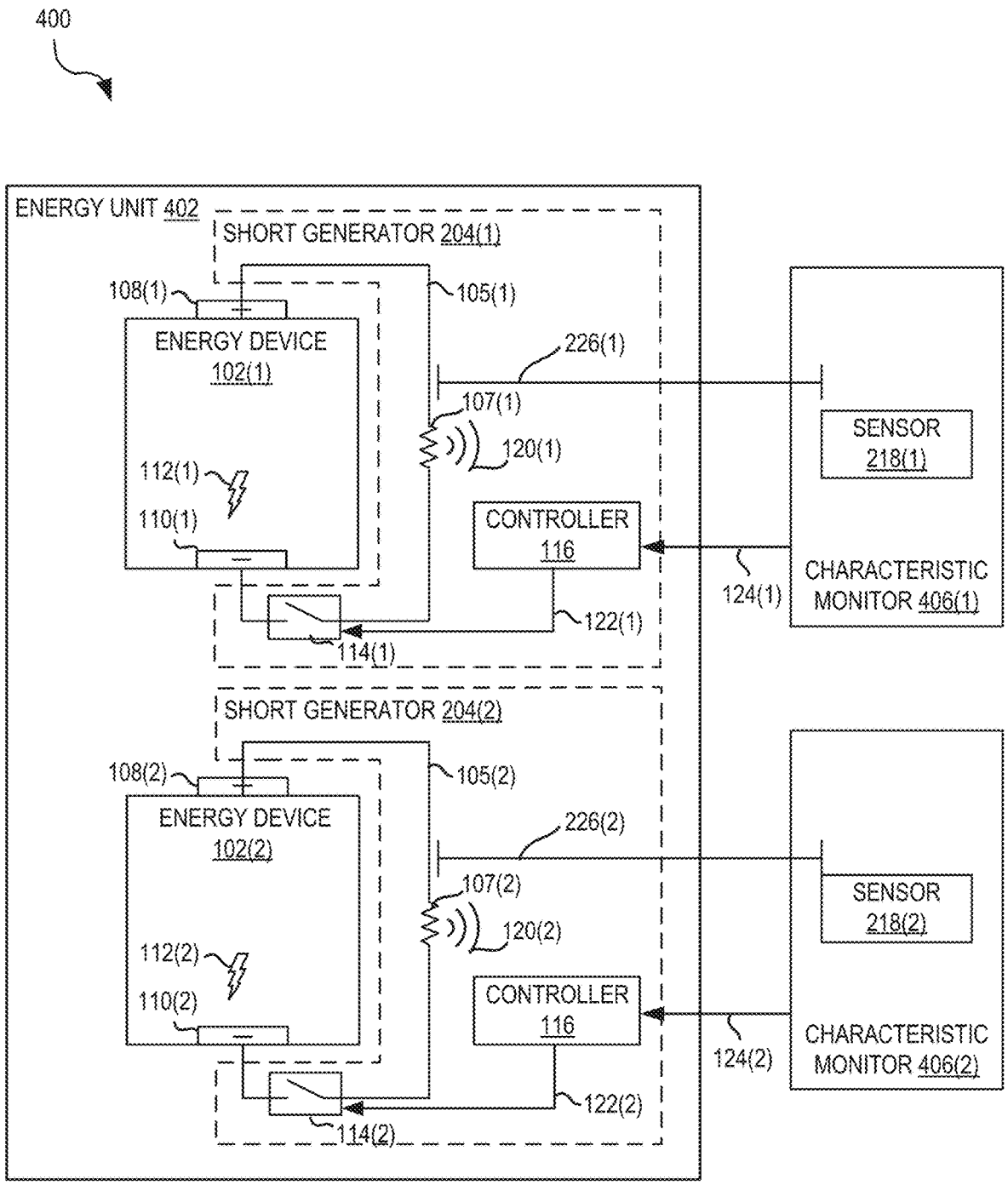
FIG. 4 depicts a system for monitoring characteristics of an energy unit having a plurality of energy devices, and short generators, in embodiments.

FIG. 4 depicts a system 400 for monitoring characteristics of an energy unit 402 having a plurality of energy devices 102(1), 102(2), and short generators 204(1), 204(2), in embodiments. System 400 is similar to system 200 except that characteristic monitors 406(1), 406(2), which are similar to characteristic monitor 206, include each an embedded sensors 218. It should be appreciated that, although shown having two separate characteristic monitors 406(1), 406(2), there may be only a single characteristic monitor 406 without departing from the scope hereof. System 400 provides the advantage that each characteristic monitor 406 may be an independent component such that any make, type, configuration of energy units 402 (and energy devices 102) may be monitored without requiring individual sensor and monitor hardware associated with the energy device/unit itself.

Figure 5:
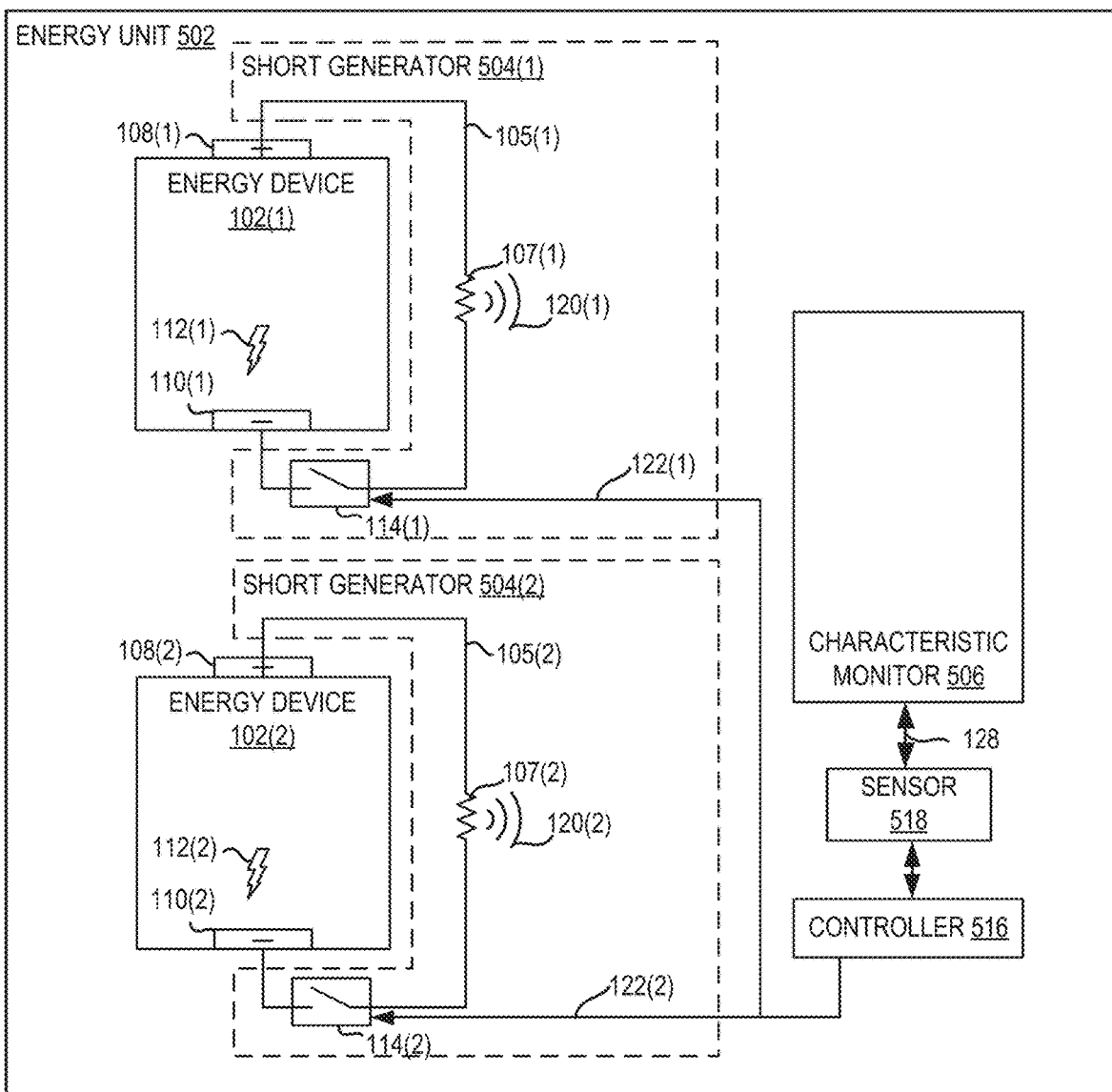
FIG. 5 depicts a system for monitoring characteristics of an energy unit having a plurality of energy devices, and short generators, in embodiments.

FIG. 5 depicts a system 500 for monitoring characteristics of an energy unit 502 having a plurality of energy devices 102(1), 102(2), and short generators 504(1), 504(2), in embodiments. System 500 is similar to system 400 except that, instead of two characteristic monitors 406(1), 406(2), each having an embedded sensors 218, there is a single characteristic monitor 506 with an external sensor 518. Moreover, each of short generators 504 are similar to short generators 204, except that a single controller 516 controls each of short generator 504(1), 504(2). Characteristic monitor 506 is similar to characteristic monitor 106 and includes any of the features discussed above with respect to characteristic monitor 106. Sensor 518 is similar to sensor 118 and includes any of the features discussed above with respect to sensor 118. Sensor 518 may be at a known, predetermined distance from each of external shorts 105(1) and 105(2). System 500 provides the advantage that characteristic monitor 506 may monitor a plurality of energy devices 102 within a battery bundle (e.g. energy unit 502) without requiring additional hardware and respective sensors 518 and controllers 516 for each energy device 102.

Figure 6:
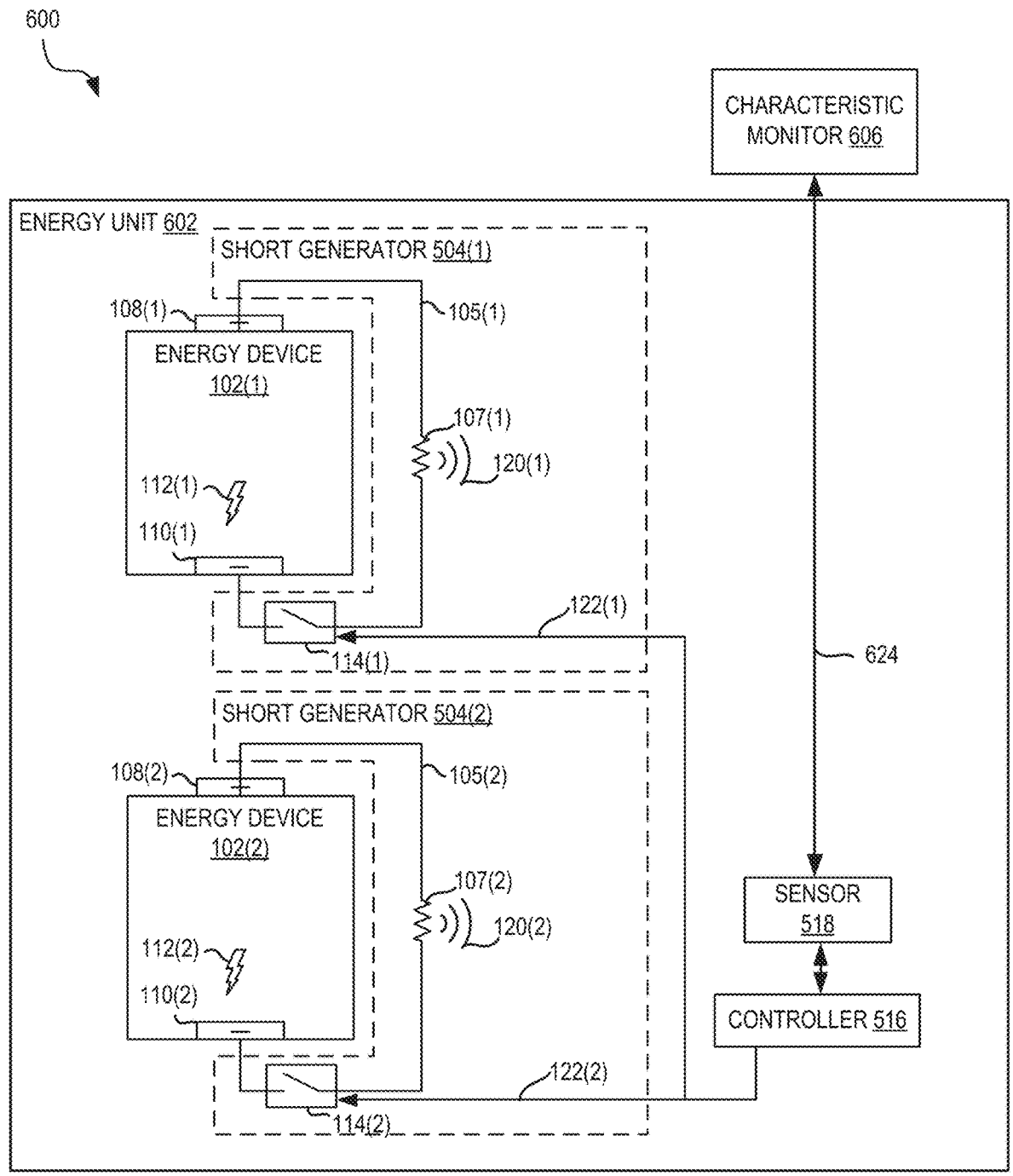
FIG. 6 depicts a system for monitoring characteristics of an energy unit having a plurality of energy devices, and short generators, in embodiments.

FIG. 6 depicts a system 600 for monitoring characteristics of an energy unit 602 having a plurality of energy devices 102(1), 102(2), and short generators 504(1), 504(2), in embodiments. System 600 is similar to system 500 except characteristic monitor 606 is located external to energy unit 602 whereas characteristic monitor 506 was located internal to energy unit 502. System 600 provides the advantage that characteristic monitor 606 may be a separate device from an energy unit 602 which may be a bundle of batteries, for example. Therefore, received signal 628, which is similar to received signal 128 discussed above, may be transmitted, via wired or wireless communication, to characteristic monitor 606 for further processing.

Figure 7:
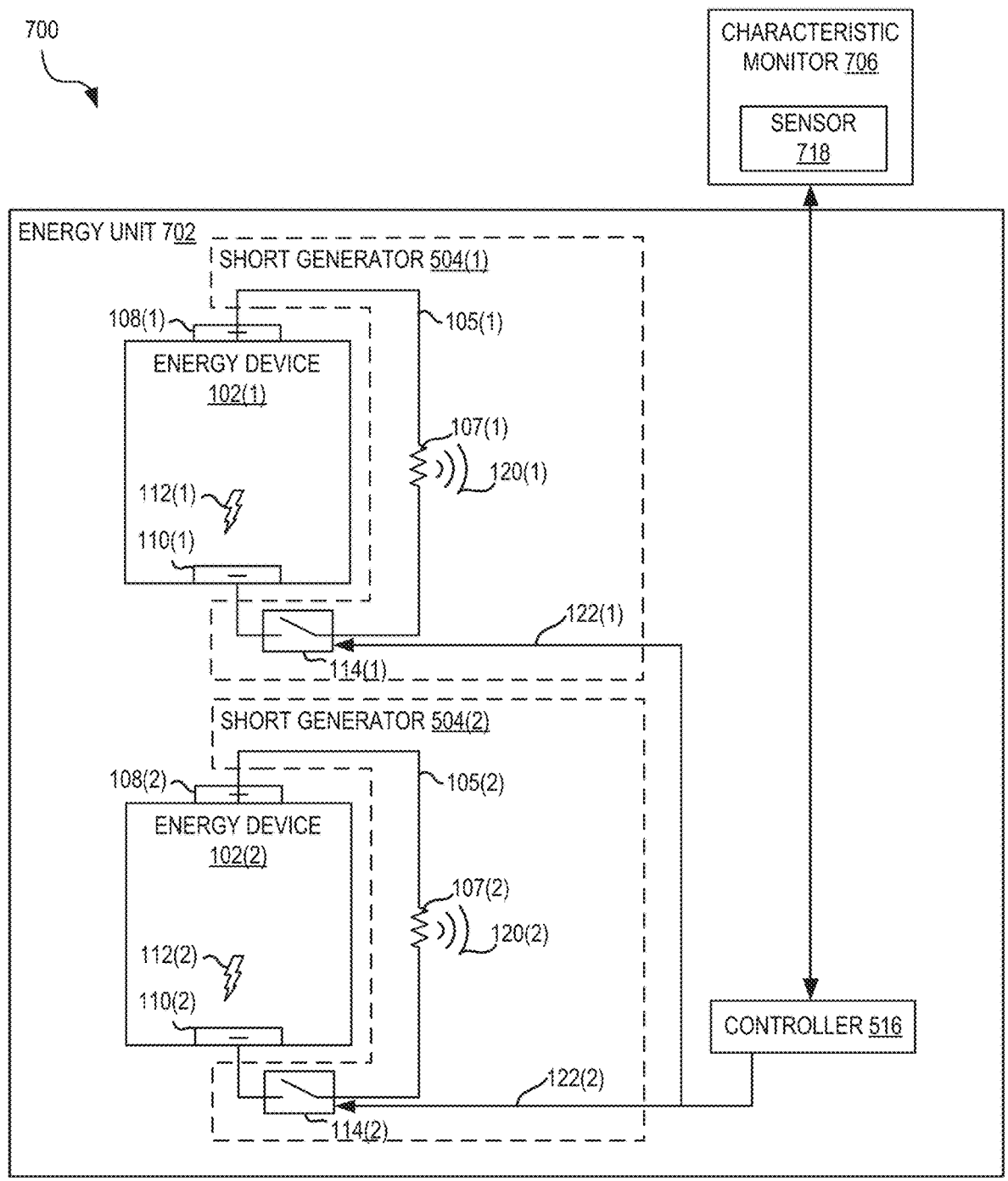
FIG. 7 depicts a system for monitoring characteristics of an energy unit having a plurality of energy devices, and short generators, in embodiments.

FIG. 7 depicts a system 700 for monitoring characteristics of an energy unit 702 having a plurality of energy devices 102(1), 102(2), and short generators 504(1), 504(2), in embodiments. System 700 is similar to system 600 except both characteristic monitor 706 and sensor 718 are located external to energy unit 702 whereas only characteristic monitor 606 was located external to energy unit 602 in system 600. Sensor 718 is similar to sensor 218 discussed above. System 700 provides at least similar advantages as both systems 600 and 400, discussed above.

Within FIGS. 2-7, two energy devices 102 are depicted coupled in series. However, it should be appreciated that there may be any number of energy units coupled in series, or in parallel, without departing from the scope hereof. Moreover, it should be noted that any one of the energy devices, or units discussed above may include a housing with various mounting structures for mounting the sensor. For example, if the sensor is located internally to an energy unit, the housing may have an internal mounting structure such that the sensor always maintains a known distance to the external short. Alternatively, if the sensor is externally located, such as being internal to a characteristic monitor that is removably attached to the energy unit, then the energy unit may have a mounting structure located on the outside of the housing such that the characteristic monitor may be aligned to maintain the sensor at a given distance from the external short on the energy devices.

Figure 8:
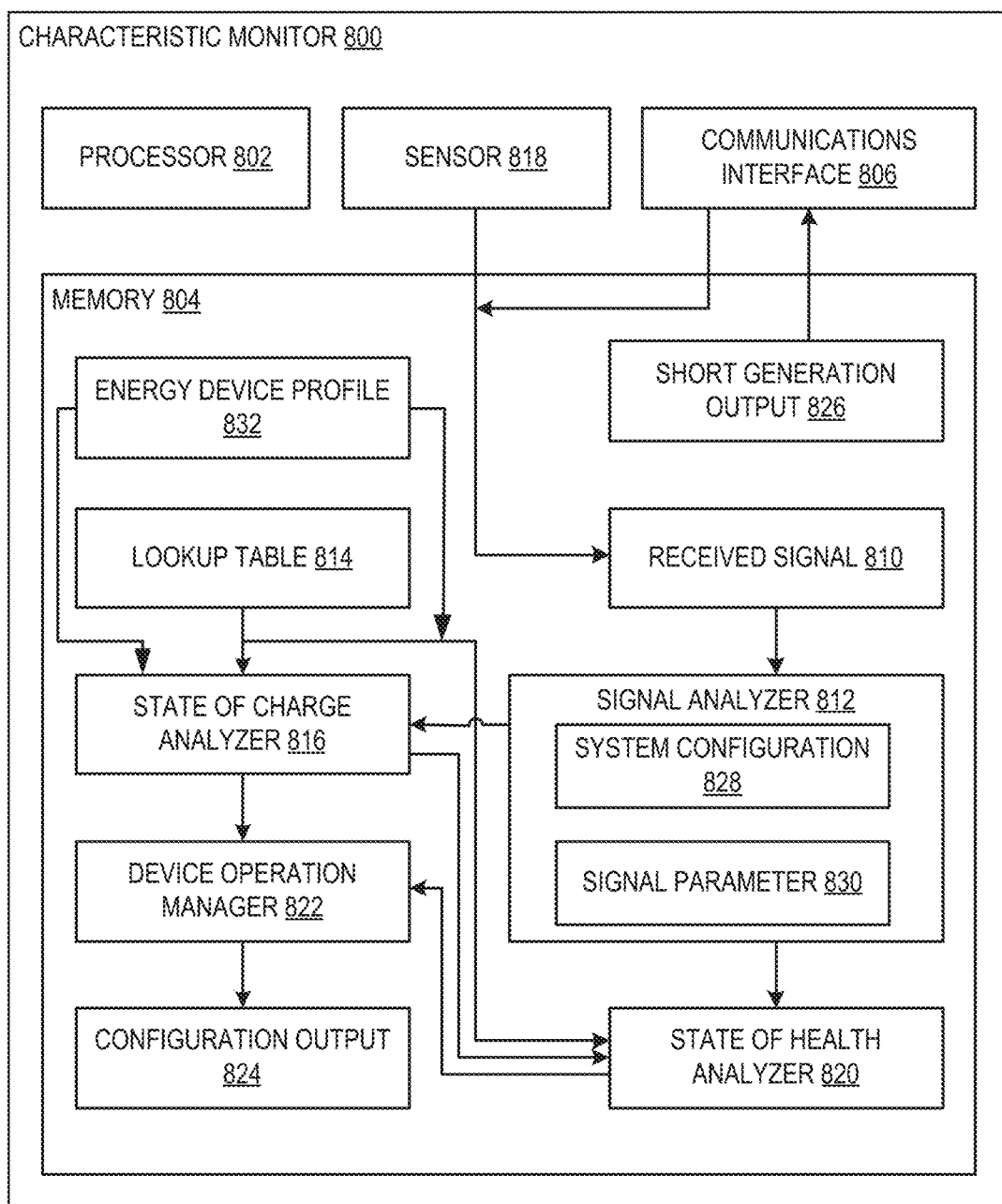
FIG. 8 depicts a characteristic monitor, in exemplary detail, in embodiments.

FIG. 8 depicts a characteristic monitor 800, in exemplary detail, in embodiments. Characteristic monitor 800 illustrates additional exemplary detail for any of characteristic monitors 106, 206, 306, 406, 506, 606, and 706 discussed above with reference to FIGS. 1-7. Characteristic monitor 800 may include a processor 802 in communication with a communications interface 804 and memory 806.

Processor 802 operates to execute instructions stored within memory 806 to implement the functionality discussed herein associated with characteristic monitor 800. In embodiments, processor 802 may include an on- or off-board Analog to Digital Converter (ADC) having sampling speeds in the range of 0.01-100 million samples per second (MSPS). In embodiments, the sampling speed is selected such that approximately 2 samples per peak of the received signal are generated. These sampling speeds may provide increased sensor sampling such that accurate signal parameters 830 may be obtained.

Communications interface 804 may be a wired or wireless communications protocol based device. For example, communications interface 804 may couple characteristic monitor 800 to a short generator (e.g. any of short generator 104, 204, 504) and any one or more of the components associated therewith (e.g. switch 114; controller 116, 516; and sensor 118, 218, 518, 718). Communications interface 804 may operate based on any one or more of the communications protocols chosen from the group of, but not limited to: Ethernet, lightning cable, coaxial cable, hardwired cable, USART, WiFi, RFID, Bluetooth, Bluetooth Low Energy (BLE), Cellular, 2G, 3G, 4G, 5G, infrared, or any other communication protocol. In embodiments, communications interface 804 operates to modulate a DC signal on a DC data line. For example, communications interface 804 may be used to transmit a configuration output 824, discussed below, by modulating a DC line, that each energy unit is coupled to in order to transfer the energy therein, with a data signal instead of a separate wireless or wired signal.

In embodiments, communications interface 804 may operate to transmit or receive data from other configuration monitors or the cloud. For example, the present systems and methods discussed herein may be connected to systems of other energy devices, for example in a cloud setup, providing a benefit of an "Internet of Battery Things". An online library may thus be created and used in addition to local lookup tables and energy device profiles discussed throughout this disclosure.

Memory 806 may include any one or more of received signal 810, signal analyzer 812, lookup table 814, state of charge analyzer 816, state of health analyzer 820, device operation manager 822, and configuration output 824.

Received signal 810 may be generated by a sensor, such as sensors 118, 218, 518, 718 discussed above. In embodiments, characteristic monitor 800 includes an internal sensor 818 that includes any of the features discussed above with regards to sensors 118, 218, 518, 718. In such embodiments, received signal 810 may come directly from sensor 818 located in characteristic monitor 800. In other embodiments, characteristic monitor 800 receives received signal 810 via communications interface 804 interacting with an external sensor (e.g. any of sensors 118, 518, and/or an external controller (e.g. any one of controllers 116, 516). Received signal 810 may represent the change in electromagnetic field generated by an external short (e.g. external short 105) generated by a short generator (e.g. short generator 104, 204, 504).

Received signal 810 may be actively or passively generated. In embodiments where received signal 810 is actively generated, the external short (e.g. external short 105) may be generated in response to characteristic monitor 800 outputting, via communications interface 804, short generation output 826. Short generation output 826 is an example of short generation signal 124, discussed above with reference to FIGS. 1-7, and may indicate when to generate the external short by the short generator. In embodiments where received signal 810 is passively generated, a short may be detected without any affirmative generation of the detected short. For example, a passive received signal 810 may be detected when the sensor detects change in an electromagnetic field generated by an internal short within the energy device. It should be appreciated that any received signal discussed herein (e.g. received signals 128, 628) may be either passive, active, or both.

Signal analyzer 812 may include transitory and/or non-transitory computer readable instructions (such as software, hardware, firmware, or a combination thereof) that, when executed by processor 802, operate to analyze the received signal 810. Signal analyzer 812 may include system configuration information 828 that is utilized by signal analyzer 812 to properly calculate signal parameters 830 of the received signal 810. For example, system configuration information 828 may include knowledge of the sensor (e.g. 118, 218, 518, 718, 818) used to acquire received signal 810, the known, predetermined resistance (e.g. resistance 107) of the external short (e.g. external short 105), the known distance between the sensor and the short (e.g. distance 126, 226), etc. In embodiments, signal parameter 830 may include one or more instantaneous parameters chosen from the group of parameters including: maximum power, maximum voltage square, maximum voltage, maximum change in voltage, maximum current, maximum current square, maximum change in current, full-width voltage at half maximum and current at half maximum. or other instantaneous quantity or parameter at a given time between 1 nanosecond and 10 microseconds from initial short generation, and preferably between 10 nanoseconds and 1 microsecond from initial short generation.

In embodiments, signal parameter 830 may include one or more integrated parameter chosen from the group of parameters including: total absolute energy and total absolute coulomb measured accumulatively over a period of time. In embodiments, signal parameter 830 may be based on the following equation 1:

$$S = f(Q, V, 1/r, 1/R, 1/D \cdot T) \tag{Eq. 1}$$

where S is the Strength of the received signal, D is a distance between the battery or the nearest point of the external short and the sensor, R is a known external resistance selected based on the application and battery that can be in series or parallel to the battery and may vary, r is internal resistance of the energy device to the generated short, Q is a stored coulomb in the energy device, and V is a voltage of the energy device. T is temperature.

For a given D=D0, as the external resistance (e.g. resistance 105) and internal resistances are in series, by using a high external resistance, R, relative to internal r, (R>>r) the effect of Q will be dominant thus the signal strength can be used to estimate the Q, without any significant disturbance from r; that is based on equation 2:

$$S_{R>>r, D=D0} = f(Q, V) \tag{Eq. 2}$$

On the other hand, a small R compared to r, (R<<r), increases the effect of internal resistance, r, on the Signal, S, thus both Q and r are important, resulting in both SOC and SOH affecting the S.

$$S_{R \ll r, D=D0} = f\left(Q, V, \frac{1}{r}\right) \tag{Eq. 3}$$

Thus by two experiments, one with using a large R and a small R, on an energy device one can estimate both state of charge and then state of health, because state of charge and then state of health can be decoupled with good precision by choosing the right parameters of R.

The relationship between S and the parameters may depend on some fixed attributes of a given type of energy device. Examples of the fixed attributes for an energy device type are the chemistry and size of active materials, geometry of the electrodes and geometry and size of the battery. This means that by comparing the measured S, from the 2 experiments above, with known values of S for given state of charge and state of health of the type of the energy device, one can estimate the state of charge and state of health of the energy device of the interest. Thus, lookup table 814 may include predetermined information regarding the energy device, unit, or system (e.g. energy device 102, energy unit 302, 402, 502, 602, 702, etc.) required to identify a characteristic thereof using characteristic monitor 800. Lookup table 814 may include any one or more expected device parameters chosen from the group of expected device parameters including: device brand, device manufacture, device model, device voltage, device C-rate, device material composition, expected device internal resistance, device statistical analysis (such as mean, standard deviation, and variance) and device installation information. Each expected device parameters may be associated with a plurality of exemplary distances between sensor and external short (i.e. external short 105).

It should be appreciated that the lookup tables, and signal parameters herein may include information regarding another measurement of the energy device such as voltage, current, and/or temperature.

In embodiments, the signal parameter 830 may include a statistical analysis of a plurality of received signals 810 over a given period of time. For example, the statistical analysis may include one or more of a mean, standard deviation thereof, variance thereof, and any other statistical analysis of received signal 810. In such an embodiment, signal analyzer 812 (or one or both of state of charge analyzer 816 and state of health analyzer 820) may receive a plurality of received signals 810, and then take the mean, standard deviation, and/or variance thereof. The statistical analysis may then be utilized to predict state of charge, state of health, and energy device lifespan, among other energy device characteristics.

Figures 9, 10, 11:
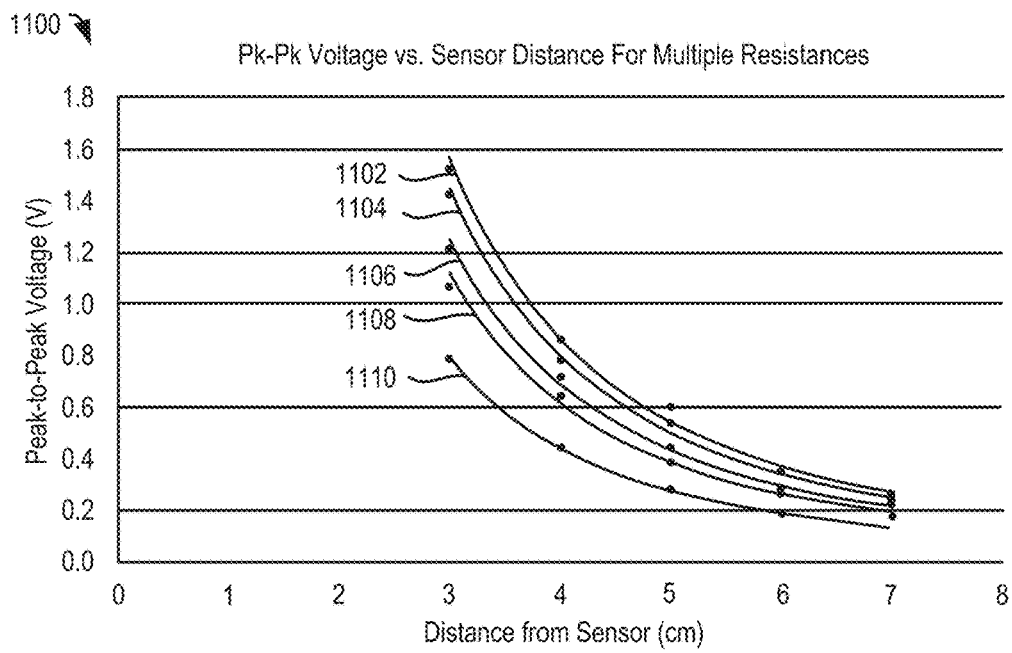
FIG. 9 depicts an exemplary lookup table, in an embodiment.
FIG. 10 depicts exemplary lookup table generation data, in an embodiment.
FIG. 11 depicts exemplary lookup table generation data, in another embodiment.

FIG. 9 depicts an exemplary lookup table 900, in an embodiment. FIG. 10 depicts exemplary lookup table generation data 1000, in an embodiment. FIG. 11 depicts exemplary lookup table generation data 1100, in another embodiment. FIGS. 9 and 11 are best viewed together with the following description. Lookup table 900 is an example of lookup table 814 of FIG. 8. Lookup table shows, for a given energy device type, model, manufacture, etc., peak-to-peak voltages 902 measured from a plurality of distances 904 for a plurality of external short resistances 906. Distances 904 are examples of distances 126, 226, discussed above with reference to FIGS. 1-8. External short resistances 906 are examples of known, predetermined resistance 107 discussed above with regards to FIGS. 1-8. Each value 902 may be based on an average of the maximum voltage level within the received signal (e.g. received signal 810) taken over a plurality of trials. For example, in lookup table generation data, which generated the peak-to-peak voltages 902 for a 0.35 Ohm short resistance 906 in FIG. 9, four trials were completed and the average maximum was used for the peak-to-peak voltages 902 in FIG. 9.

As shown in FIG. 11, lookup table generation data 1100 may be plotted to generate best fit lines 1102-1110. Best fit line 1102 represents data for a 0.1 Ohm external short. Best fit line 1104 represents data for a 0.35 Ohm external short. Best fit line 1106 represents data for a 0.45 Ohm external short. Best fit line 1108 represents data for a 1 Ohm external short. Best fit line 1110 represents data for a 1.6 Ohm external short. Within data 1100, best fit lines are shown having a format $V=mr^a$; where V is the peak-to-peak voltage value, m is a first constant, r is measured value from sensor, and a is an "r-factor" second constant. First and second constants may be required based on the installation configuration. For example if the energy device is located in an enclosure that causes the change in electromagnetic field from the external short to reflect off of the enclosure, the first and second constants may compensate for such reflection to generate an actual voltage value. It should be appreciated that, although FIGS. 9-11 discuss peak-to-peak voltages, similar concepts may be used for instantaneous energy values, current values, or integral values such as total absolute energy and total absolute coulombs without departing from the scope hereof.

Signal analyzer 812 may further store signal parameter 830, captured over a series of measurements on the energy device as an energy device profile 832. In embodiments, successive received signals 810 may be received at a frequency of 2 kHz or less. The number of successive received signals 810 for a statistical parameter can be, for example, 2 to 10 times to provide enough data points for the statistical analysis. The duration of wait between each of these successive received signals may depend on the battery chemistry and type. As an example, the duration between successive received signals 810 may be between 1 millisecond and 1 minute.

Energy device profile 832 may include a history of signal parameters 830 receive regarding a given energy device, system, or unit. For example, where signal parameters 830 represent a statistical analysis, as discussed above, energy device profile 832 may store the history of the statistical parameters for the energy device at a given state of charge per cycle. In other words, energy device profile 832 may store, for each cycle of the energy device (e.g. for each charge cycle or discharge cycle, or both, of the energy device), what the value of the statistical parameter was at a given state of charge. This may occur at multiple state of charges per cycle. As such, a received signal 810 may be obtained multiple times throughout a cycle of an energy device, and the signal parameter at those particular times, including signal instantaneous values, integral values, and statistical values, may be stored in association with the particular cycle.

State of charge analyzer 816 may include transitory and/or non-transitory computer readable instructions (such as software, hardware, firmware, or a combination thereof) that, when executed by processor 802, operate to analyze signal parameter 830 and lookup table 814 to determine the state of charge of an energy device. State of charge of the energy device may be determined based on an signal parameter 830 as compared to an expected parameter value for the given short resistance. As an example referring to the values of FIG. 9, if the external short resistance 107 is 0.35 Ohms, the short distance is 3 cm, and the signal parameter 830 returns a value that at 1.4245 V, or within a predefined threshold thereof, then it may be determined that the energy device is fully charged. If the signal parameter 830 indicates a value that is not equal to 1.4245 V, or is outside of a predefined threshold thereof, then a mathematical calculation may be used to determine the charge level of the energy device.

In embodiments, state of charge analyzer 816 may be based on a signal parameter 830 that is a statistical parameter. For example, the mean, standard deviation, and/or variance may be determined by signal analyzer 812 based on a series of received signal 810. Particularly, in embodiments the mean may be analyzed to determine state of charge. State of charge analyzer 816 may then compare the statistical parameter to lookup table 814 to determine if the measured statistical parameter is within a given threshold from the expected value within the lookup table 814. Alternatively, state of charge analyzer 816 may compare the statistical parameter against a energy device profile 832. As such, the energy device profile 832 may derive an expected value based on one, or a plurality, of previously captured statistical parameters. For example, if the signal parameter 830 is a statistical parameter based on successive received signals 810, on the $100^{th}$ cycle of the energy device, the expected value within the energy device profile 832 may be based on a difference in similar statistical parameters (i.e. similar state of charge, etc) derived during the $10^{th}$ and $50^{th}$ cycle. As such, the difference between the expected value of the energy device profile 832 and the statistical parameter-based signal parameter 830 may indicate state of charge. State of charge analyzer 816 may take advantage of effect of delay in open circuit voltage stabilization after the current is stopped. It is suggested that the delay in voltage stabilization is due to ions transport from inside the particles to outside the particles within the energy device. This ion transport includes both solid state diffusion and electronic connectivity between the particles and the current collector, and thus can be a measure of health of the energy device. Thus by successive measurements of Signal Strength as discussed herein, and comparing the values of measured "signal strengths" to expected values (e.g within the lookup table 814 or energy device profile 832) the state of charge may be estimated.

State of health analyzer 820 may include transitory and/or non-transitory computer readable instructions (such as software, hardware, firmware, or a combination thereof) that, when executed by processor 802, operate to analyze signal parameter 830 and lookup table 814 to determine the state of health of an energy device. State of health of an energy device may indicate a non-optimal internal resistance within the energy device. For example, state of health analyzer 820 may analyze signal parameter 830, at a known state of charge, and compare such signal parameter 830 to look up table to determine if the internal resistance is optimal. Referring to the values of FIG. 9, for example, assume a fully charged energy device, the external short resistance 107 is 0.35 Ohms, and the short distance is 3 cm, and the signal parameter 830 returns a value that at 1.4245 V. This indicates that the internal resistance of the energy device is as expected and thus the energy device has an optimal state of health. However, if the signal parameter 830 returns a value of 1.524 V, then that means that the internal resistance of the battery is lower than optimal and, for example, caused by an internal short within the energy device. Furthermore, if the signal parameter 830 returns a value of 1.213 V, then that means that the internal resistance of the battery is higher than optimal and, for example, caused by energy device that has a degraded life-span.

In embodiments, state of health analyzer 820 may further characterize a type of short. Again taking the assumption, referring to FIG. 9 values, that the external short resistance 107 is 0.35 Ohms, and the short distance is 3 cm, and the signal parameter 830 returns a value that at 1.524 V. This means that there is some level of short internal to the energy device because the total resistance value (i.e. internal resistance of the energy device plus known, predetermined external resistance 107) has gone down and thereby the emitted change in electromagnetic field 120 has a larger value. The difference between the expected total resistance value and the actual total resistance value indicates the type of short. Thus, if the difference is at or below a hard-short type threshold, dependent on the configuration of the energy device (e.g. optimal internal resistance, type, model, manufacture, etc.), then state of health analyzer 820 may determine a hard short. However, if the difference is above the hard-short type threshold but below the soft-type threshold, then state of health analyzer 820 may determine a soft short.

In embodiments, state of health analyzer 820 may be based on a signal parameter 830 that is a statistical parameter. For example, the mean, standard deviation, and/or variance may be determined by signal analyzer 812 based on a series of received signal 810. Particularly, in embodiments the standard deviation and/or variance may be analyzed to determine state of health. State of health analyzer 820 may then compare the statistical parameter to lookup table 814 to determine if the measured statistical parameter is within a given threshold from the expected value within the lookup table 814. Alternatively, state of health analyzer 820 may compare the statistical parameter against an energy device profile 832. As such, the energy device profile 832 may derive an expected value based on one, or a plurality, of previously captured statistical parameters. For example, if the signal parameter 830 is a statistical parameter based on successive received signals 810, on the $100^{th}$ cycle of the energy device, the expected value within the energy device profile 832 may be based on a difference in similar statistical parameters (i.e. similar state of charge, etc) derived during the $10^{th}$ and $50^{th}$ cycle. As such, the difference between the expected value of the energy device profile 832 and the statistical parameter-based signal parameter 830 may indicate state of health. State of health analyzer 820 may take advantage of effect of delay in open circuit voltage stabilization after the current is stopped. It is suggested that the delay in voltage stabilization is due to ions transport from inside the particles to outside the particles within the energy device. This ion transport includes both solid state diffusion and electronic connectivity between the particles and the current collector, and thus can be a measure of health of the energy device. Thus by successive measurements of Signal Strength as discussed herein, and comparing the values of measured "signal strengths" to expected values (e.g within the lookup table 814 or energy device profile 832) the state of charge may be estimated.

Device operation manager 822 may include transitory and/or non-transitory computer readable instructions (such as software, hardware, firmware, or a combination thereof) that, when executed by processor 802, operate to analyze the findings of one or both of state of charge analyzer 816 and state of health analyzer 820 to generate configuration output 824.

In embodiments, the charge level identified by state of charge analyzer 816 may be utilized by device operation manager 822 to generate configuration output 824 indicating to enter a fast charging mode for the associated energy device. For example, if the internal resistance, impedance or other characteristic is exceeds expectation, then the configuration output may indicate a fast charge rate. In embodiments, the charge level identified by state of charge analyzer 816 may be utilized by device operation manager 822 to generate configuration output 824 indicating to enter a normal charging mode for the associated energy device, for example when the characteristic is similar to the expected value. In embodiments, the charge level identified by state of charge analyzer 816 may be utilized by device operation manager 822 to generate configuration output 824 indicating to enter a slow charging mode for the associated energy device, for example when the characteristic is not commensurate with the expected value.

In embodiments, the state of health identified by state of health analyzer 820 may be utilized by device operation manager 822 to generate configuration output 824 to alter the connectivity of a given energy device, for example by bypassing, or disconnecting, the given energy device. As an example, if a hard short is identified, configuration output 824 may be generated controlling a switch that disconnects or bypasses the given energy device such that the given energy device does not impede overall operation of the system using such given energy device. In embodiments, instead of, or additionally to, bypassing and/or disconnecting the given energy device, the configuration output 824 based on the state of health analyzer 820 may include a recommended replacement date for the given energy device. For example, if the difference between the expected total resistance value and the actual total resistance value, as discussed above, is not above a critical life-span threshold, then device operation manager 822 may consult lookup table 814 to identify when the energy device is expected to fail and thus identify a recommended replacement date.

In embodiments, the state of health and state of charge may be utilized by device operation manager 822 to generate configuration output 824 that identifies where a short occurs. For example, if device operation manager 822 is utilized with a sensor that senses change in electromagnetic field from multiple energy devices, such as shown in FIGS. 5-7, device operation manager 822 may utilize lookup table 814 to identify the location of the short. Because lookup table 814 indicates the parameter value at a plurality of distances (for example, distances 904 in FIG. 9), device operation manager 822 may analyze the signal parameters 830 using triangulation to identify the specific energy device at which the electrical short occurred. Therefore, this specific energy device may then be bypassed or disconnected to improve the overall efficiency of the energy unit or system.

It should be appreciated that the analysis performed by various aspects fo the characteristic monitor 800, including the signal analyzer 812, state of charge analyzer 816, state of health analyzer 820, and device operation manager 822 may include additional sensed data about the energy device, system, or unit being monitored. For example, one or more of voltage between terminals of the energy device, system, or unit, current between terminals of the energy device, system, or unit, and temperature of the energy device (including internal and/or surface temperature) could be utilized to make a determination about a characteristic. As such, the present embodiments provided another level of safety on top of prior energy device management systems—particularly one that is capable of making a characteristic determination in a much faster manner based on instantaneous, integral, or statistical analysis based signal parameters.

It should be appreciated that one or more of the short generator, sensor, and characteristic monitors discussed above may be implemented in either digital or analog form.

Figure 12:
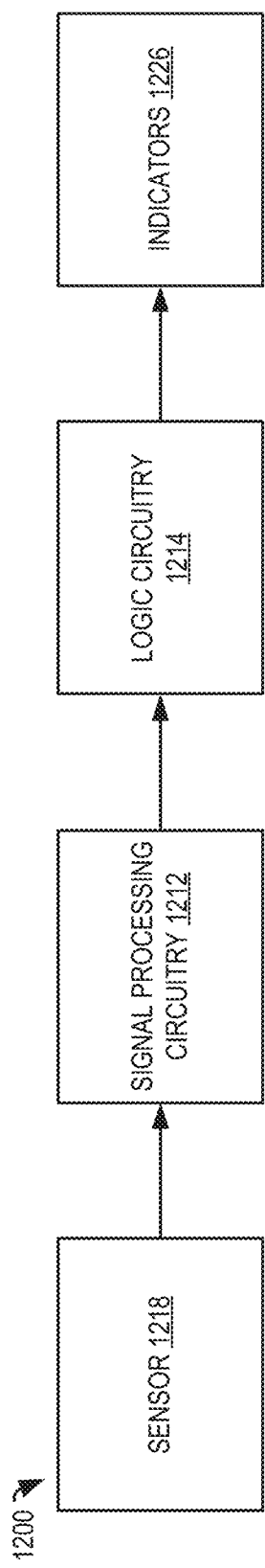
FIG. 12 depicts a block diagram indicating an analog system for monitoring characteristics of an energy device, in embodiments.

FIG. 12 depicts a block diagram indicating an analog system 1200 for monitoring characteristics of an energy device, in embodiments. Analog system 1200 is an example of system 100, discussed above. Analog system 1200 may include a sensor 1218, a signal processing circuitry 1212, a logic circuitry 1214, and an indicator 1226.

Sensor 1218 is similar to sensor 118, discussed above, and may include an electromagnetic coil, such as an electrical conductor such as a wire in the shape of a coil, spiral or helix, capable of sensing change in electromagnetic field from an external short.

Signals generated by sensor 1218 may be analyzed by signal processing circuitry 1212 which may include one or more of op-amps, and comparators, and associated circuitry such as resistors, capacitors, inductors, and/or voltage clamp diodes on the positive and negative sides of the sensor for isolating the sensor from signal surges, etc., used to generate a signal for logic circuitry 1214. Compared to characterization monitor 800 of FIG. 8, signal processing circuitry 1212 may be similar to signal analyzer 812 in function—namely that signal processing circuitry 1212 identifies a signal parameter of the signal generated by sensor 1218. In embodiments, signal processing circuitry 1212 may include one or more potentiometers for setting the threshold values utilized within signal processing circuitry 1212. These potentiometers may or may not be accessible via a housing of the analog system 1200 such that the threshold values are changeable during operation of system 1200. For example, the threshold values may be desired to be changed based on the specific battery type, make, model, etc. being analyzed. the threshold values may further be changed to reduce false positives detected using system 1200. Moreover, the potentiometers may be utilized to set the thresholds at symmetric distances from the half value of the input voltage (Vcc/2). To maintain symmetry between the positive and negative thresholds, they must be set equidistant from the DC bias point using Eq. 2, below:

$$V_{bias} - V_{low} = V_{high} - V_{bias} \quad \text{(Eq. 2)}.$$

In embodiments, the potentiometer controls only one of the $V_{high}$ or $V_{low}$ to control the bias point. In embodiments, the system may include an indicator that sets off if the bias is set incorrectly based on the potentiometer settings.

Logic circuitry 1214 may include one or more of flip-flop logic circuitry, comparators, and associated circuitry such as resistors, capacitors, and/or inductors, etc. Compared to characterization monitor 800 of FIG. 8, logic circuitry 1214 may be similar to device operation manager 822 in function—namely that it analyzes the processed signal from signal processing circuitry 1212 to identify a configuration output 1224 (e.g. analogous to configuration output 824) for driving indicator 1226. Logic circuitry 1214 may be configured based on the specific energy device being tested. As such, it should be appreciated that logic circuitry 1214 may implement the functionality as discussed above with respect to one or more of lookup table 814, energy device profile 832, state of charge analyzer 816, and state of health analyzer 820.

Indicator 1226 may be one or more lights, such as an LED, etc, and associated meaning such that the user may understand the output from logic circuitry 1214. For example, indicator 1226 may include three LED lights that respectively emit according to a fully charged, partially charged, low charged, indication from logic circuitry 1214. Alternatively, or in addition thereto, indicator 1226 may indicate a charging speed, such as fast, slow, or normal, without departing from the scope hereof.

Figure 13:
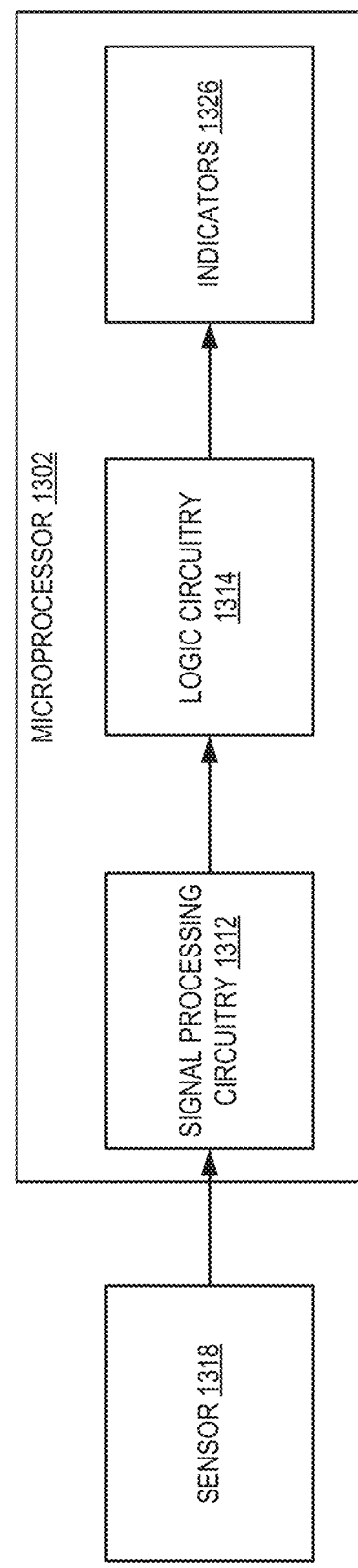
FIG. 13 depicts a block diagram indicating a digital system for monitoring characteristics of an energy device, in embodiments.

FIG. 13 depicts a block diagram indicating a digital system 1300 for monitoring characteristics of an energy device, in embodiments. Digital system 1300 is similar to analog system 1200 except that one or more of signal processing circuitry 1312, logic circuitry 1214, and indicators 1326 (which are respectively similar to signal processing circuitry 1212, logic circuitry 1214, and indicators 1226), are implemented using one or more microprocessors 1302.

Sensor 1318 is similar to sensor 118, discussed above, and may include an electromagnetic coil, such as an electrical conductor such as a wire in the shape of a coil, spiral or helix, capable of sensing change in electromagnetic field from an external short.

Signal processing circuitry 1312 may include an ADC capable of sampling speeds in the range of 0.01-100 MSPS. In embodiments, the sampling speed is selected such that approximately 2 samples per peak of the received signal are generated. These sampling speeds may provide increased sensor sampling such that accurate signal parameters may be obtained. If the sensor 1312 is located away from a characterization monitor (such as shown in FIGS. 1, 3, 5, and 6, discussed above), then the signal processing circuitry 1312 may be associated with a first microprocessor 1302, and the logic circuitry 1314 and indicators 1326 may be associated with one or more second microprocessors. Signal processing circuitry 1312 may implement the functionality of one or more of signal analyzer 812 and short generation output 826, discussed above with reference to FIG. 8.

Logic circuitry 1314 may include any one or more of the signal analyzer 812, state of charge analyzer 816, state of health analyzer 820, and device operation manager 822 as discussed above. If located separately from signal processing circuitry 1312, logic circuitry 1314 may include communications interface 804 as discussed above for receiving a received signal, such as received signal 810.

Indicators 1326 may include visual, audio, or tactile indicators such as LED lights, speakers, a display, and a vibrator for indicating any information based on a configuration output such as configuration output 824, discussed above.

In either the analog system 1200, or digital systems 1300 discussed above, it should be appreciated that various signal traces in the circuitry may be isolated from the sensor such that data transmission thereon does not interfere with the sensor. For example, signal traces may occur in a different plane of a printed circuit board than the sensor. Moreover, certain embodiments utilize both analog components of system 1200 and digital components of system 1300. In such embodiments, there may be a switching system for selecting the analog or digital components.

Figure 14:
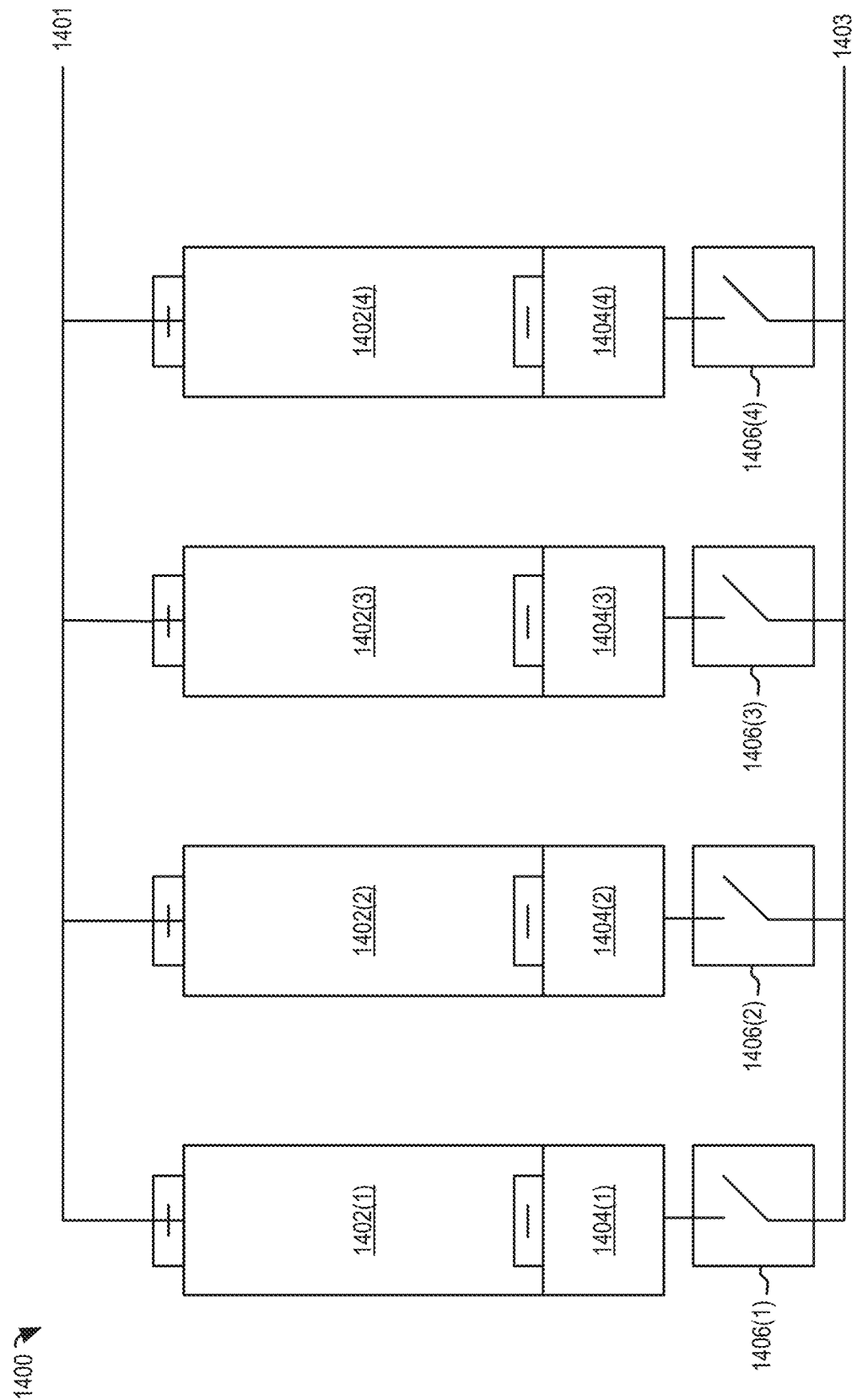
FIG. 14 depicts an exemplary energy unit having a plurality of energy devices, in embodiments.

FIG. 14 depicts an exemplary energy unit 1400 having a plurality of energy devices 1402. Each energy device 1402 is coupled to each other in parallel along a positive voltage line 1401 and a negative voltage line 1403 and includes a short generator 1404 located proximate thereto. Short generator 1404 may be coupled on a first surface of the energy device 1402. Although shown on the end of the energy device 1402, any short generator 1404 may be located on the side or at a distance away from the energy device 1402 without departing from the scope hereof. In embodiments, the short generator 1402 is sized and shaped to match the size and shape of a surface of the energy device 1402.

Each energy device 1402 is an example of energy device 102 discussed above. Each short generator 1404 is an example of short generator 104 discussed above. Namely each short generator 1404 may include a sensor (e.g. sensor 118) and a controller (e.g. controller 118) for creating external short (e.g. external short 105) across a known, predetermined external resistance (e.g. external resistance 107).

Each energy device 1402 further includes a disconnect switch 1406. Disconnect switch 1406 operates to disconnect a given energy device 1402 if it is determined that the state of charge or state of health is non-optimal for operation of energy unit 1400. Each disconnect switch 1406 may be controlled via a configuration output signal (e.g. configuration output signal 824) generated by a characteristic monitor (e.g. characteristic monitor 800). In embodiments, each disconnect switch 1406 is controlled via a control signal transmitted on one or both of positive voltage line 1401 and negative voltage line 1403. For example, in such embodiments the characteristic monitor (e.g. characteristic monitor 800) may include a communications interface (e.g. communications interface 804) capable of DC data modulation on one or both of positive voltage line 1401 and negative voltage line 1403. In embodiments, each disconnect switch 1406 is controlled via a wireless or wired transmission including a control signal for controlling the disconnect switch 1406.

Detection of shorts in individual ones of energy devices 1402 provides advantages because in parallel connections the voltage of all the energy devices is identical. Thus, if one of the energy devices 1402 makes a short circuit, for example by internal dendrite formation and short, then it can't be detected by monitoring the voltage of the energy devices 1402 and results in either fire and explosion, or at the best case it drains other energy devices 1402 in the parallel connection. System 1400 doesn't depend on temperature because once the temperature goes beyond the safe range there is not much that can be done to prevent damage. System 1400 includes practical and lest costly detectors that may detect internal and/or external shorts even when the detectors are away from the shorted cell. In system 1400, any shorted energy device 1402 in a parallel connection can simply be removed from the circuit and thus the rest of the energy unit 1400 and circuit can continue performing. The PCB device such as the short detector 1404, including the short detector and the switch, can be physically attached to the energy devices 1402 (though the sort detector does not need not be electronically attached to the energy devices 1402).

The short detector 1404 may have any shape such as the cross section of the energy devices 1402, as an example for 18650 cells, the short detector 1404 may have a diameter of about 18 mm and can be physically placed on bottom of each of the energy devices 1402. For large prismatic energy devices 1402, the short detector 1404 may be placed on any sides of a cell. The short detector and the switch may be physically connected or can be disconnected but must be in communication.

System 1400 may make energy units much safer as it is a solution to detect and react to a short or non-optimal characteristic when the energy devices are in parallel connection.

Further, if the energy devices 1402 in parallel connections are in close distance, each short detector 1404 of each energy device 1402 may be able to also react to the shorts in other energy devices 1402. Thus, in embodiments each short detector 1404 may communicate with one another, or at least those switches 1406 having an associated energy device 1402 that the given short detector 1404 may monitor. For example, each signal from a cell short detector 1404 may be compared to the one or two neighbor energy devices 1402 in the parallel connections, the start time and strength of the signal determines the shorted energy device 1402.

Figure 15:
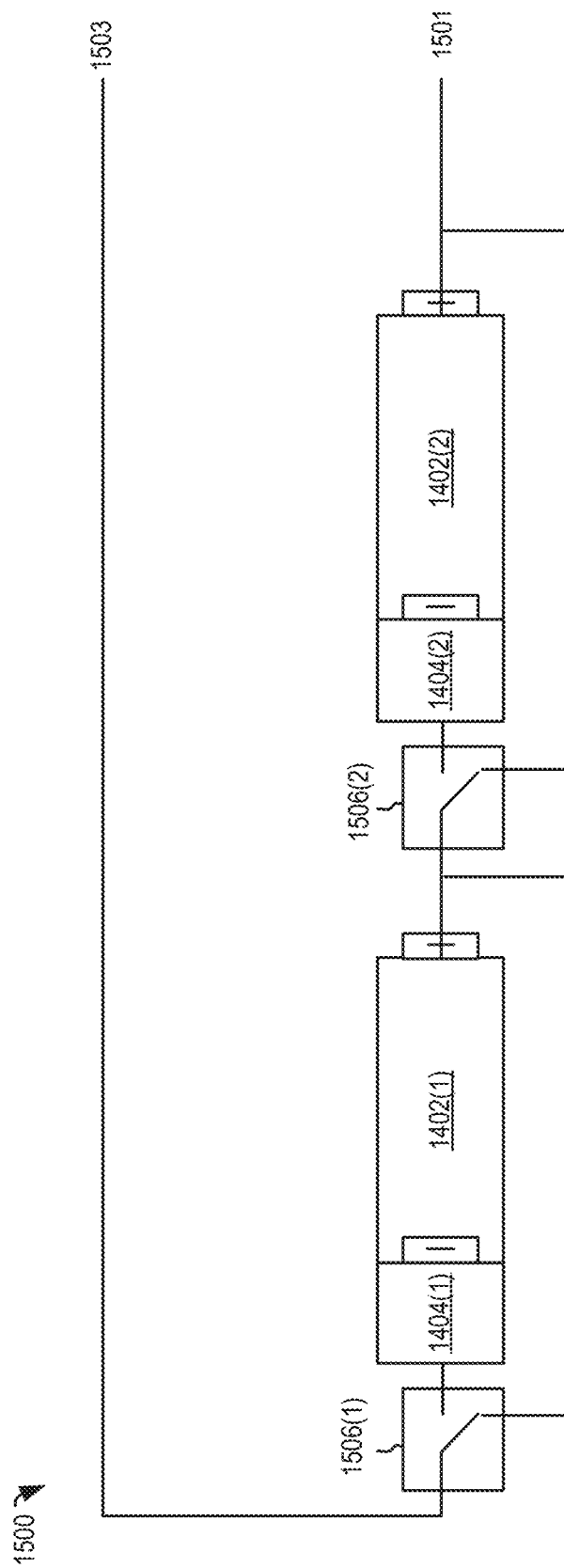
FIG. 15 depicts an exemplary energy unit having a plurality of energy devices, in embodiments.

FIG. 15 depicts an exemplary energy unit 1500 having a plurality of energy devices 1502. Each energy device 1502 is coupled to each other in series along a positive voltage line 1501 and a negative voltage line 1503 and includes a short generator 1504 located proximate thereto. Short generator 1504 is similar to short generator 1404 and may include any of the above discussed features thereof.

Each energy device 1502 is an example of energy device 102 discussed above. Each energy device 1502 further includes a bypass switch 1506. Bypass switch 1506 operates to bypass a given energy device 1502 if it is determined that the state of charge or state of health is non-optimal for operation of energy unit 1500. Each bypass switch 1506 may be controlled via a configuration output signal (e.g. configuration output signal 824) generated by a characteristic monitor (e.g. characteristic monitor 800). In embodiments, each bypass switch 1506 is controlled via a control signal transmitted on one or both of positive voltage line 1501 and negative voltage line 1503. For example, in such embodiments the characteristic monitor (e.g. characteristic monitor 800) may include a communications interface (e.g. communications interface 804) capable of DC data modulation on one or both of positive voltage line 1501 and negative voltage line 1503. In embodiments, each bypass switch 1506 is controlled via a wireless or wired transmission including a control signal for controlling the disconnect switch 1506.

In series connections such as system 1500, overcharging or under-discharging an energy device may be a major problem. It is desired that all the energy devices 1502 perform similarly, however a potentially weak energy device in series connection undergoes the same charge and current as all the energy devices 1502, so it may reach over-charged or under-discharged condition without any alerts. Embodiments that transmit data and commands over the DC-power wires, such as positive line 1501 and negative line 1503 already connect the cells and therefore eliminate additional wiring and/or hardware required for data transmission. In addition, a short detector 1504 including the communications hardware-software and a switch 1506 may greatly simplify the management of the energy unit 1500. The switch 1506 may result in bypassing an energy device 1502, when its voltage is significantly different from the two neighbor energy devices 1502, and connect it back only when the voltages are comparable. Therefore, the characteristic monitor (e.g. characteristic monitor 800) used with system 1500 may measure the voltage of the energy device and compare it with the voltage of the next or previous energy device, or both.

Figure 16:
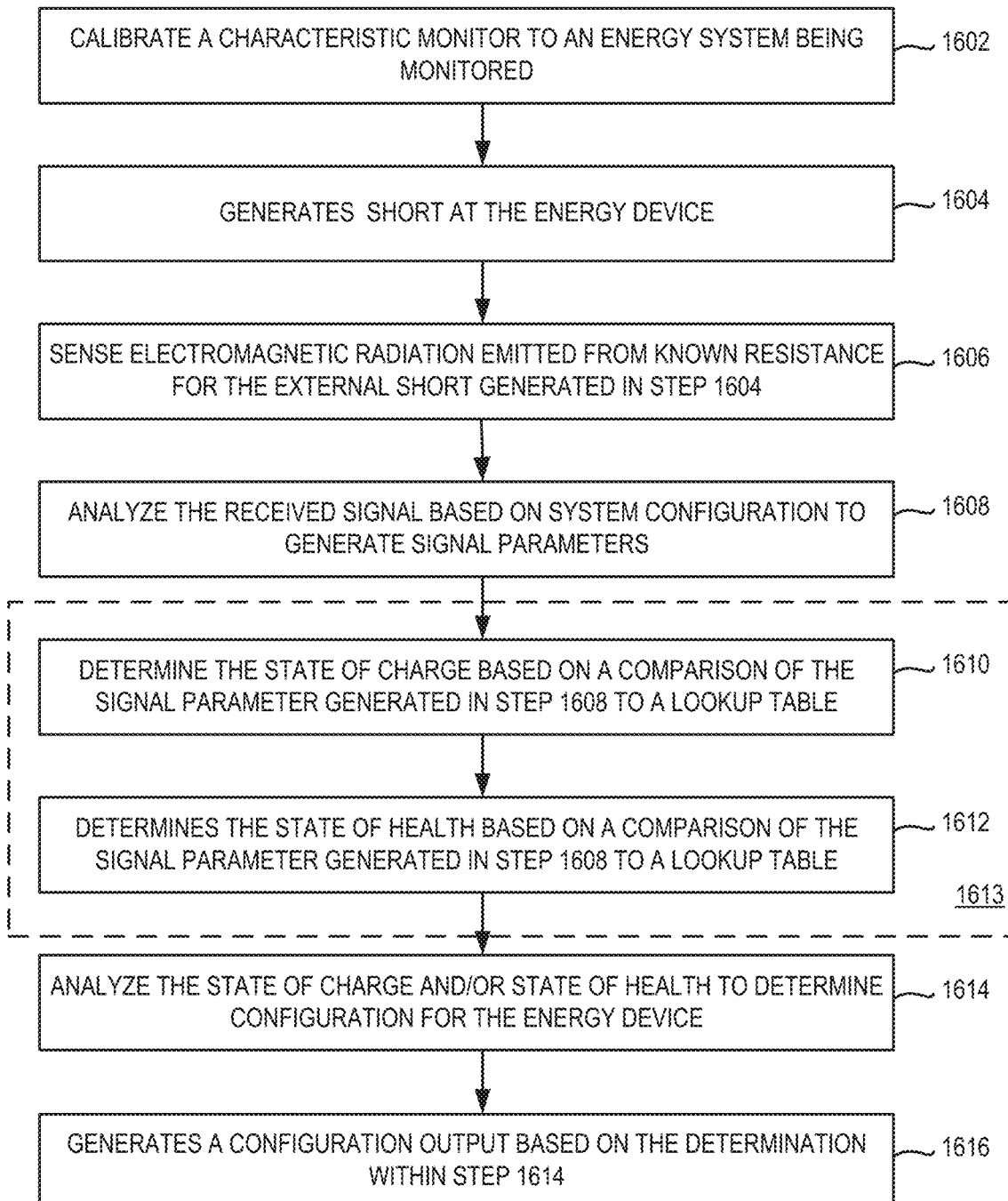
FIG. 16 depicts a method for monitoring characteristics of an energy unit, in embodiments.

FIG. 16 depicts a method 1600 for monitoring characteristics of an energy unit, in embodiments. Method 1600 may be implemented using any of the systems discussed above in FIGS. 1-15.

In step 1602, method 1600 calibrates a characteristic monitor to an energy system being monitored. In one example of step 1602, characteristic monitor 108 is calibrated to energy device 102. In another example of step 1602, characteristic monitor 306 is calibrated to energy unit 302. In another example of step 1602, characteristic monitor 406 is calibrated to energy unit 402. In another example of step 1602, characteristic monitor 506 is calibrated to energy unit 502. In another example of step 1602, characteristic monitor 606 is calibrated to energy unit 602. In another example of step 1602, characteristic monitor 706 is calibrated to energy unit 702. In another example of step 1602, characteristic monitor 800 is calibrated to any of the systems discussed in FIGS. 1-7, and 12-15. Additional exemplary details of step 1602 are discussed below.

In step 1604, method 1600 generates a short at the energy device. In one example of step 1604, external short 105 is generated at energy device 102 as discussed above with regards to FIGS. 1-7, and 12-15. In another example of step 1604, characteristic monitor 800 generates a short generation output 826 which is then transmitted via communications interface 804 to any of controllers 116, 516 as short generation signal 124. Controllers 116, 516 then control short generation switch 114 to generate external short 105. Short generation output 826 may be transmitted via wired or wireless protocols as discussed above with regards to FIG. 8.

In step 1606, method 1600 senses change in electromagnetic field emitted from known resistance for the external short generated in step 1604. In one example of operation of step 1606, any of sensors 118, 218, 518, 718, 1218 and 1318 monitor change in electromagnetic field 120 generated from external short 105, as discussed above with regards to FIGS. 1-7, and 12-15 and generates received signal 810, as discussed with regards to FIG. 8.

In step 1608, method 1600 analyzes the received signal based on system configuration to generate signal parameters. In one example of step 1600, signal analyzer 812 analyzes received signal 810 based on system configuration information 828 to generate signal parameter 830 as discussed above with regards to FIG. 8. In embodiments, the signal parameter generated in step 1608 may include one or more instantaneous parameters chosen from the group of parameters including: maximum power, maximum voltage square, maximum voltage, maximum change in voltage, maximum current, maximum current square, maximum change in current, full-width voltage at half maximum and current at half maximum. or other instantaneous quantity or parameter at a given time. In embodiments, the signal parameter generated in step 1608 may include one or more integrated parameter chosen from the group of: total absolute energy and total absolute coulomb measured accumulatively over a period of time.

In step 1610, method 1600 determines the state of charge based on a comparison of the signal parameter generated in step 1608 to a lookup table. In one example of step 1610, state of charge analyzer 816 determines the state of charge of energy device 102 based upon lookup table 814 and signal parameter 830. As an example referring to the values of FIG. 9, if the external short resistance 107 is 0.35 Ohms, the short distance is 3 cm, and the signal parameter 830 returns a value that at 1.4245 V, or within a predefined threshold thereof, then it may be determined in step 1610 that the energy device is fully charged. If the signal parameter 830 indicates a value that is not equal to 1.4245 V, or is outside of a predefined threshold thereof, then a mathematical calculation may be used, in step 1610, to determine the charge level of the energy device.

In step 1612, method 1600 determines the state of health based on a comparison of the signal parameter generated in step 1608 to a lookup table. For example, state of health analyzer 820 may analyze signal parameter 830, at a known state of charge, and compare such signal parameter 830 to look up table to determine if the internal resistance is optimal. Referring to the values of FIG. 9, for example, assume a fully charged energy device, the external short resistance 107 is 0.35 Ohms, and the short distance is 3 cm, and the signal parameter 830 returns a value that at 1.4245 V. This is determined in step 1612 that the internal resistance of the energy device is as expected and thus the energy device has an optimal state of health. However, if the signal parameter 830 returns a value of 1.524 V, then that it is determined in step 1612 that the internal resistance of the battery is lower than optimal and, for example, caused by an internal short within the energy device. Furthermore, if the signal parameter 830 returns a value of 1.213 V, then that means that the internal resistance of the battery is higher than optimal and, for example, caused by energy device that has a degraded life-span.

In embodiments of step 1612, state of health analyzer 820 may further characterize a type of short. Again taking the assumption, referring to FIG. 9 values, that the external short resistance 107 is 0.35 Ohms, and the short distance is 3 cm, and the signal parameter 830 returns a value that at 1.524 V. It may be determined in step 1612 that there is some level of short internal to the energy device because the total resistance value (i.e. internal resistance of the energy device plus known, predetermined external resistance 107) has gone down and thereby the change in electromagnetic field 120 has a larger value. The difference between the expected total resistance value and the actual total resistance value may indicate the type of short. Thus, if the difference is at or below a hard-short type threshold, dependent on the configuration of the energy device (e.g. optimal internal resistance, type, model, manufacture, etc.), then state of health analyzer 820 may determine in step 1612 a hard short. However, if the difference is above the hard-short type threshold but below the soft-type threshold, then state of health analyzer 820 may determine a soft short in step 1612.

Steps 1610 and 1612 may be sub-steps of a general step 1613 included in method 1600 for generating a characterization of the energy device.

In step 1614, method 1600 analyzes the state of charge and/or state of health to determine configuration for the energy device. In one example of step 1614, device operation manager 822 analyzes one or both of state of charge and state of health to determine configuration for the energy device 102.

In embodiments of step 1614, the charge level identified by state of charge analyzer 816 may be utilized by device operation manager 822 to generate configuration output 824 indicating to enter a fast charging mode for the associated energy device. In embodiments of step 1614, the charge level identified by state of charge analyzer 816 may be utilized by device operation manager 822 to generate configuration output 824 indicating to enter a normal charging mode for the associated energy device. In embodiments of step 1614, the charge level identified by state of charge analyzer 816 may be utilized by device operation manager 822 to generate configuration output 824 indicating to enter a slow charging mode for the associated energy device.

In embodiments of step 1614, the state of health identified by state of health analyzer 820 may be utilized by device operation manager 822 to generate configuration output 824 to alter the connectivity of a given energy device, for example by bypassing, or disconnecting, the given energy device. As an example, if a hard short is identified in step 1612, configuration output 824 may be generated controlling a switch that disconnects or bypasses the given energy device such that the given energy device does not impede overall operation of the system using such given energy device.

In embodiments of step 1614, instead of, or additionally to, bypassing and/or disconnecting the given energy device, the configuration output 824 based on the state of health analyzer 820 may include a recommended replacement date for the given energy device. For example, if the difference between the expected total resistance value and the actual total resistance value, as discussed above, is not above a critical life-span threshold, then device operation manager 822 may consult lookup table 814 to identify when the energy device is expected to fail and thus identify a recommended replacement date.

In embodiments of step 1614, the state of health and state of charge may be utilized by device operation manager 822 to generate configuration output 824 that identifies where a short occurs. For example, if device operation manager 822 is utilized with a sensor that senses change in electromagnetic field from multiple energy devices, such as shown in FIGS. 5-7 and 14-15, device operation manager 822 may utilize lookup table 814 to identify the location of the short. Because lookup table 814 indicates the parameter value at a plurality of distances (for example, distances 904 in FIG. 9), device operation manager 822 may analyze the signal parameters 830 using triangulation to identify the specific energy device at which the electrical short occurred. Therefore, this specific energy device may then be bypassed or disconnected in step 1614 to improve the overall efficiency of the energy unit or system.

In step 1616, method 1600 generates a configuration output based on the determination within step 1614. In one example of step 1616, characterization monitor 800 outputs configuration output 824 to one or more of set a charging speed (e.g. fast, normal, slow), bypass or disconnect an energy device, and recommend a replacement time for the energy device.

Figure 17:
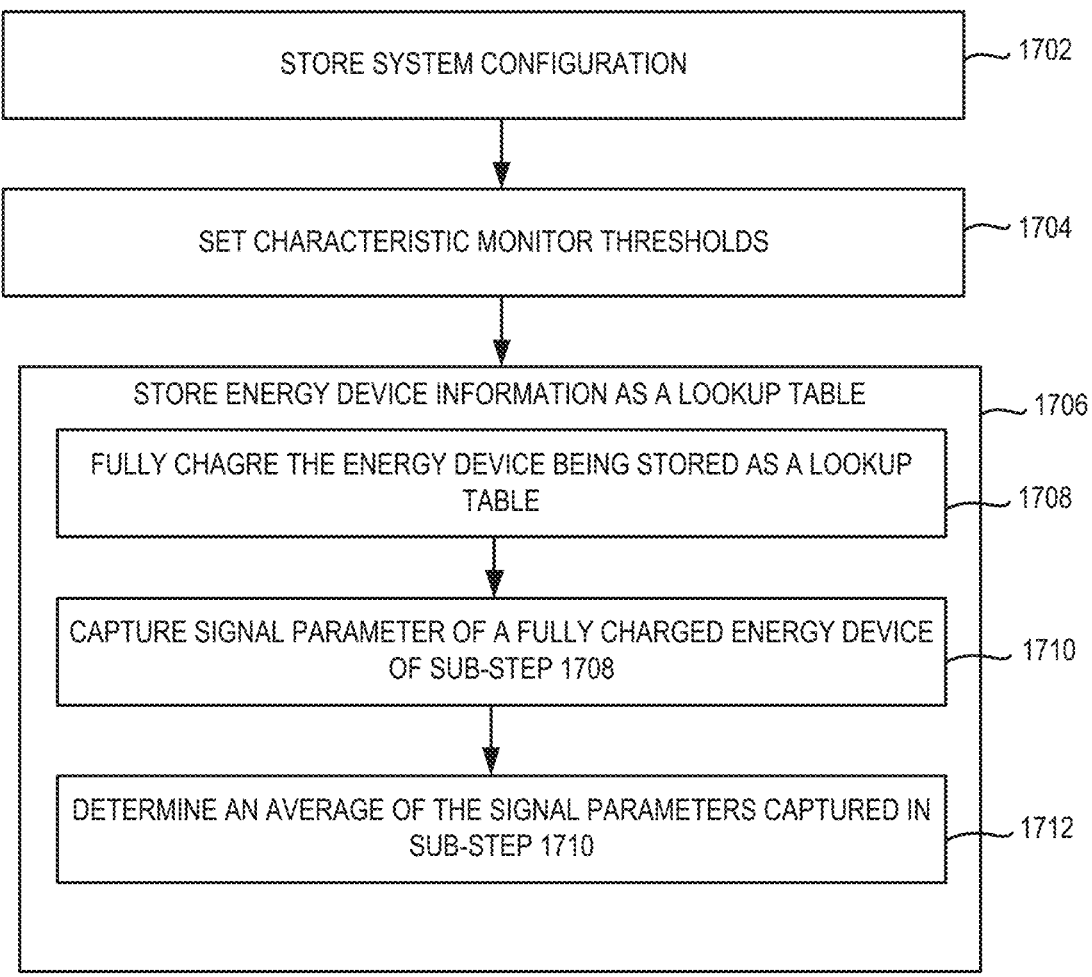
FIG. 17 depicts a method for calibrating a characteristic monitor to an energy system being monitored, in embodiments.

FIG. 17 depicts a method 1700 for calibrating a characteristic monitor to an energy system being monitored, in embodiments. Method 1700 is for example implemented using any of the characteristic monitors 106, 306, 406, 506, 606, 706, 800, etc. as discussed above with regards to FIGS. 1-8, and 12-15. FIG. 1700 is an example of step 1602 of method 1600.

In step 1702, method 1700 stores system configuration. In one example of step 1702, system configuration information 828 is stored in memory 806, for example including one or more of: knowledge of the sensor (e.g. 118, 218, 518, 718, 818) used to acquire received signal 810, the known, predetermined resistance (e.g. resistance 107) of the external short (e.g. external short 105), the known distance between the sensor and the short (e.g. distance 126, 226), etc.

In step 1704, method 1700 sets characteristic monitor thresholds. In one example of step 1704, potentiometers are set to configure the threshold values utilized within signal processing circuitry 1212. These potentiometers may or may not be accessible via a housing of the analog system 1200 such that the threshold values are changeable during operation of system 1200. In examples, the threshold values may be desired to be changed based on the specific battery type, make, model, etc. being analyzed. The threshold values may further be changed to reduce false positives detected using system 1200. Moreover, the potentiometers may be utilized to set the thresholds at symmetric distances from the half value of the input voltage (Vcc/2). To maintain symmetry between the positive and negative thresholds, they must be set equidistant from the DC bias point using Eq. 3, below:

$$V_{bias} - V_{low} = V_{high} - V_{bias} \qquad (Eq. 3).$$

In embodiments of step 1702, the potentiometer controls only one of the $V_{high}$ or $V_{low}$ to control the bias point. In embodiments of step 1702, an indicator may indicate if the bias is set incorrectly based on the potentiometer settings and thereby the characteristic monitor is set correctly.

In step 1706, method 1700 stores expected energy device parameters as a lookup table. In one example of step 1706, lookup table 814 is generated. Step 1706 may include sub-steps 1708, 1710, and 1712.

In sub-step 1708, method 1700 fully charges the energy device being stored as lookup table. In one example of sub-step 1708, energy device 102 is fully charged.

In sub-step 1710, method 1700 captures signal parameter of a fully charged energy device of sub-step 1708. In one example of step 1700, a signal parameter 830 is generated for a given energy device 102. Sub-step 1710 may repeat for a given number of times and at a plurality of distances between the sensor and the external short. In one example of sub-step 1710, four trials are performed on fully charged energy device to generate the values shown in FIG. 10.

In sub-step 1712, method 1700 determines an average of the signal parameters captured in sub-step 1710. In one example of step 1700, lookup table 814 is generated based on an average of the parameters detected in step 1710. For example, values 902 are generated based on the values of FIG. 10.

Figure 18:
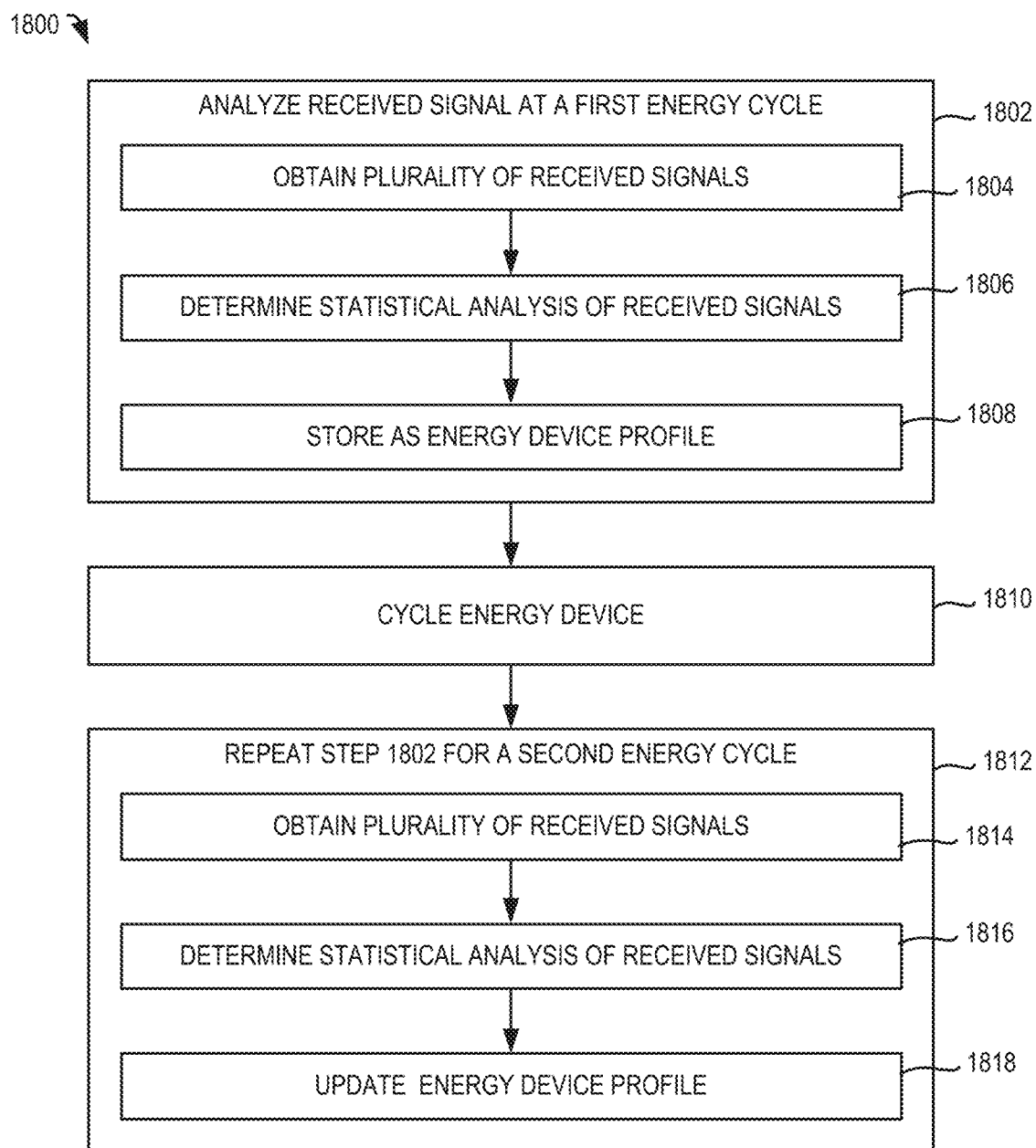
FIG. 18 depicts an exemplary method for generating an energy device profile, in embodiments.

FIG. 18 depicts an exemplary method 1800 for generating an energy device profile, in embodiments. Method 1800 may be performed, for example, using characteristic monitor 800 of FIG. 8 to generate energy device profile 832 therein. Method 1800 may replace, or be performed in addition to, step 1706 of method 1700. Method 1800 may be an example of step 1602 of method 1600.

In step 1802, method 1800 analyzes received signal at a first energy cycle. In one example of step 1802, signal analyzer 812 analyzes received signal 810 at a first energy cycle and stores such received signal 810 as energy device profile 832.

Step 1802 may include substeps 1804-1808, in embodiments. Particularly steps 1804-1808 are useful for generating a signal parameter 830 that is a statistical parameter. In sub-step 1804, method 1800 obtains a plurality of received signals. In one example of step 1804, a plurality of received signals 810 are received at a frequency of 2 kHz or less. The number of successive received signals 810 for a statistical parameter can be, for example, 2 to 10 times to provide enough data points for the statistical analysis. The duration of wait between each of these successive received signals may depend on the battery chemistry and type. As an example, the duration between successive received signals 810 may be between 1 millisecond and 1 minute.

In sub-step 1806, method 1800 determines statistical analysis of received signals 1806. In one example of sub-step 1806, method 1800 analyzes the plurality of received signals 810 from sub-step 1804 to determine a signal parameter 830 as a statistical parameter including one or more of mean, standard deviation, variance, and other statistical parameters.

In sub-step 1808, method 1800 stores the determined statistical analysis from sub-step 1806 as energy device profile. In one example of sub-step 1808, statistical parameter 830 is stored as energy device profile 832 within characteristic monitor 800.

In step 1810, method 1800 cycles energy device, system, or unit. Step 1810 may be a full cycle, multiple full cycles, or a partial cycle of the energy device, system, or unit (e.g. energy device 102). In one example of step 1810, energy device 102 is cycled for a given period of time, such as one cycle, or half cycle, or other portion of a cycle. As such, it should be appreciated that method 1800 may include cycling of a temporal or percentage of charge time. The duration of cycling between the two sets of successive measurements can be more than 1 second, more than 1 minute, more than 5 minutes, more 10 minutes or more than 20 minutes.

In step 1812, step 1802 is repeated for a second energy cycle. Step 1812 may include sub-steps 1814, 1816, and 1818 which are similar to sub-steps 1804, 1806, and 1808, respectively. However, in sub-step 1808, the energy device profile may be updated instead of stored for the first time.

Figure 19:
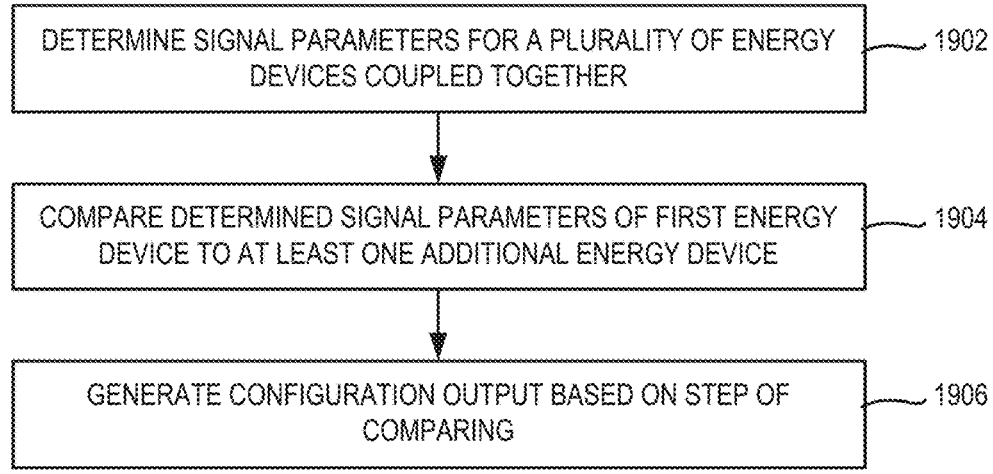
FIG. 19 depicts a method for balancing an energy unit or system having a plurality of energy devices, in embodiments.

FIG. 19 depicts a method 1900 for balancing an energy unit or system having a plurality of energy devices, in embodiments. Method 1900 may be performed by characteristic monitor 800 in an energy unit having a plurality of energy devices (e.g. energy device 102) in parallel or in series.

In step 1902, method 1900 determines signal parameters for the plurality of energy devices coupled together. In one example of step 1902, characteristic monitor 800, or a plurality of characteristic monitors 800 each coupled to a respective energy device, determines a plurality of signal parameters 830 for the given energy units. In embodiments, the determined signal parameters 830 may be an instantaneous, integrated, or statistical based parameter. Particularly, in embodiments, the signal parameters determined may be an instantaneous signal parameter 830 such as signal strength of the received signal. Particularly, in embodiments, the signal parameters determined may be a statistical-based signal parameter 830 such as signal strength of the received signal. For example, if the statistical based parameter for a given energy device is based on three received signals 810, The "$j^{th}$" reading of the signal strength of the "$j^{th}$" energy device may be shown by $S_{i,j}$. The "mean" value for the energy device "j" is thus $S_{mean\_Cj} = (S1\_Cj + S2\_Cj + S3\_Cj)/3$ The "variance" for the energy device "j" is thus:

$S_{varinace\_Cj} = (S1\_Cj - S_{mean\_}Cj)^2 + (S2\_Cj - S_{mean\_}Cj)^2 + (S3\_Cj - S_{mean\_}Cj)^2$ Similar equations can be used for various statistical analysis such as standard deviation, etc.

In step 1904, method 1900 compares the determined signal parameters for each energy device against each other. In one example of step 1904, signal analyzer 812 analyzes each signal parameter 830 for each respective energy device against each other. For example, signal analyzer 812 may determine a mean, a standard deviation, or a variance between the signal parameters 830 generated for each energy device. For example, assuming four energy devices, each obtaining three received signals 830, as discussed above with respect to step 1902, the mean for all energy devices may be:

$S_{mean\_}C = (S_{mean\_}C1 + S_{mean\_}C2 + S_{mean\_}C3 + S_{mean\_}C4)/4$

The variance for all energy devices may be:

$S_{variance\_}C = (S_{variance\_}C1 + S_{variance\_}C2 + S_{variance\_}C3 + S_{variance\_}C4)/4$.

Similar equations may be used for other statistical analysis such as standard deviation, etc.

In step 1906, method 1900 generates a configuration output based on the step of comparing (step 1904). In one embodiment of step 1904, device operation manager 822 analyzes the mean, standard deviation, or variance between a plurality of received signals from respective energy devices (from steps 1902, 1904) and generates configuration output 824. Particularly, for each of the plurality of energy devices, if the mean, standard deviation, or variance is above a given threshold, then the configuration output may bypass (if the energy devices are in series) or disconnect (if the energy devices are in parallel). For example, using the above discussed equations, an energy device "j" may be faulty when:

$$\left(\frac{S\operatorname{mean}\_C - S\operatorname{mean}\_Cj}{S\operatorname{mean}\_Cj}\right)^2 > \text{Th\_mean}$$

$$\text{Or if } \left(\frac{S_{variance\_}C - S_{variance\_}Cj}{S_{variance\_}Cj}\right)^2 > \text{Th\_variance}$$

where Th_mean, the threshold of mean, and Th_standard deviation, threshold of standard deviation are by the user based on the battery and the application.

Figure 20:
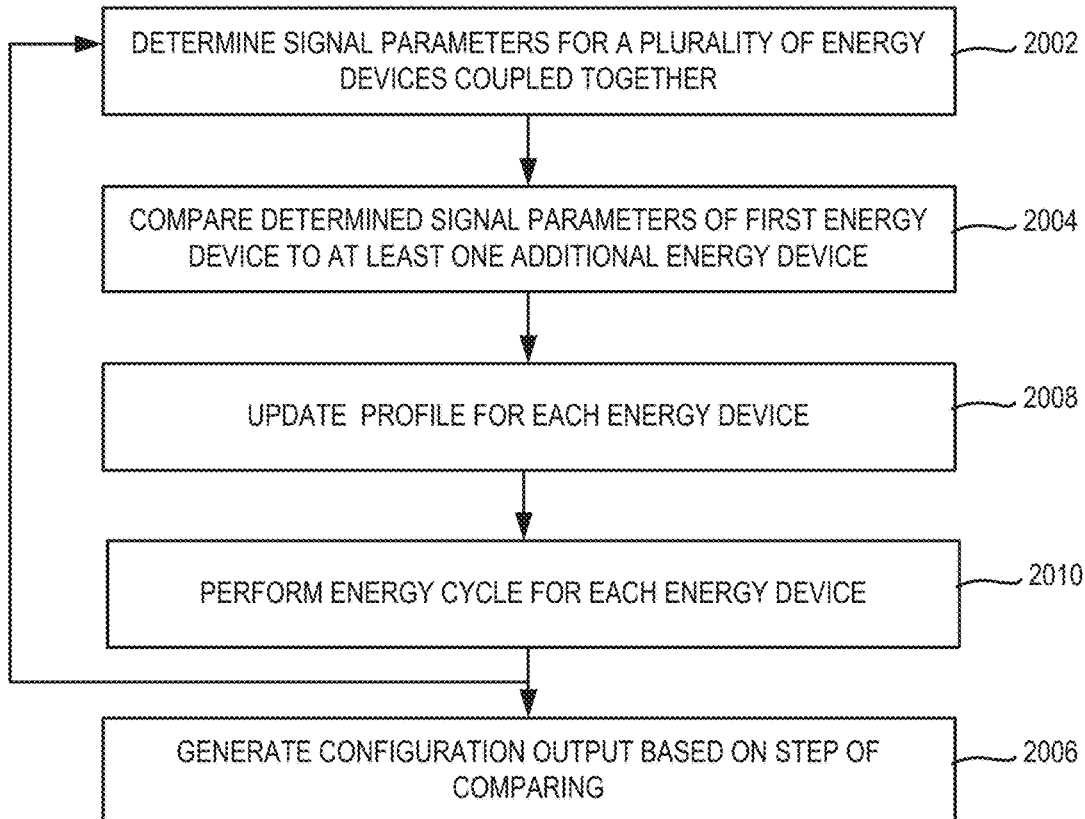
FIG. 20 depicts an exemplary method for battery life estimation.

FIG. 20 depicts an exemplary method 2000 for battery life estimation. Method 2000 may be performed by characteristic monitor 800 in an energy unit having a plurality of energy devices (e.g. energy device 102) in parallel or in series. Method 2000 may also be performed via a single energy device as well.

In method 2000, steps 2002, 2004, and 2006 may be identical to steps 1902, 1904, and 1906, respectively. If method 2000 is being performed only on a single energy device, then step 2004 may be skipped.

In step 2008, method 2000 updates an energy device profile for each respective energy device. Step 2008 may perform method 1800. In embodiments, step 2008 performs only steps 1812, including sub-steps 1814-1818 for each energy device. In embodiments of step 2008, energy device profile may generate an expected parameter value for a future energy cycle based on one or more previous energy cycles. For example, if the signal parameter is a statistical parameter based on successive received signals, on the $100^{th}$ cycle of each respective energy device, the expected value within the energy device profile may be based on a difference in similar statistical parameters (i.e. similar state of charge, etc) derived during the $10^{th}$ and $50^{th}$ cycle.

In step 2010, method 2000 performs an energy cycle for each energy device. Step 2010 may be a full cycle, multiple full cycles, or a partial cycle of the energy device, system, or unit (e.g. energy device 102). In one example of step 2010, energy device 102 is cycled for a given period of time, such as one cycle, or half cycle, or other portion of a cycle. As such, it should be appreciated that method 2000 may include cycling of a temporal or percentage of charge time. The duration of cycling between the two sets of successive measurements can be more than 1 second, more than 1 minute, more than 5 minutes, more 10 minutes or more than 20 minutes.

This series of steps then repeats to monitor energy device lifespan. At any time should step 2006 determine that the signal parameter is not as expected, based on the energy device profile, then a configuration output may be generated. By monitoring energy device profile, a gradual degradation of the energy device may be monitored and thereby an estimated replacement time may be output as the configuration output.

Figure 21:
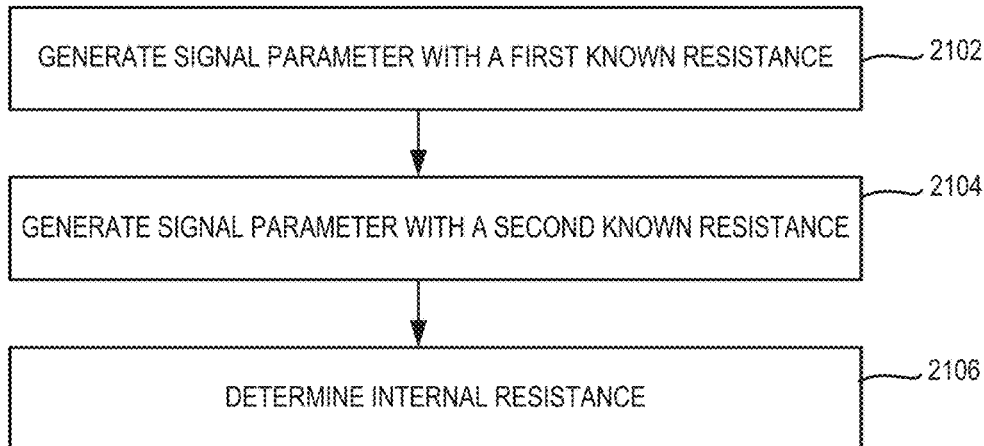
FIG. 21 depicts an exemplary method for estimating an internal resistance of an energy device.

FIG. 21 depicts an exemplary method 2100 for estimating an internal resistance of an energy device. Method 2100 may be performed using characteristic monitor 800 discussed above.

In step 2102, method 2100 generates a signal parameter based on a first known resistance. In one example of step 2102, characteristic monitor 800 outputs a short generation output 826 to control switch 114, via controller 116, to create an external short 105 across known resistance 107. The change in electromagnetic field 120 may be sensed by a sensor (e.g. sensor 118, 218, etc) represented as received signal 810. Received signal 810 may then be analyzed by signal analyzer 812 to determine signal parameter 830.

In step 2104, method 2100 generates a signal parameter based on a second known resistance. In one example of step 2104, characteristic monitor 800 outputs a short generation output 826 to control switch 114, via controller 116, to create an external short 105 across known resistance 107. Known resistance 107 may be a variable resistance such that during step 2104, short generation output 826 indicates a second known resistance value for known resistance 107. The change in electromagnetic field 120 may be sensed by a sensor (e.g. sensor 118, 218, etc) represented as received signal 810. Received signal 810 may then be analyzed by signal analyzer 812 to determine signal parameter 830.

In step 2106, method 2100 determines an internal resistance based on the received signals 810 corresponding to each of the first and second known resistnaces discussed above in steps 2102, 2104. In an embodiment, the energy devices monitored according to first and second known resistances in step 2102, 2104 are in series. In such embodiments, at step 2106, signal analyzer may utilize the following equation:

$$S_{series} = f\left(Q, V, \frac{1}{r+R}, \frac{1}{D}\right)$$

In an embodiment, the energy devices monitored according to first and second known resistances in step 2102, 2104 are in parallel. In such embodiments, at step 2106, signal analyzer may utilize the following equation:

$$S_{parallel} = f\left(Q, V, \frac{r+R}{r \cdot R}, \frac{1}{D}\right)$$

Thus, when R=r then $$S_{series,R=r} = f\left(Q, V, \frac{1}{2r}, \frac{1}{D}\right), \text{ or}$$

-continued $$S_{parallel,R=r} = f\left(Q, V, \frac{2}{r}, \frac{1}{D}\right)$$

When R = 0

$$S_{series,R=0} = f\left(Q, V, \frac{1}{r}, \frac{1}{D}\right)$$

Alternatively, one can use parallel with R>>r $$S_{parallel,R \gg r} = f\left(Q, V, \frac{1}{r}, \frac{1}{D}\right)$$

By repeating the received signals 810 using different known resistances in steps 2102, 2104, that is keeping the Q, V and D constant, then using the first 2 equations above and any of the $3^{rd}$ or $4^{th}$, the relationship between Signal strength and internal resistance can be estimated. In embodiments, this internal resistance may then be used to estimate state of charge and state of health, for example by state of charge analyzer 816 and state of health analyzer 820, respectively.

Figure 22:
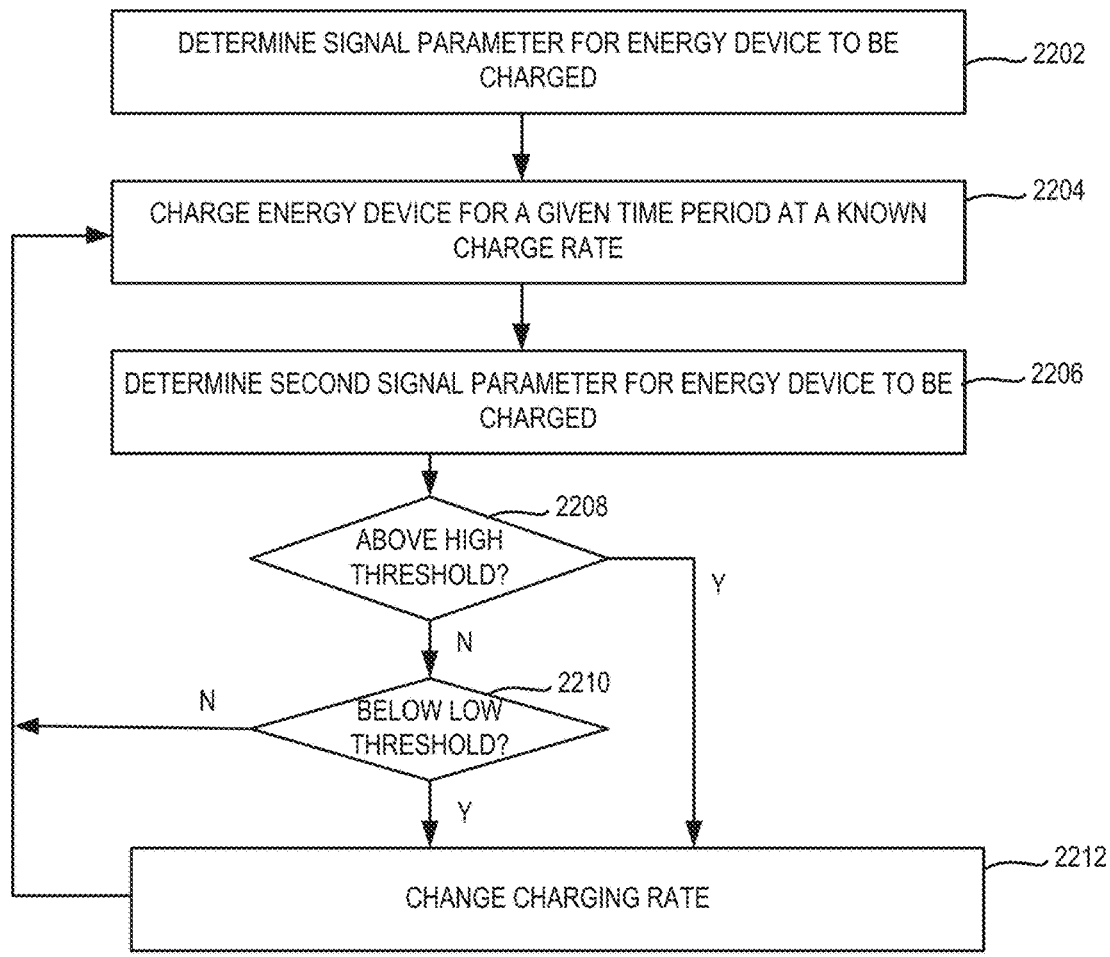
FIG. 22 depicts an exemplary method for adaptive charging of an energy device, in embodiments.

FIG. 22 depicts an exemplary method 2200 for adaptive charging of an energy device, in embodiments. One reason for not being able to charge energy devices as fast as desired is due to the generated heating $h$(heat generated at any time)=$I^2$(current at that time)
·$r$(internal resistance at that time)

Method 2200 provides a method such that the total heat inside the battery at any given time, H(t), as function of the current, i(t), total charge, Q(t), and resistance of the cell r(t) doesn't exceed a threshold level. The threshold depends on how fast the heat can leave the energy device.

$$H(t) = \int_0^t i^2(\tau) r(\tau) d\tau < H_{threshold}$$

Method 2200 may know the internal resistance of the energy device and adjust the charging current such that at any time during the charging the total heat generated in the energy device stays lower than a threshold. The threshold may be defined such that for any location of the energy device, the temperature stays below a safe value.

Within method 2200, if internal resistance is high then the applied charging current needs is lowered to limit the generated heat by the energy device. At the same time for high internal resistance the signal strength of the received signals discussed above (e.g. received signal 810) is low; that is the strength of signal can be used for adaptive charging of energy devices.

In step 2202, method 2200 generates a first signal parameter for the energy device to be charged. In one example of step 2202, characteristic monitor determines signal parameter 830 in any of the manners discussed above, such as an instantaneous, integral, or statistical parameter.

In step 2204, method 2200 charges the energy device for a given time period at a known charge rate. In one example of step 2200, characteristic monitor 800 generates configuration output 824 as a charge rate indication to control charging of the energy device 102. The given time period may be a length of time, such as 1 minute, 20 minutes, 1 hour, etc. or it may be a percentage of charge such as a full charge cycle, a partial charge cycle, or multiple charge cycles.

In step 2206, method 2200 generates a second signal parameter for the energy device to be charged. In one example of step 2202, characteristic monitor determines signal parameter 830 in any of the manners discussed above, such as an instantaneous, integral, or statistical parameter.

Step 2208 is a decision, in step 2208 method 2200 determines if the second signal parameter is above a high threshold, indicating that the battery is performing better than expected. In one example of step 2208, device operation manager 822 compares the second generated signal parameter against a lookup table 814 or energy device profile 832 to determine if the second generated signal parameter is above a high threshold. If in step 2208, second signal parameter is above a high threshold, then method 2200 proceeds to step 2212 where method 2200 changes the cycling rate of the energy device to increase the cycling rate. For example, device operation manager 822 may determine that the cycling rate can increase in step 2208, and thus output a configuration output 826 indicating to increase the cycling rate of the energy device. If in step 2208, second signal parameter is below the high threshold, method 2200 proceeds to decision step 2210.

Step 2210 is a decision, in step 2210 method 2200 determines if the second signal parameter is below a low threshold, indicating that the battery is performing worse than expected, and possibly is forming a short within the energy device thus potentially leading to a device failure. In one example of step 2210, device operation manager 822 compares the second generated signal parameter against a lookup table 814 or energy device profile 832 to determine if the second generated signal parameter is below a low threshold. If in step 2210, second signal parameter is below a low threshold, then method 2200 proceeds to step 2212 where method 2200 changes the cycling rate of the energy device to decrease the cycling rate. For example, device operation manager 822 may determine that the cycling rate can decrease in step 2210, and thus output a configuration output 826 indicating to decrease the cycling rate of the energy device. If in step 2210, second signal parameter is above the low threshold, method 2200 proceeds to repeat step 2204 such that method 2200 is repeated throughout charging of the energy device.

As an example of method 2200, for a given energy device the S can be measured every 1 minute during charging and the charging is done such that:

a) If $S(t) < S_{low}$ then charging current $I(t) = m_1 S^{1+n1}$; where $n1 > 0$ and $m_1$ depends on the application and battery type b) If $S_{low} < S(t) < S_{high}$ then charging current $I(t) = m_2 S^{1+n2}$; where $n2 > 0$ and $m_2$ depends on the application and battery type and $m_2 > m_1$ c) If $S_{high} < S(t)$ then charging current $I(t) = m_3 S^{1+n3}$; where $n3 > 0$ and $m_3$ depends on the application and battery type and $m_1 > m_3$.

Method 2200 utilizes the various systems and methods discussed herein, such as shorting a cell (with or without a known external resistance 107) to create a very fast discharge of the battery in which the charge transfer resistance plays an important role, thus there is a relationship between the strength of Signal S, and the charge transfer resistance, Rct, which has the double layer effect included. In comparison with a EIS method, the width of the semi-circle represents the charge transfer resistance, Rct. The charge-transfer-resistance accounts for the resistance to charge transfer processes at the surface of the electrode particles. This may be due to the solid electrolyte interphase (SEI) layer inhibiting charge transfer. The size of the semi-circle (width and height) changes as a function of both state of charge and state of health. Comparing a fully charged and a fully discharged battery, the ohmic resistance does not change significantly; however, there is a significant growth in charge transfer resistance as the battery becomes fully discharged. Changes to the impedance spectra are also a result of battery aging. As the SEI layer grows throughout the battery's life, the charge-transfer-resistance increases. Loss of connectivity between electrode particles and degradation of the current collector could also lead to changes in the ohmic resistance. In embodiments, to decouple state of charge estimation and state of health estimation with method 2200, method 2200 may be performed only when the cell is fully charged or discharged so that the state of charge is at a known state. The state of health may then be used as a known constant in estimating the state of charge.

Effect of the Double Layer in the Energy Device:

In embodiments of the above described systems and methods, a received signal may be generated, either passively or actively, based upon electron transfer through a double layer of the energy device. In any electrochemical cell there is a double layer with thickness in the range of, usually, 0.1 nm-20 nm. The electric field in the double layer can often reach $10^9$ V/m. The charging (discharging) time of double layer (t) is often in the order of microseconds. By causing an external short (e.g. external short 105), the double layer may rapidly charge/discharge such that the external short 105 emits change in electromagnetic field. Thus one can observe the change in electromagnetic field away from the cell (such as induced current in an electromagnetic coil or any other receiver) as an indication of a short circuit in an energy device. However, it should be appreciated that the present invention is not limited to change in electromagnetic field caused through rapid charge/discharge within a double layer, but also applies to any change in electromagnetic field caused within external short 105.

The energy device's double layer, although only 10s of nanometers, is extremely important in electrochemical reactions. The double layer is different for different amount of charges in the battery, and thus state of charge and state of health may be estimated from the behavior of the double layer, namely the rapid charge/discharge therethrough that causes rapid change in electromagnetic field either in the energy device itself or in the external shorts discussed above. Therefore, the shorts either actively generated (e.g. the external shorts 105 discussed herein) or the internal shorts, need only be generated for a quick period of time (e.g. 1 nanosecond and 10 microseconds, or even between 10 nanoseconds and 1 microseconds).

In embodiments, knowledge of the double layer in the energy device provides an ability to compare ions concentration profile versus voltage profile, without electro-neutrality, to further derive the relationship between the state of charge, which is a function of ions concentration profile, and electric field in the double layer. This may then be combined with relationship between the electric field of the double layer and the received electromagnetic signal by the sensor of the systems and methods described herein.

It should be appreciated that the analysis performed by various aspects of the systems and methods discussed above may include additional sensed data about the energy device, system, or unit being monitored. For example, one or more of voltage between terminals of the energy device, system, or unit, current between terminals of the energy device, system, or unit, and temperature of the energy device (including internal and/or surface temperature) could be utilized to make a determination about a characteristic. As such, at least some embodiments may provide another level of safety on top of prior energy device management systems—particularly one that is capable of making a characteristic determination in a much faster manner based on instantaneous, integral, or statistical analysis based signal parameters. For example, the lookup tables and/or unit profiles may include voltage, current, or temperature sensing data in addition to the received signal data discussed herein.

Detection of Electrical Shorts from Change in Electrical Field Internal to Energy Device The embodiments discussed herein may analyze any change in electromagnetic field, not just that caused by an external short (i.e. external short 105). For example, the sensors discussed herein may be able to detect electromagnetic field changes caused within the energy device themselves. This field change may be compared to a lookup table or energy device profile, similar to those lookup table 814 and energy device profile 832 discussed above. This may result in the ability to detect different short types. Moreover, as compared to conventional methods that only monitor current, voltage, and/or temperature, the present embodiments (including those that monitor only change in electromagnetic field from the energy device itself) may detect a short in real-time, enabling the management unit to prevent any thermal runaway. Furthermore, cmbined with the state of charge and state of health estimation, the management unit can detect the type of short (i.e. soft vs hard type) thereby resulting in taking more suitable actions to prevent the damage.

The embodiments discussed herein may be further understood by the following non-limiting examples.

Example 1: Electromagnetic Emission from Battery Cells

Figure 23:
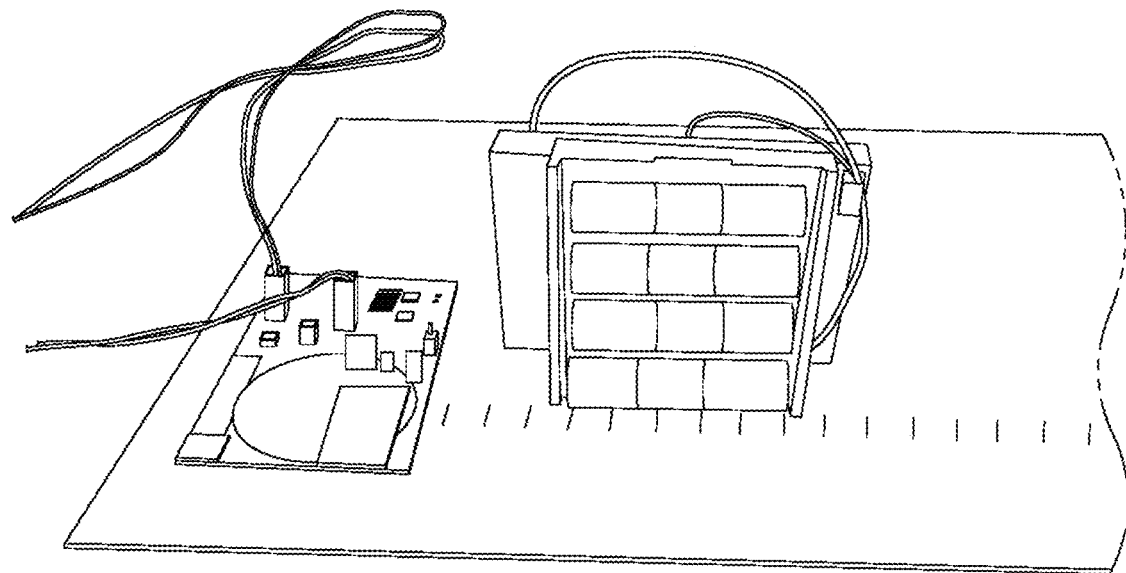
FIG. 23 depicts four alkaline Manganese Dioxide AA battery cells coupled together in series forming 6.59V battery pack having a short generator attached thereto, in an embodiment.
Figure 24:
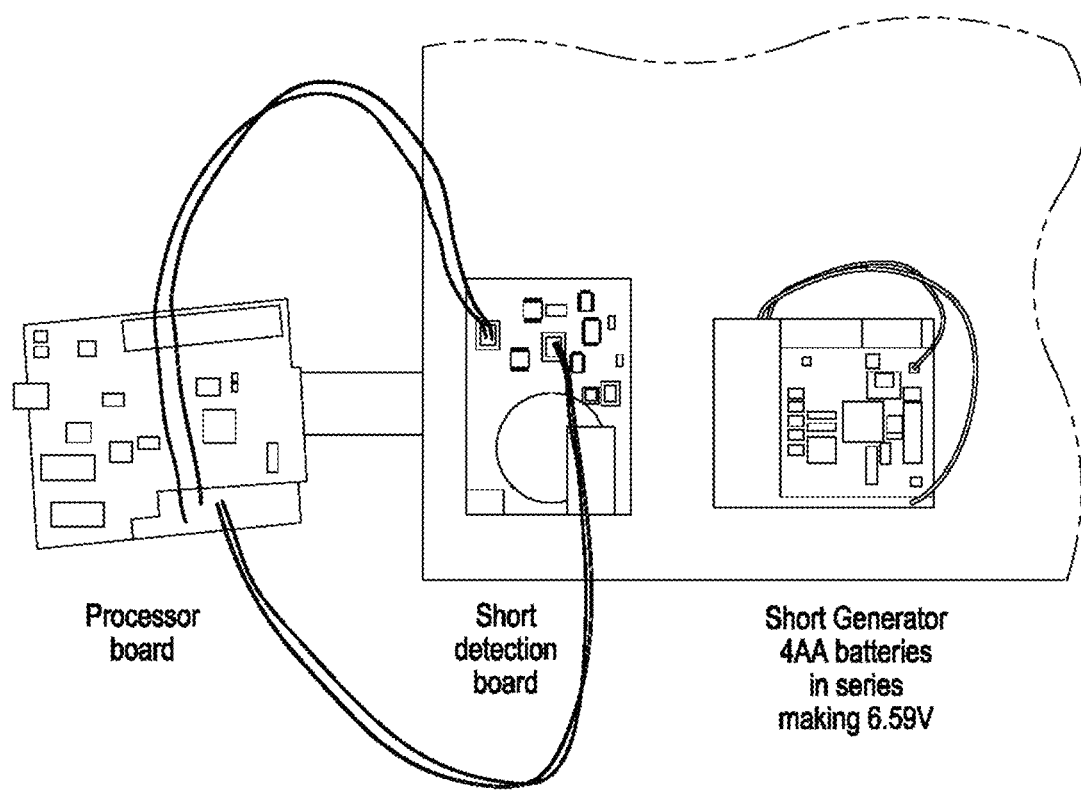
FIG. 24 depicts the short generator coupled to the battery pack of FIG. 18 to create a short across the battery pack, in an embodiment.
Figure 25:
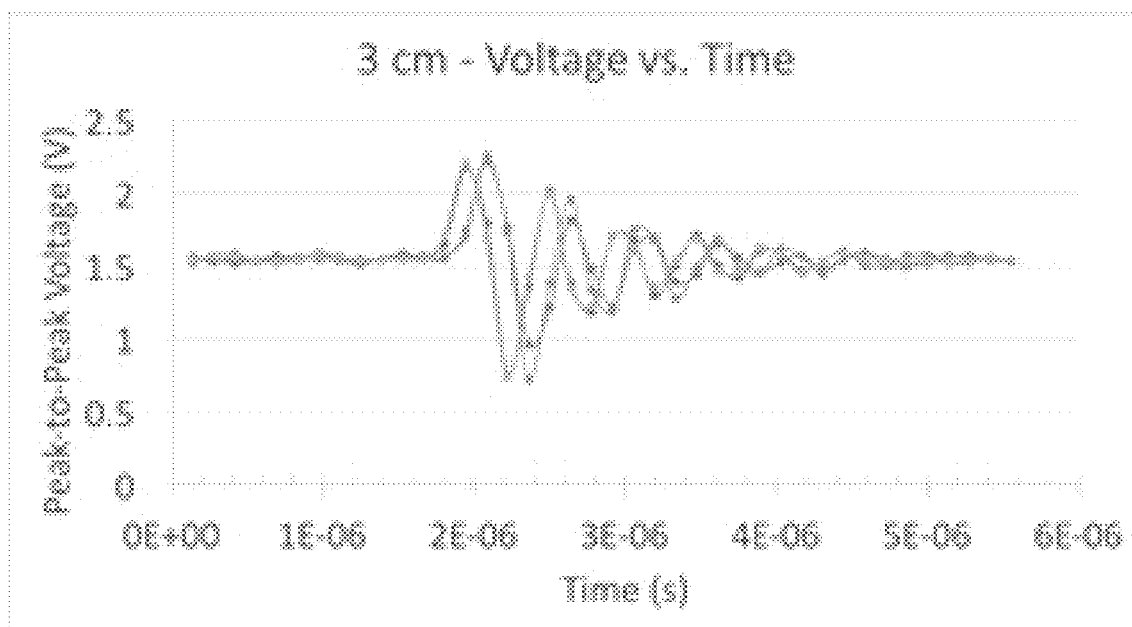
FIG. 25 depicts sensed data from the system of FIGS. 18-19 at three centimeters between the coil and the external short, in embodiments.
Figure 26:
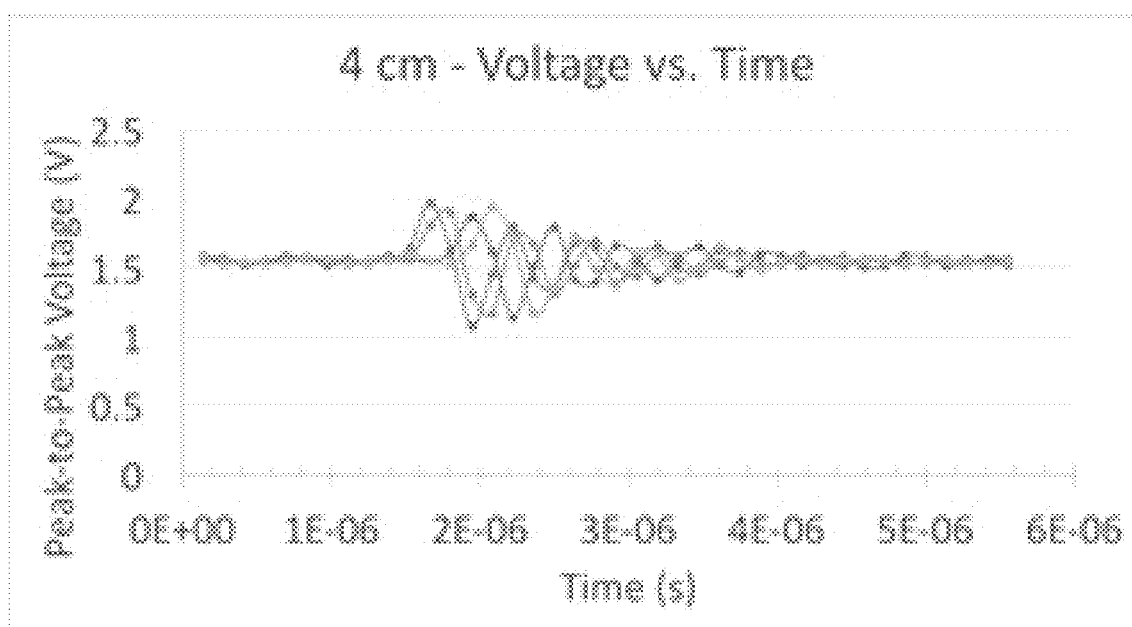
FIG. 26 depicts sensed data from the system of FIGS. 18-19 at four centimeters between the coil and the external short, in embodiments.

Experiment 1. As shown in FIG. 23, four alkaline Manganese Dioxide AA battery cells were coupled together in series forming 6.59V battery pack. As shown in FIG. 24, a short generator was coupled thereto to create a short across the battery pack. A short detection board including an electromagnetic coil was placed 3 cm and 4 cm away from the short generator. A processing board received the coil signal to analyze the signal. The resistance of the external short was selected at 0.35 Ohms. The short generator portion included a button that, when pressed, generated the external short. Four separate trials illustrated a series of peaks were detected over a duration of less than 10 milliseconds. As shown in FIG. 25, at three centimeters between the coil and the external short, the maximum peak-to-peak voltage level was approximately 2.25. As shown in FIG. 26, at four centimeters between the coil and the external short, the maximum peak-to-peak voltage level was approximately 1.99.

Figure 27:
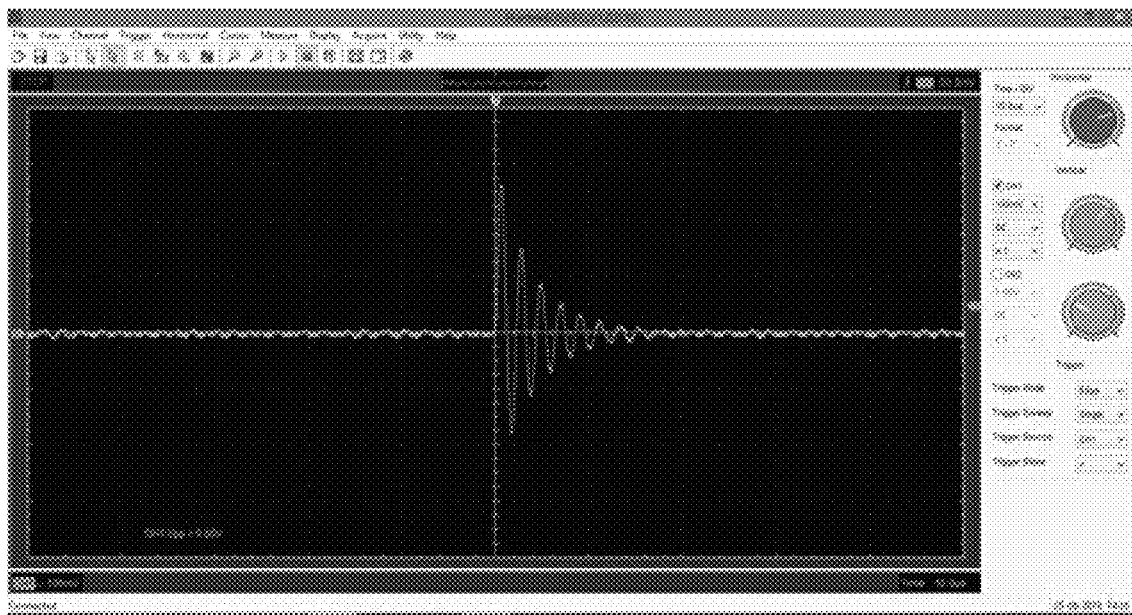
FIGS. 27-29 depict the voltage response from the sensor of FIG. 18-19 when the AA batteries in series have a total Voltage of 4.532V.
Figure 28:
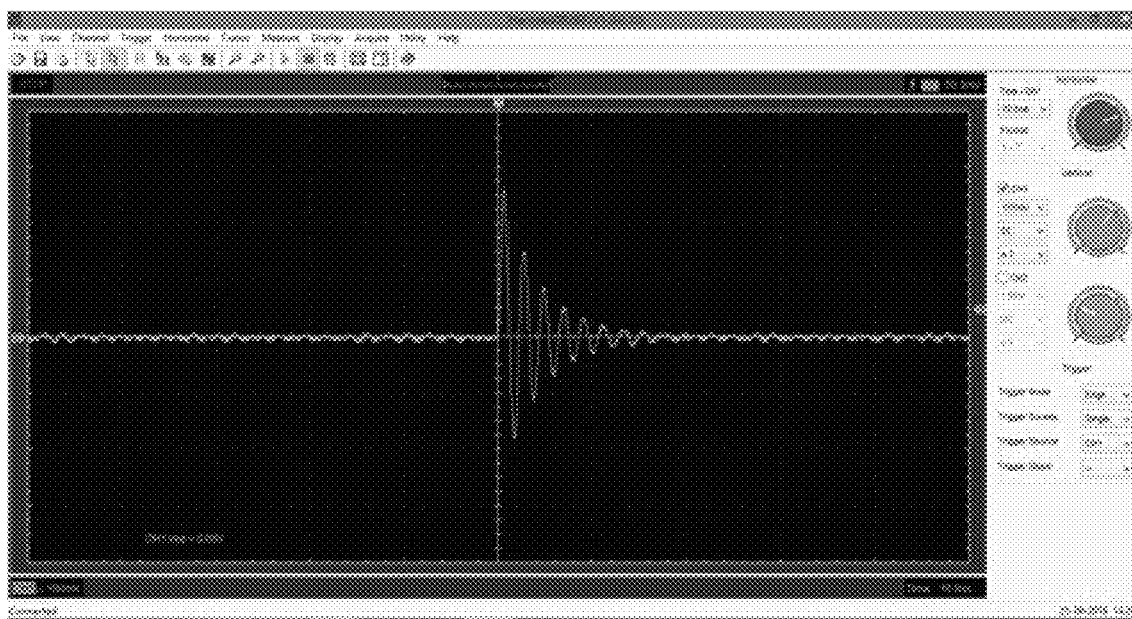
Figure 29:
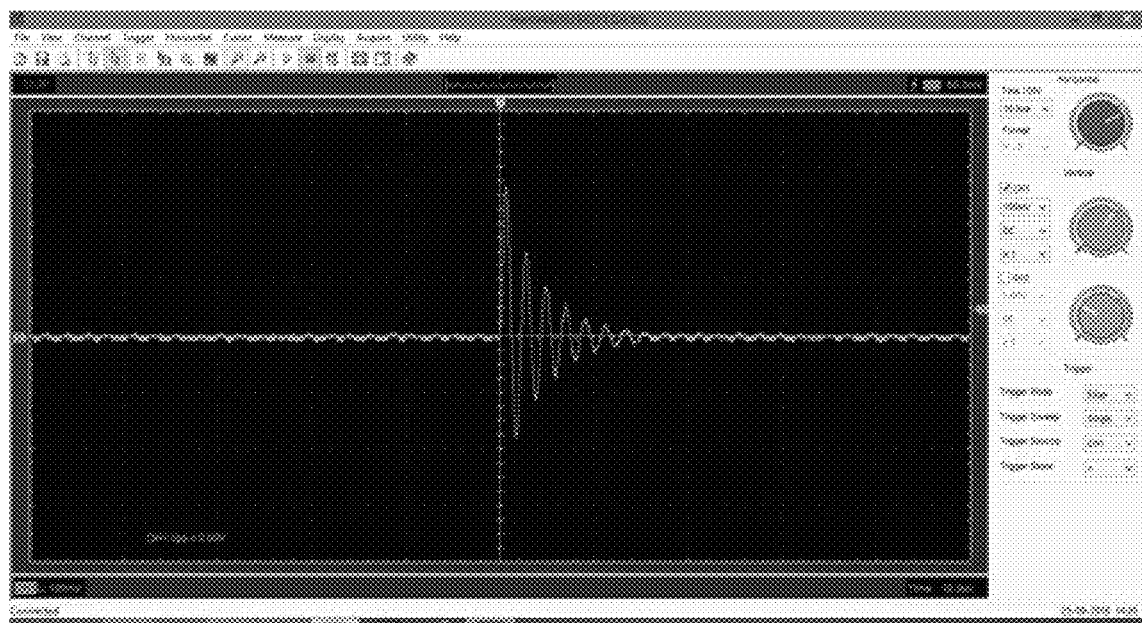
Figure 30:
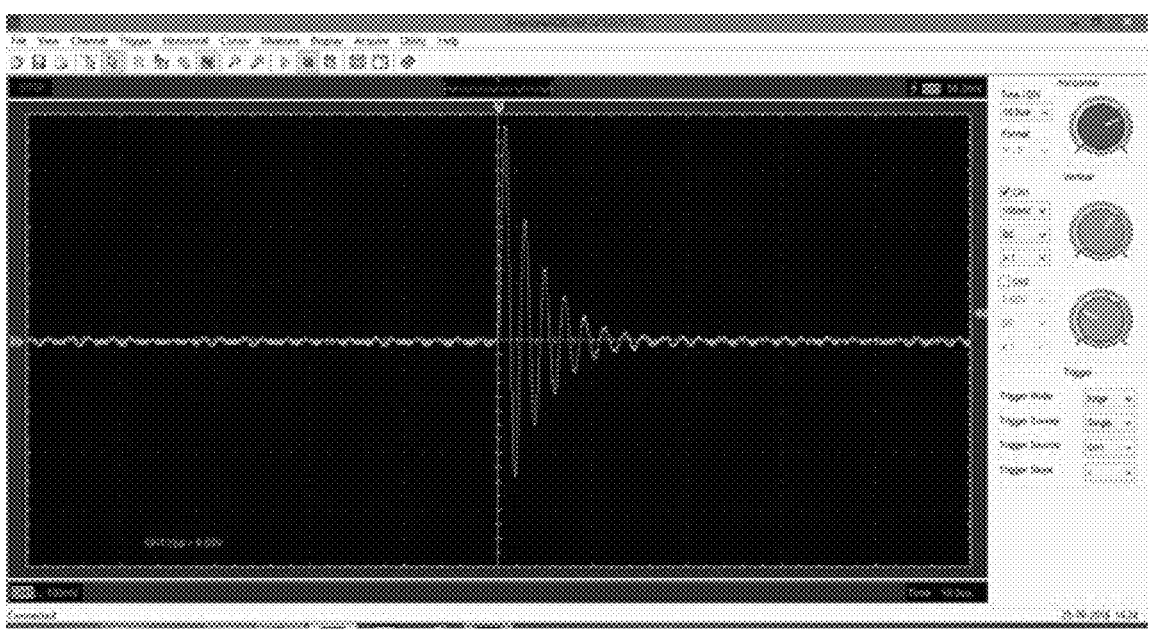
FIGS. 30-32 depict the voltage response from the sensor when the AA batteries of FIG. 23-24 in series have a total Voltage of 5.441V.
Figure 31:
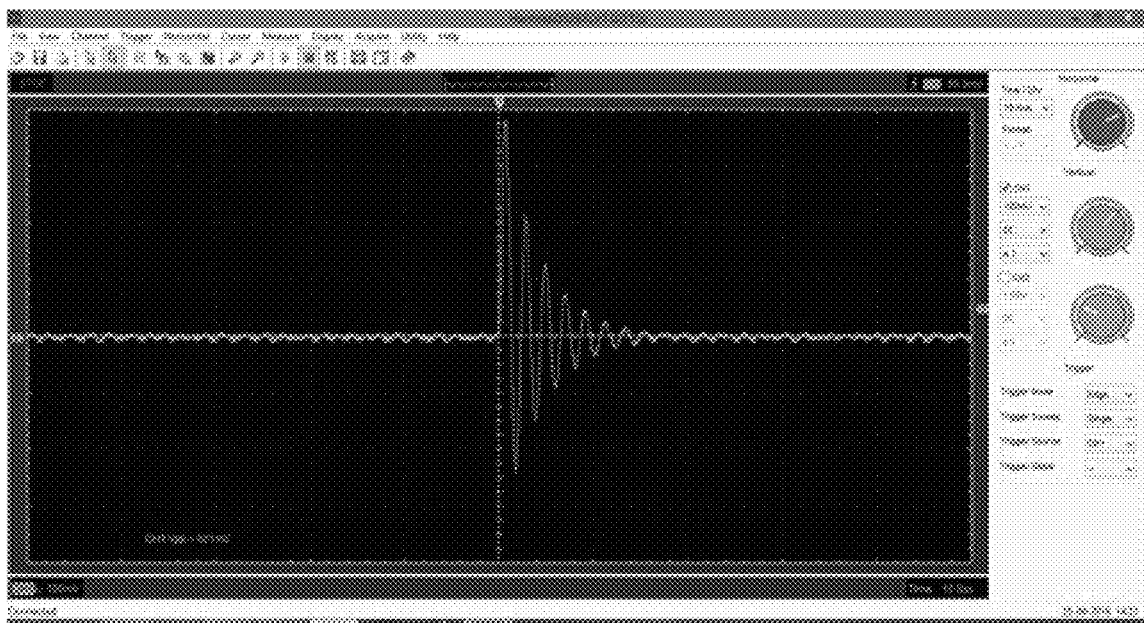
Figure 32:
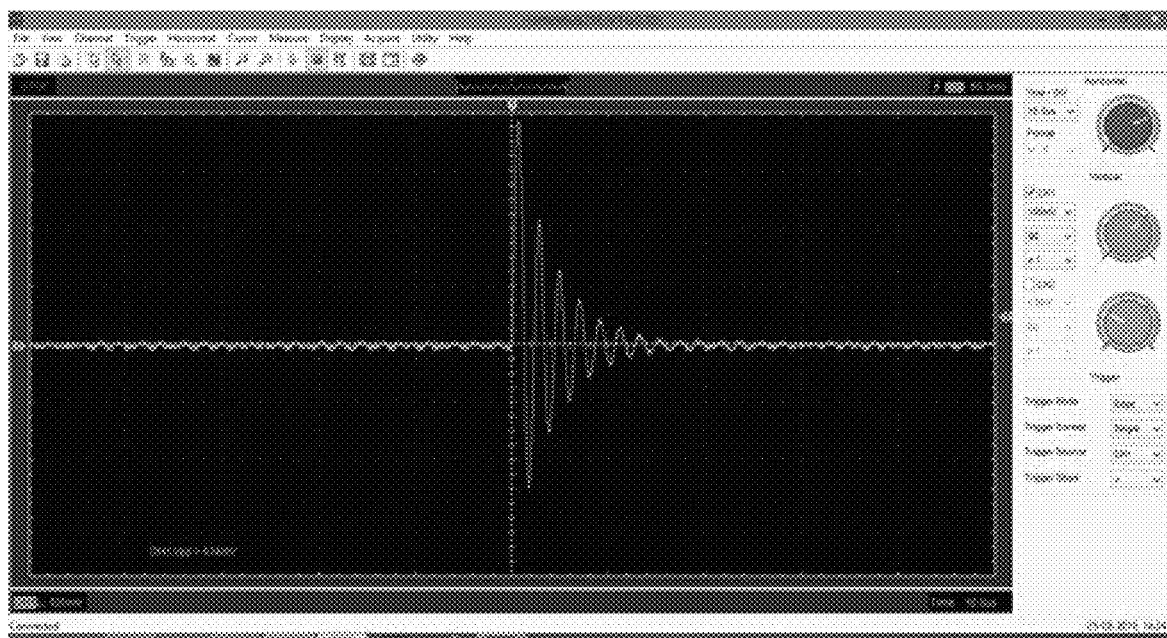
Figure 33:
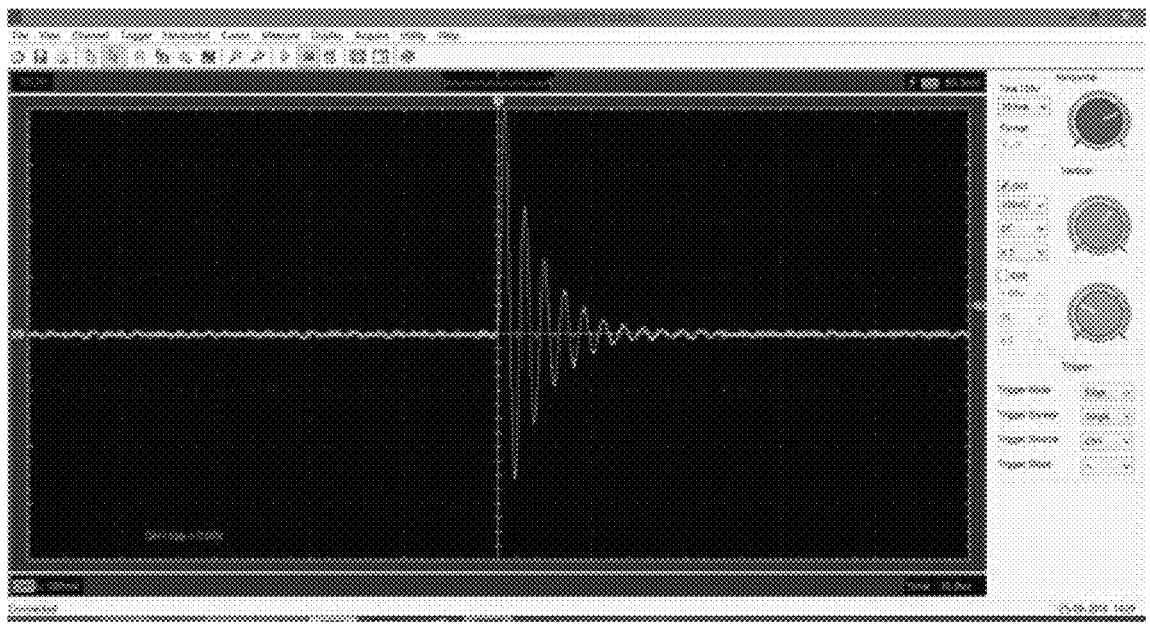
FIGS. 33-35 depict the voltage response from the sensor when the AA batteries of FIGS. 18-19 in series have a total Voltage of 5.633V.
Figure 34:
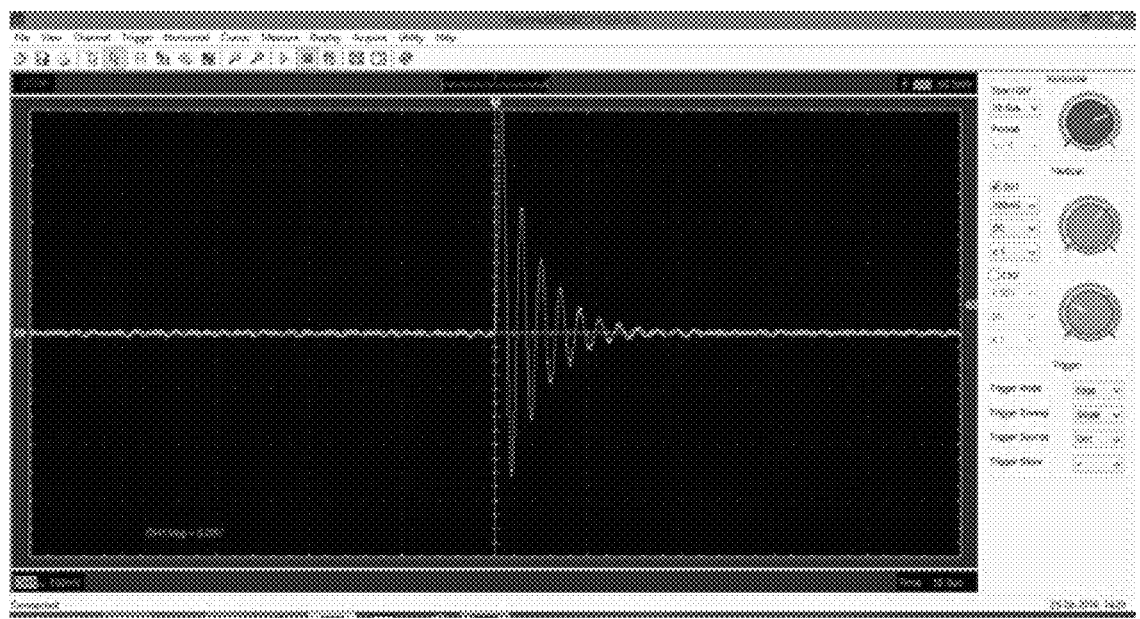
Figure 35:
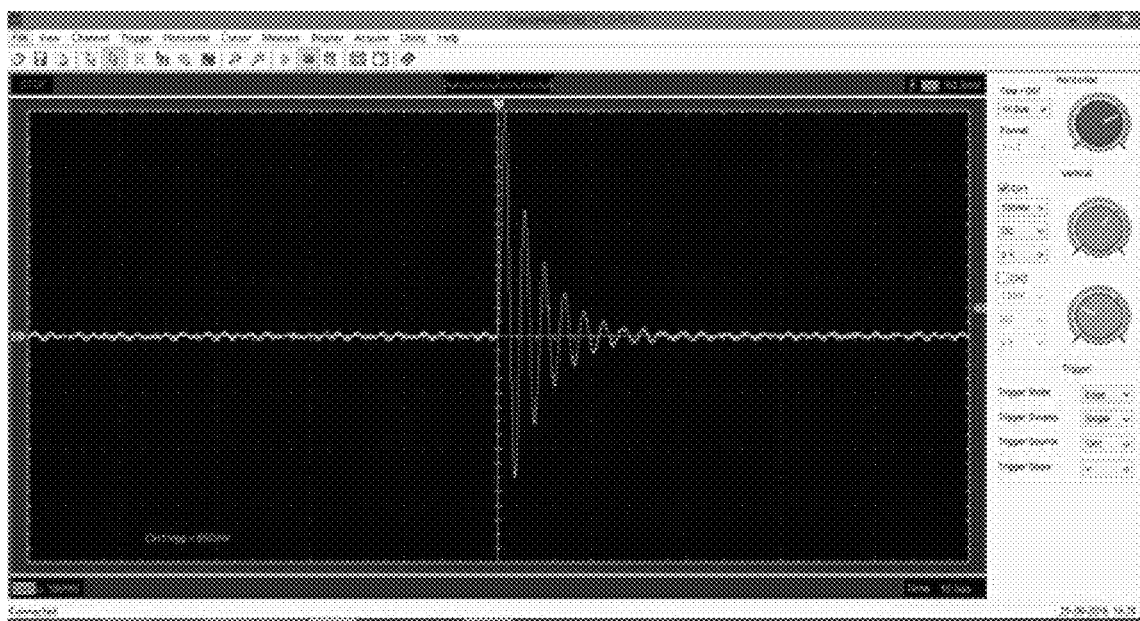

FIGS. 27-29 depict the voltage response from the sensor when the AA batteries in series have a total Voltage of 4.532V. It can be seen that the average maximum peak-to-peak voltage level is 1.05V. FIGS. 30-32 depict the voltage response from the sensor when the AA batteries in series have a total Voltage of 5.441V. It can be seen that the average maximum peak-to-peak voltage level is 1.52V. FIGS. 33-35 depict the voltage response from the sensor when the AA batteries in series have a total Voltage of 5.5.633V. It can be seen that the average maximum peak-to-peak voltage level is 1.6V. Therefore, it is shown that, when a short is detected with a known resistance and sensed using a sensor at a known distance, then the state of charge and state of health may be determined.

Figure 36:
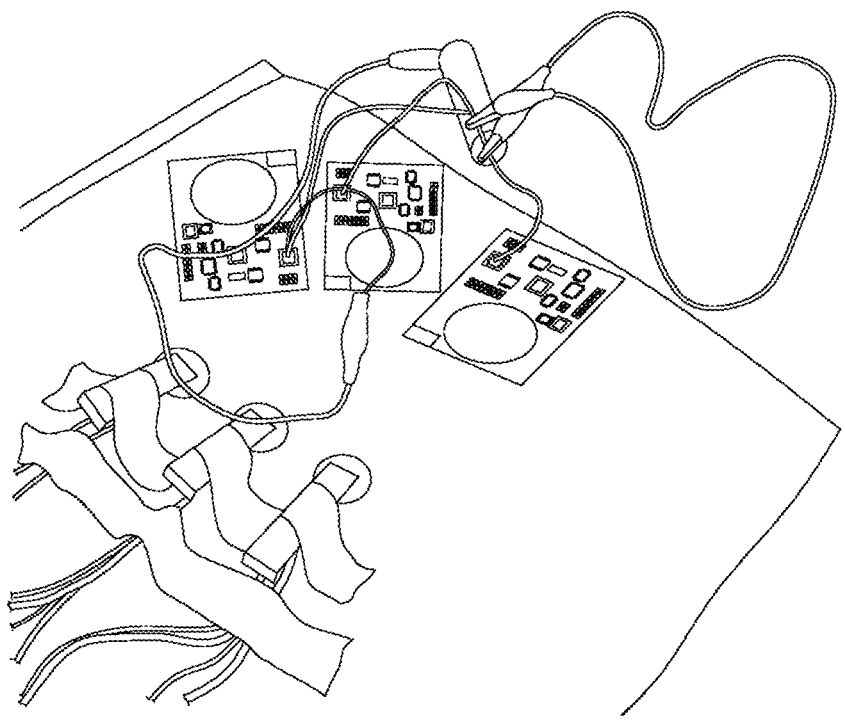
FIG. 36 depicts three coincells each associated with individual short generators and a respective analog-based short detector placed a distance away therefrom including logic circuitry and indicator lights for indicating a detected short.
Figure 37:
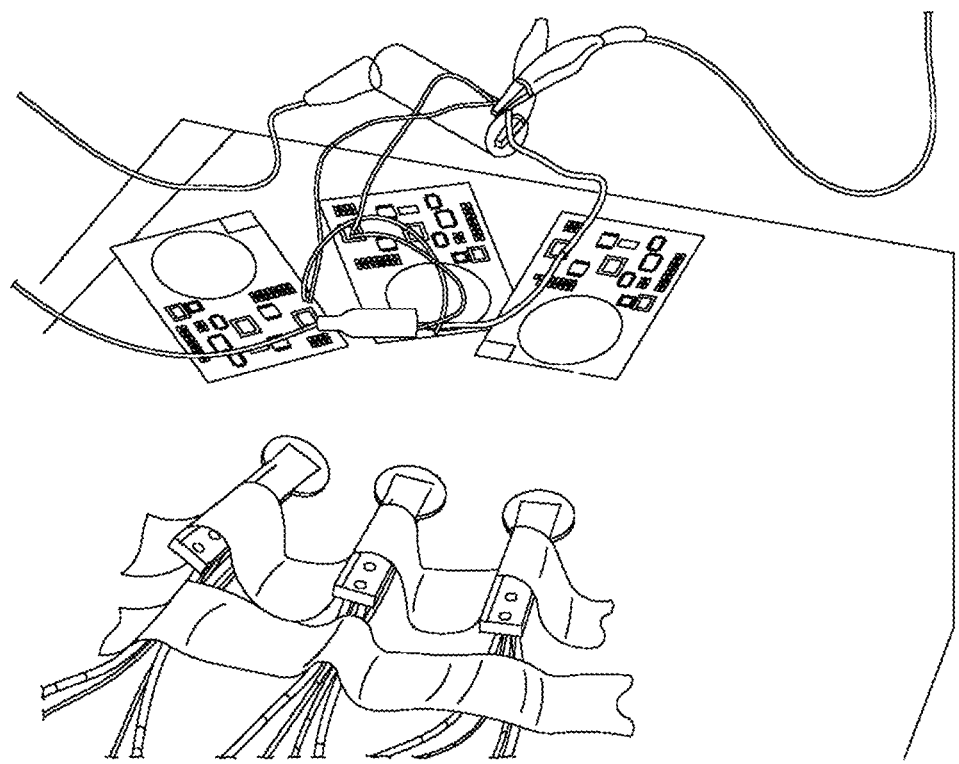
FIG. 37 depicts the indicator lights of FIG. 36 turned on in response to a detected short.
Figure 38:
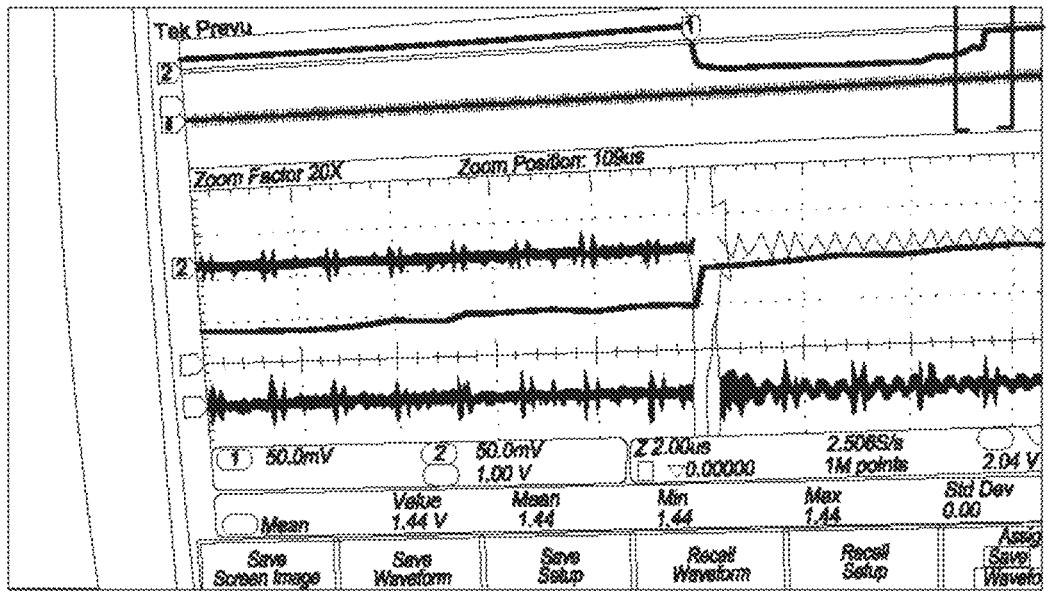
FIG. 38 depicts two signals on an oscillator based on the system of FIGS. 36-37.
Figure 39:
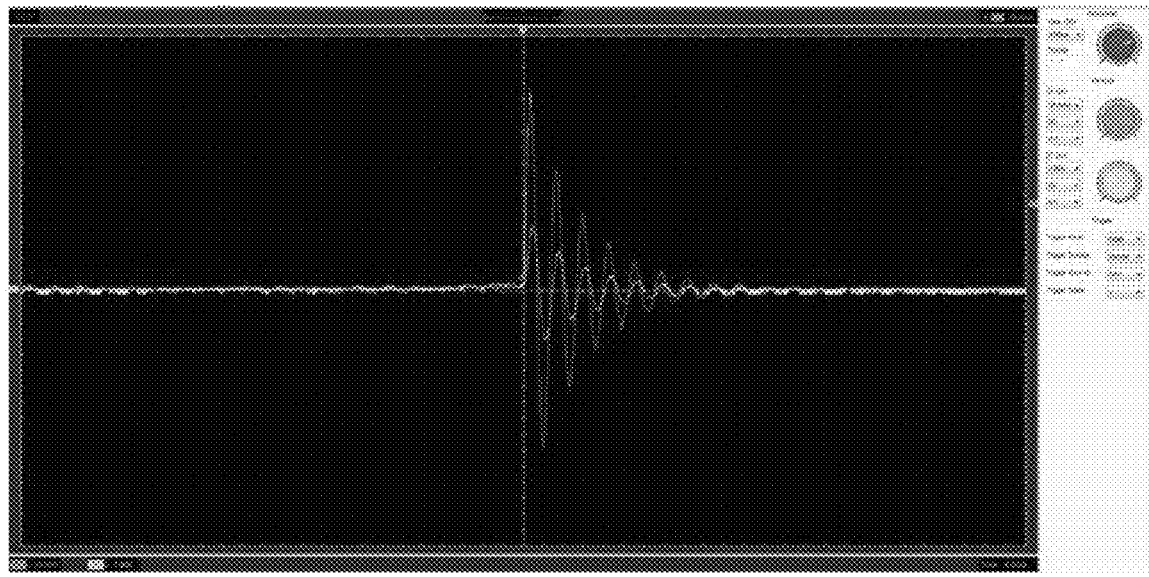
FIG. 39 shows the received signal (lighter gray) and the amplified signal (darker gray) based on the system of FIGS. 36-37.
Figure 40:
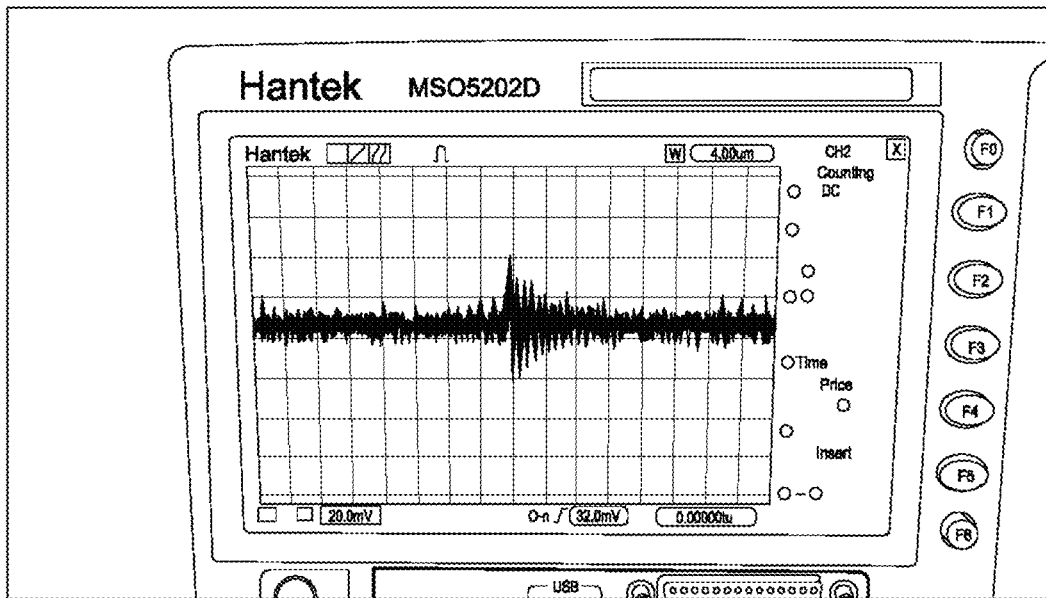
FIG. 40 depicts the short detected using an oscillator in the system of FIGS. 36-37.

Experiment 2. As shown in FIG. 36, three coincells were associated with individual short generators (taped thereto), a respective analog-based short detector was placed a distance away therefrom including logic circuitry and indicator lights for indicating a detected short. As shown in FIG. 37, when a short was detected, the indicator lights were turned on. FIG. 38 depicts two signals on an oscillator. The top signal is the short generation signal, and the bottom signal is the received signal at the coil. FIG. 39 shows the received signal (lighter gray) and the amplified signal (darker gray). The amplification ratio is fixed and is 15. The coincell shows a received signal having 2 V max peak-to-peak. The signal decays almost as 1/distance. FIG. 40 depicts the short detected using an oscillator.

Figure 41:
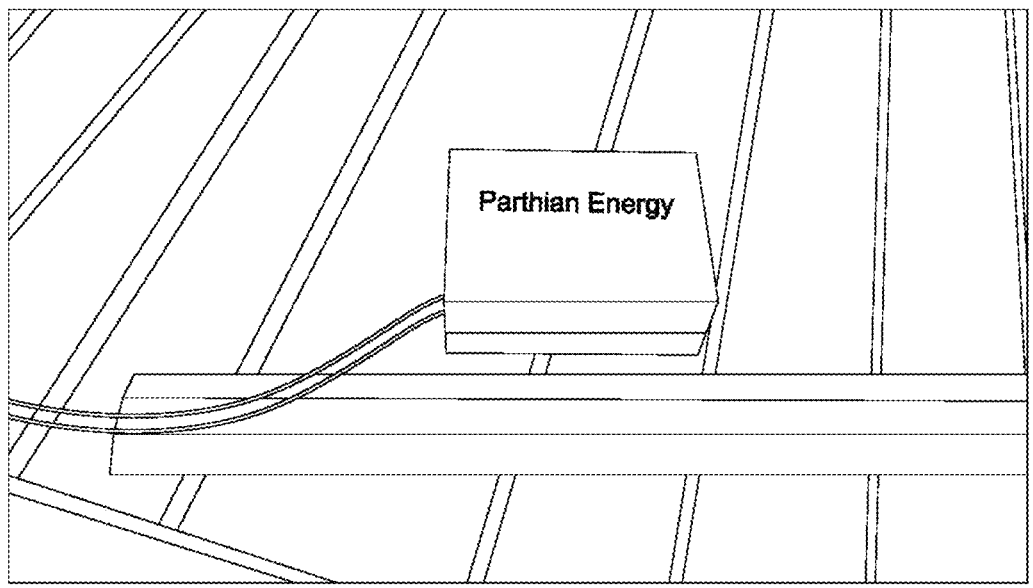
FIG. 41 depicts an exemplary short detector box, in embodiments.

Experiment 3: As shown in FIG. 41, a short detector box was created. This box included features of the short generator, such as the sensor 118 and controller 116. The box included a housing and was wirelessly communicable to a smart device such as a smartphone, table, computer, etc. for transmitting the received sensor signal for further processing and state of charge/state of health analysis.

Example 2

A battery is being charged in a cellphone. A series of external shorts is generated with known external resistances are generated in the battery every 1 minute during the charging. The duration of each of the series of applied external shorts is 0.1 minute, during this time the said battery cell is in open circuit mode and the charging is stopped. Each series of applied external shorts consists of 5 instantaneous external shorts. The mean and standard value of each of the series is calculated. Using the current profile and voltage profile of the said battery cell, the said mean and standard values of signal strength is compared to previous cycles or a lookup table, and the state of charge, internal resistance and state of health of said battery is thus estimated. Based on the state of charge, internal resistance and state of health estimations the corresponding adaptive charging activity is thus decided and then performed; for example, for a low internal resistance and acceptable state of health and state of charge estimations the applied charging current can be increased until the internal resistance estimation reaches a threshold value.

Example 3

A battery pack is being cycled in an electric vehicle. For each of the battery modules of the said battery pack a series of external shorts with known external resistances are generated in the battery pack every 10 minutes during the cycling. The duration of each of the series of applied external shorts is 1 minute, during this time the said battery module is in open circuit mode and the other battery modules of the pack should compensate for the said module. Each series of applied external shorts consists of 5 instantaneous external shorts. The mean and standard value of each of the series is calculated. Using the current profile and voltage profile of the said battery module, the said mean and standard values of signal strength is compared to the corresponding values of other modules, and the relative internal resistance, state of charge and state of health of each module is thus estimated. Then any required cell balancing activity is thus decided and then performed; for example, after identifying a weaker module, the said weaker module and the rest of the pack will be balanced according to the known methods for balancing a weak module in a pack in state of art.

Example 4

A battery module is being cycled in an electronic device. For each of the battery cells of the said battery pack a series of external shorts with known external resistances are generated in the battery module every 5 minutes during the cycling. The duration of each of the series of applied external shorts is 0.5 minute, during this time the said battery cell is in open circuit mode and the other battery cells of the module should compensate for the said cell. Each series of applied external shorts consists of 5 instantaneous external shorts. The mean and standard value of each of the series is calculated. Using the current profile and voltage profile of the said battery cell, the said mean and standard values of signal strength is compared to the other cells and the relative internal resistance, state of charge and state of health of each said cell is thus estimated. Then any required cell balancing activity is thus decided and then performed; for example, after identifying a weaker cell, the said weaker cell and the rest of the module will be balanced according to the known methods for balancing a weak cell in a module in state of art.

Example 5

A battery pack is being cycled in an electric vehicle. For each of the battery modules of the said battery pack a series of external shorts with known external resistances are generated in the battery pack every 10 minutes during the cycling. The duration of each of the series of applied external shorts is 1 minute, during this time the said battery module is in open circuit mode and the other battery modules of the pack should compensate for the said module. Each series of applied external shorts consists of 5 instantaneous external shorts. The mean and standard value of each of the series is calculated. Using the current profile and voltage profile of the said battery module, the said mean and standard values of signal strength is compared to the corresponding values of earlier cycles or a lookup table, and the internal resistance and state of charge and the state of health of the said module is thus estimated. The values of all modules in the pack are compared and any required cell balancing activity is thus decided and then performed; for example, after identifying a weaker module, the said weaker module and the rest of the pack will be balanced according to the known methods for balancing a weak module in a pack in state of art.

Example 6

A battery module is being cycled in an electronic device. For each of the battery cells of the said battery pack a series of external shorts with known external resistances are generated in the battery module every 5 minutes during the cycling. The duration of each of the series of applied external shorts is 0.5 minute, during this time the said battery cell is in open circuit mode and the other battery cells of the module should compensate for the said cell. Each series of applied external shorts consists of 5 instantaneous external shorts. The mean and standard value of each of the series is calculated. Using the current profile and voltage profile of the said battery cell, the said mean and standard values of signal strength is compared to the corresponding values of earlier cycles or a lookup table, and the internal resistance and state of charge and the state of health of the said cell is thus estimated. The values of all cells in the module are compared and any required cell balancing activity is thus decided and then performed; for example, after identifying a weaker cell, the said weaker cell and the rest of the module will be balanced according to the known methods for balancing a weak cell in a module in state of art.

STATEMENTS REGARDING INCORPORATION BY REFERENCE AND VARIATIONS

All references throughout this application, for example patent documents including issued or granted patents or equivalents; patent application publications; and non-patent literature documents or other source material; are hereby incorporated by reference herein in their entireties, as though individually incorporated by reference, to the extent each reference is at least partially not inconsistent with the disclosure in this application (for example, a reference that is partially inconsistent is incorporated by reference except for the partially inconsistent portion of the reference).

All patents and publications mentioned in the specification are indicative of the levels of skill of those skilled in the art to which the invention pertains. References cited herein are incorporated by reference herein in their entirety to indicate the state of the art, in some cases as of their filing date, and it is intended that this information can be employed herein, if needed, to exclude (for example, to disclaim) specific embodiments that are in the prior art. For example, when a compound is claimed, it should be understood that compounds known in the prior art, including certain compounds disclosed in the references disclosed herein (particularly in referenced patent documents), are not intended to be included in the claim.

When a group of substituents is disclosed herein, it is understood that all individual members of those groups and all subgroups and classes that can be formed using the substituents are disclosed separately. When a Markush group or other grouping is used herein, all individual members of the group and all combinations and subcombinations possible of the group are intended to be individually included in the disclosure. As used herein, "and/or" means that one, all, or any combination of items in a list separated by "and/or" are included in the list; for example "1, 2 and/or 3" is equivalent to "'1' or '2' or '3' or '1 and 2' or '1 and 3' or '2 and 3' or '1, 2 and 3'".

Every formulation or combination of components described or exemplified can be used to practice the invention, unless otherwise stated. Specific names of materials are intended to be exemplary, as it is known that one of ordinary skill in the art can name the same material differently. One of ordinary skill in the art will appreciate that methods, device elements, starting materials, and synthetic methods other than those specifically exemplified can be employed in the practice of the invention without resort to undue experimentation. All art-known functional equivalents, of any such methods, device elements, starting materials, and synthetic methods are intended to be included in this invention. Whenever a range is given in the specification, for example, a temperature range, a time range, or a composition range, all intermediate ranges and subranges, as well as all individual values included in the ranges given are intended to be included in the disclosure.

As used herein, "comprising" is synonymous with "including," "containing," or "characterized by," and is inclusive or open-ended and does not exclude additional, unrecited elements or method steps. As used herein, "consisting of" excludes any element, step, or ingredient not specified in the claim element. As used herein, "consisting essentially of" does not exclude materials or steps that do not materially affect the basic and novel characteristics of the claim. Any recitation herein of the term "comprising", particularly in a description of components of a composition or in a description of elements of a device, is understood to encompass those compositions and methods consisting essentially of and consisting of the recited components or elements. The invention illustratively described herein suitably may be practiced in the absence of any element or elements, limitation or limitations which is not specifically disclosed herein.

The terms and expressions which have been employed are used as terms of description and not of limitation, and there is no intention in the use of such terms and expressions of excluding any equivalents of the features shown and described or portions thereof, but it is recognized that various modifications are possible within the scope of the invention claimed. Thus, it should be understood that although the present invention has been specifically disclosed by preferred embodiments and optional features, modification and variation of the concepts herein disclosed may be resorted to by those skilled in the art, and that such modifications and variations are considered to be within the scope of this invention as defined by the appended claims.

We claim:

1. A method for monitoring characteristics of an electric energy device, comprising:
generating at least two external shorts with known current or voltage profiles at the electric energy device;
sensing at least one change in an electromagnetic field emitted by the electric energy device due to the generated at least two external shorts by at least one sensor at a predetermined distance from the device;
determining at least one signal parameter based on the sensed at least one change in electromagnetic field in the vicinity of the electric energy device; and
determining at least one characteristic of the electric energy device based on the at least one signal parameter.

2. The method of claim 1, wherein each of the at least two generated external shorts causes a rapid discharge of a double layer of the electric energy device.

3. The method of claim 2, wherein the change in the electromagnetic field emitted is due to the rapid discharge of the double layer.

4. The method of claim 1, wherein the generated at least two external shorts are consecutive.

5. The method of claim 4, wherein the generated at least two external shorts are generated at a frequency of 2 kHz or less.

6. The method of claim 4, wherein the at least one characteristic comprises a state of charge of the energy device, a state of health of the energy device, an internal resistance of the energy device, an internal impedance of the energy device, an internal short of the energy device, or a combination of these.

7. The method of claim 1, further comprising analyzing, using a characteristic monitor, a plurality of received signals corresponding to the sensed at least one change in the electromagnetic field to determine the signal parameter.

8. The method of claim 7, wherein the plurality of received signals are consecutive and received at a frequency of 2 kHz or less.

9. The method of claim 7, wherein the plurality of received signals are received by a signal analyzer from the at least on sensor.

10. The method of claim 9, wherein the characteristic monitor comprises the at least one sensor and the signal analyzer.

11. The method of claim 7, each of the at least one signal parameter being based on:

$$S = f\left(Q, V, \frac{1}{r}, \frac{1}{R}, \frac{1}{D}, T\right)$$

where S is the Strength of the received signal, D is a distance between the energy device and the sensor, R is a known external resistance selected based on the application and battery that can be in series or parallel to the battery and may vary, r is internal resistance of the energy device to the generated short, Q is a stored coulomb in the energy device, V is a voltage of the energy device, and T is temperature.

12. The method of claim 1, wherein the signal parameter includes an instantaneous parameter based on a given time between 1 nanosecond and 10 microseconds from the generation of an external short of the at least two external shorts.

13. The method of claim 1, wherein the method further comprises adjusting a charge rate based on the determined at least one characteristic of the electric energy device.

14. The method of claim 13, wherein the charge rate is adjusted based on at least one characteristic monitor threshold for the at least one characteristic of the electric energy device.

15. The method of claim 13, wherein the charge rate is adjusted based on characteristics of the electric energy device determined based on successive signal parameters.

16. The method of claim 1, wherein the electric energy device comprises a rechargeable Li-ion battery.

17. The method of claim 1, wherein each external short event is 0.1 minutes or less.

18. The method of claim 1, further comprising, generating at least one short generation output via a characteristic monitor in communication with a short generator; the generating at least two external shorts occurring in response to the at least one short generation output.

19. The method of claim 1, the step of sensing comprising sensing the at least one change in the electromagnetic field with at least one electromagnetic coil.

20. The method of claim 1, wherein the method is performed during the operation of the energy device; and wherein the method comprises determining a health of the energy device.

21. The method of claim 1, wherein the electric energy device is a battery comprising at least one battery cell.

22. The method of claim 1, wherein the step of generating at least two external shorts comprises generating a plurality of successive external short events; and wherein a duration of the method is greater than a duration of the step of generating the plurality of successive external short events.

* * * * *